(12) United States Patent
Amakai et al.

(10) Patent No.: US 7,483,818 B2
(45) Date of Patent: Jan. 27, 2009

(54) STRUCTURAL ANALYSIS PROGRAM, A STRUCTURAL ANALYSIS METHOD, A STRUCTURAL ANALYSIS APPARATUS, AND A PRODUCTION PROCESS OF A SEMICONDUCTOR INTEGRATED CIRCUIT

(75) Inventors: Makoto Amakai, Nagano (JP); Iwao Sugiura, Nagano (JP); Takanori Negishi, Nagano (JP); Yasuhiro Kawashima, Nagano (JP); Gen Kamurai, Nagano (JP); Kazuyuki Imamura, Nagano (JP)

(73) Assignee: Fujitsu Nagano Systems Engineering Limited, Nagano (JP)

( * ) Notice: Subject to any disclaimer, the term of this patent is extended or adjusted under 35 U.S.C. 154(b) by 641 days.

(21) Appl. No.: 10/157,926

(22) Filed: May 31, 2002

(65) Prior Publication Data

US 2003/0055612 A1  Mar. 20, 2003

(30) Foreign Application Priority Data

Sep. 18, 2001 (JP) .............................. 2001-283114
Nov. 28, 2001 (JP) .............................. 2001-361979

(51) Int. Cl.
G06F 17/50 (2006.01)
G06F 19/00 (2006.01)

(52) U.S. Cl. ......................................... 703/1; 700/121
(58) Field of Classification Search ................. 364/490; 703/13, 14, 1; 700/121; 438/149
See application file for complete search history.

(56) References Cited

U.S. PATENT DOCUMENTS 5,067,101 A * 11/1991 Kunikiyo et al. .............. 716/20
5,070,469 A * 12/1991 Kunikiyo et al. .............. 716/20
5,471,403 A * 11/1995 Fujimaga ...................... 716/19
5,481,475 A *  1/1996 Young .......................... 716/20

(Continued)

FOREIGN PATENT DOCUMENTS

JP          04-000679          1/1992

(Continued)

OTHER PUBLICATIONS

Kelly, Gerard et al. "3-D Packaging Methodologies for Microsystems." IEEE Transactions on Advanced Packaging, vol. 23 No. 4, Nov. 2000 pp. 623-630.*

(Continued)

*Primary Examiner*—Paul L Rodriguez
*Assistant Examiner*—Eunhee Kim
(74) *Attorney, Agent, or Firm*—Staas & Halsey LLP

(57) ABSTRACT

A structural analysis program which enables easy structural analysis in accordance with a finite element method based on data representing a two-dimensional shape. A two-dimensional model of a structure is produced in response to a manipulation input which designates a material arrangement pattern and a thickness of each layer of the structure. A three-dimensional model is produced by adding the designated thickness of each layer to the material arrangement pattern of the layer so as to make the material arrangement pattern three-dimensional and stacking the three-dimensionalized material arrangement pattern of each layer. A finite element model is produced by dividing the three-dimensional model into a plurality of voxels. The computer performs structural analysis based on the produced finite element model. Thereby, an analysis result of a multilayer structure defined by the two-dimensional model is obtained.

14 Claims, 36 Drawing Sheets

U.S. PATENT DOCUMENTS

| | | | |
|---|---|---|---|
| 5,812,435 A * | 9/1998 | Fujinaga | 703/13 |
| 6,718,293 B1 * | 4/2004 | Ha et al. | 703/13 |
| 2001/0029601 A1 * | 10/2001 | Kimura et al. | 716/19 |

FOREIGN PATENT DOCUMENTS

| | | |
|---|---|---|
| JP | 09081543 A * | 3/1997 |
| JP | 2000-028665 | 1/2000 |

OTHER PUBLICATIONS

Zahn, Bret A. "Optimizing Cost and Thermal Performance: Rapid Prototyping of a High Pin Count Cavity-Up Enhanced Plastic Ball Grid Array (EPBGA) Package." Fifteenth IEEE Semi-Therm Symposium, 1999. pp. 133-141.*

Japanese Patent Abstract 03088071 dated Apr. 12, 1991.

Japanese Patent Office Action issued in JP2001-361979 on May 8, 2007.

* cited by examiner

| | MATERIAL TABLE | | | 320 |
|---|---|---|---|---|
| 321 | 321a MATERIAL NAME | 321b YOUNG'S MODULUS | 321c POISSON'S RATIO | 321d |
| 322 | 1 MT1 | | | |
| 323 | 2 MT2 | | | |
| 324 | 3 MT3 | | | |
| 325 | 4 MT4 | | | |
| | 5 MT5 | | | |

FIG. 11

STRUCTURAL ANALYSIS PROGRAM, A STRUCTURAL ANALYSIS METHOD, A STRUCTURAL ANALYSIS APPARATUS, AND A PRODUCTION PROCESS OF A SEMICONDUCTOR INTEGRATED CIRCUIT

BACKGROUND OF THE INVENTION

1) Field of the Invention

The present invention relates to a structural analysis program, a structural analysis method, and a structural analysis apparatus which are provided for performing a structural analysis of physical properties, and a production process of a semiconductor integrated circuit which undergoes a structural analysis in a design stage. The present invention relates in particular to a structural analysis program, a structural analysis method, and a structural analysis apparatus which are provided for performing a structural analysis by using a finite element model, and a production process of a semiconductor integrated circuit which undergoes a structural analysis using a finite element model in a design stage.

2) Description of the Related Art

In the field of the computer graphics (CG), a space is divided into voxels. The voxels are each a very small hexahedral element constituting the space. The voxel technique is used for physical simulation such as structural analysis using the finite element method. For example, the conventional structural analysis simulation is performed through the following steps.

1. Production of a geometrical shape model by a three-dimensional CAD (Computer Aided Design).
2. Production of a finite element model (conversion of the geometrical shape model into a finite element model) by a preprocessor.
3. Numerical analysis by a solver.
4. Visualization of a result of the numerical analysis by a postprocessor.

That is, a structural analysis simulation of a three-dimensional geometrical shape model can be performed through the above steps, where a three-dimensional CAD space is divided into a plurality of voxels in the stage of the production of the finite element model, and the solver is an analysis program for numerical analysis based on the finite element method.

By use of the above structural analysis simulation, stress calculation of an object represented by a geometrical shape model can be performed on a computer. Thus, it is possible to calculate strength and durability of a designed part before production of a prototype of the part is completed.

Although the structural analysis simulation is premised on capability of production of a geometrical shape model, in some technical fields, design is carried out without production of a geometrical shape model. For example, since the design of semiconductor integrated circuits (ICs) can be basically realized by the design of the wiring pattern in each layer, the semiconductor integrated circuits can be satisfactorily designed by using the two-dimensional CAD.

However, the structural analysis simulation is currently becoming necessary even in the technical fields such as the IC design in which the three-dimensional CAD is not used. For example, in design of multilayer wiring in advanced LSIs (Large Scale Integrated circuits), strength prediction for manufacturing processes is necessary.

Nevertheless, production of a geometrical shape model by use of the three-dimensional CAD for only the structural analysis simulation imposes a heavy load on the designer. Generally, it takes long time for an engineer who usually uses only a two-dimensional CAD to master operation procedures of a three-dimensional CAD, which are not easy to understand. In addition, from the viewpoint of the efficiency in design work, it is not realistic to produce a geometrical shape model by use of a three-dimensional CAD for only the structural analysis simulation every time a wiring pattern produced by a two-dimensional CAD is changed.

Further, it is difficult to automatically produce a finite element model which is appropriate for simulation of multilayer wiring in an LSI since LSIs have fine structures, and are assembled from a number of parts made of various materials. Therefore, when an accurate result is required, the number of voxels becomes great (e.g., hundreds of thousands to hundreds of millions), and the amount of calculation also becomes great. Furthermore, since it is not easy to recognize from a three-dimensional model a complex assembly structure of multilayer wiring in an LSI, a voxel having a size which is inappropriate from a viewpoint of the structure of the LSI can be produced when the sizes and shapes of voxels are defined based on a geometrical shape model.

SUMMARY OF THE INVENTION

The present invention is made in view of the above problems, and a first object of the present invention is to provide a structural analysis program, a structural analysis method, and a structural analysis apparatus which can easily perform a structural analysis by the finite element method based on data representing a two-dimensional shape.

In addition, a second object of the present invention is to provide a production process of a semiconductor integrated circuit which is guaranteed to have sufficient strength by a structural analysis using the finite element method.

In order to accomplish the first object, a structural analysis program which analyzes physical properties of a multilayer structure is provided. The structural analysis program is characterized in that the structural analysis program makes a computer execute processing which comprises the steps of: (a) producing a two-dimensional model of the structure in response to a manipulation input which designates a material arrangement pattern and a thickness of each layer of the structure; (b) producing a three-dimensional model by adding the designated thickness of each layer to the material arrangement pattern of the layer so as to make the material arrangement pattern three-dimensional and stacking the three-dimensionalized material arrangement pattern of each layer; (c) producing a finite element model by dividing the three-dimensional model into a plurality of voxels; and (d) performing a structural analysis based on the produced finite element model.

In order to accomplish the second object, a production process of a semiconductor integrated circuit having multilayer wiring is provided. The production process is characterized in that the production process comprises the steps of: (a) producing a two-dimensional model of the semiconductor integrated circuit in response to a manipulation input which designates layer-based material arrangement patterns of the semiconductor integrated circuit and a thickness of each layer; (b) producing a three-dimensional model by adding the designated thickness of each layer to the layer-based material arrangement patterns so as to make the layer-based material arrangement patterns three-dimensional, and stacking the three-dimensionalized layer-based material arrangement patterns; (c) producing a finite element model by dividing the three-dimensional model into a plurality of voxels; (d) performing a structural analysis based on the produced finite element model; (e) determining, based on a result of the structural analysis, whether or not the layer-based material arrangement patterns of the semiconductor integrated circuit are acceptable; and (f) producing the semiconductor integrated circuit in accordance with the layer-based material arrangement patterns when it is determined in step (e) that the layer-based material arrangement patterns of the semiconductor integrated circuit are acceptable.

The above and other objects, features and advantages of the present invention will become apparent from the following description when taken in conjunction with the accompanying drawings which illustrate preferred embodiment of the present invention by way of example.

BRIEF DESCRIPTION OF THE DRAWINGS

In the drawings:

FIG. 2(A) illustrates an insulation adhesive application stage, FIG. 2(B) illustrates an alignment stage, and FIG. 2(C) illustrates a heating and pressurization stage;

FIG. 11 is a diagram illustrating an example of a material table;

DESCRIPTION OF THE PREFERRED EMBODIMENTS

Embodiments of the present invention are explained below with reference to drawings.

Figure 1:
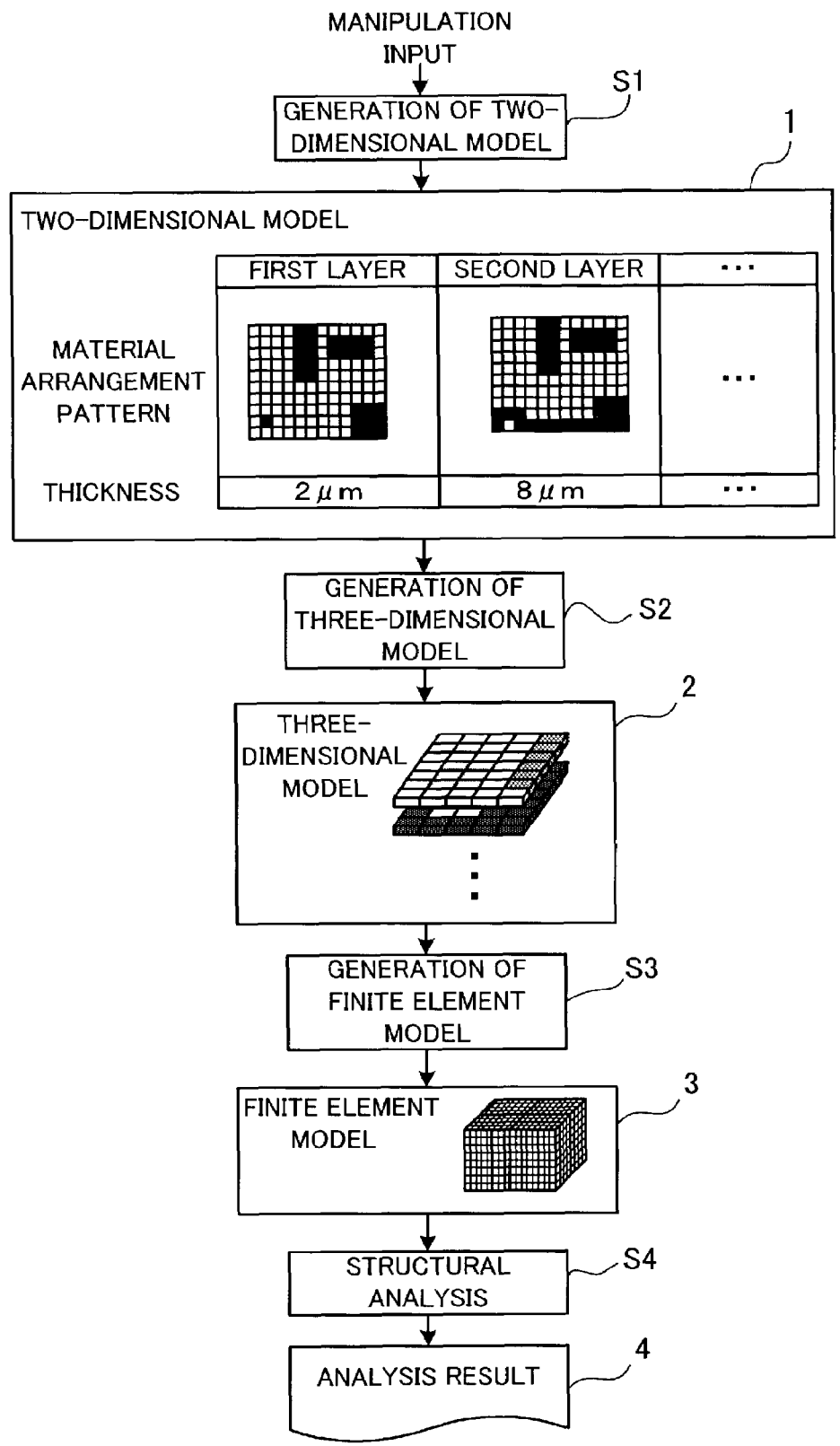
FIG. 1 is a diagram illustrating a basic construction of the present invention.

FIG. 1 is a diagram illustrating a basic construction of the present invention. The structural analysis program according to the present invention makes a computer perform an analysis of physical properties of a multilayer structure. The computer performs a structural analysis in the following sequence.

The computer generates a two-dimensional model 1 of a structure in response to a manipulation input which designates layer-based material arrangement patterns of the structure and a thickness of each layer (in step S1). That is, the two-dimensional model 1 is information on the layer-based material arrangement patterns of the structure and the thickness of each layer. For example, the material arrangement pattern includes a table in which a plurality of cells are arranged. The material arrangement pattern is defined by assigning a material to each cell in the table.

Next, the computer makes the layer-based material arrangement patterns three-dimensional by adding the designated thickness of each layer to the layer-based material arrangement patterns in the generated two-dimensional model 1. Then, the computer generates a three-dimensional model 2 by stacking the three-dimensionalized layer-based material arrangement patterns (in step S2). In the generated three-dimensional model, shapes and positions are defined by coordinate values in a virtual three-dimensional space.

In addition, the computer divides the three-dimensional model 2 into a plurality of voxels, and generates a finite element model 3 (in step S3). For example, when the three-dimensional model 2 is constituted by a plurality of cells, the voxel size in each division direction is determined to be a value obtained by dividing a minimum value of cell sizes in the division direction by an integer.

Finally, the computer performs a structural analysis based on the generated finite element model 3 (in step S4). Thus, an analysis result 4 of a multilayer structure defined by the two-dimensional model 1 is obtained.

When a user makes a computer execute the above structural analysis program and designates in the computer the layer-based material arrangement patterns and the thickness of each layer of the structure, the computer can perform a structural analysis in accordance with the finite element method. Generally, when a multilayer structure such as an LSI is designed, a structure is defined for each layer. Therefore, it is possible to perform a structural analysis of an LSI or the like by inputting into the computer structure definitions which are generated in the design stage and setting thicknesses of the respective layers. That is, the structure definition based on a three-dimensional CAD for only the structural analysis is unnecessary, and thus the structural analysis becomes easy.

Hereinbelow, embodiments in each of which the present invention is applied to a structural analysis simulation of an LSI are explained in detail. In the following explanations, each rectangular region in the definitions of LSI wiring patterns is called a cell, and each hexahedral microelement after conversion to a finite element model (voxel model) is called a voxel.

First, necessity of structural analysis simulation in circuit design of an LSI is explained.

Generally, LSIs have an internal multilayer structure, and each layer includes wirings corresponding to complex paths. In addition, wiring portions and the other portions of each layer are made of different materials. Further, in order to connect wirings in different layers, holes called via holes are formed in each layer, and the via holes are filled with a conductive material. That is, LSIs have a structure in which various materials are intermingled with each other.

On the other hand, the manufactured LSI is mounted on a printed circuit board before installation in a product. In the stage of mounting of the LSI, external loads such as heat and pressure are imposed on the LSI. Examples of such loads are explained below.

Figure 2:
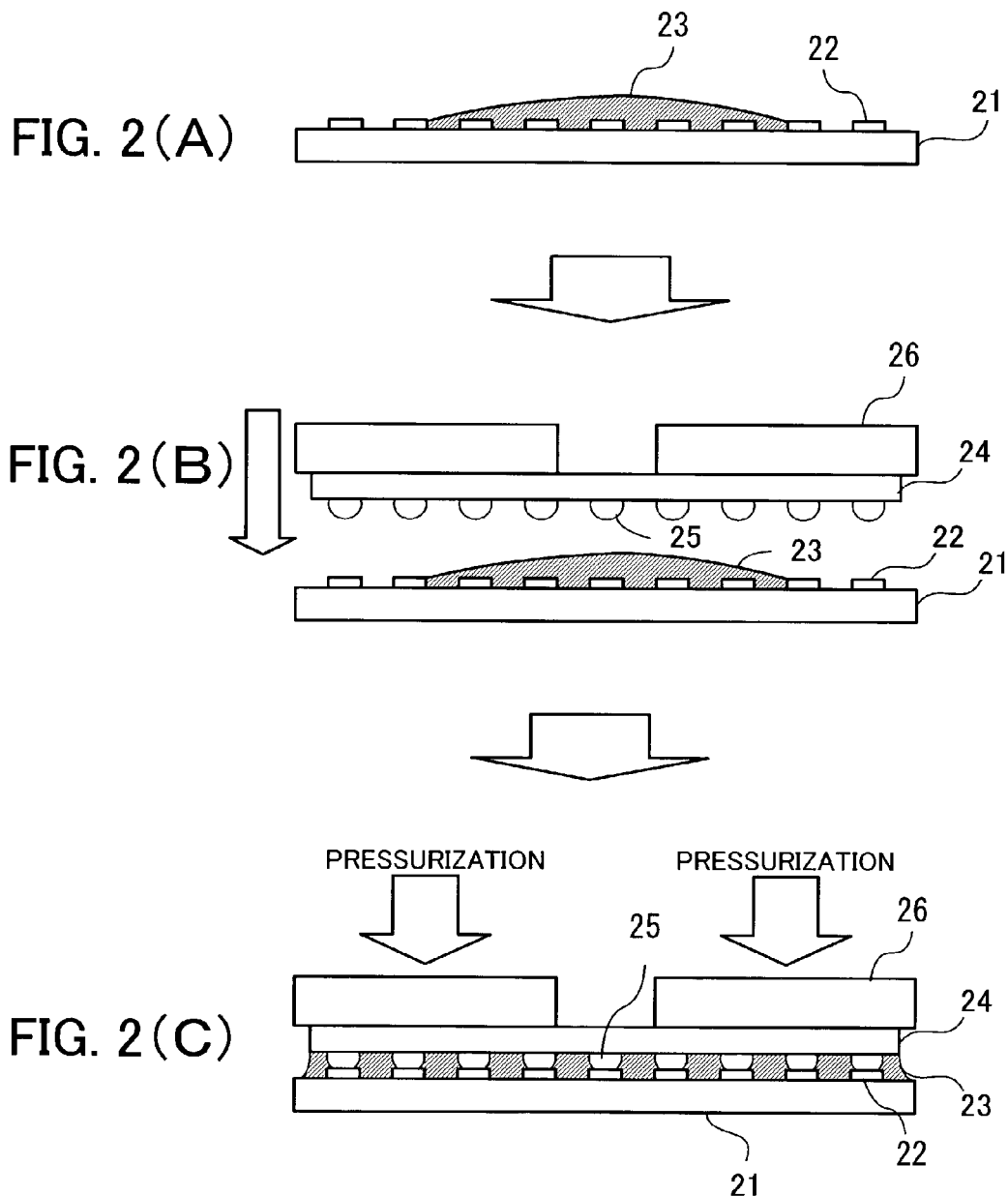
FIGS. 2(A), 2(B), and 2(C) are diagrams illustrating examples of production stages in which loads are imposed on LSIs, where

FIGS. 2(A), 2(B), and 2(C) are diagrams illustrating examples of production stages in which loads are imposed on LSIs. The production stages illustrated in FIGS. 2(A), 2(B), and 2(C) are stages in which an LSI is mounted on a printed circuit board. FIG. 2(A) illustrates an insulation adhesive application stage, FIG. 2(B) illustrates an alignment stage, and FIG. 2(C) illustrates a heating and pressurization stage.

A plurality of electrodes 22 are arranged on the upper surface of the printed circuit board 21 on which an LSI 24 is to be mounted. The plurality of electrodes 22 are connected to wirings in the printed circuit board 21. In addition, in the insulation adhesive application stage illustrated in FIG. 2(B), an insulation adhesive material 23 is applied to the upper surface of the printed circuit board 21.

Next, the operations in the alignment stage are performed. As illustrated in FIG. 2(B), a plurality of bumps 25 are formed on the lower surface of the mounted LSI 24. In the alignment stage, the LSI 24 is attached to a plurality of heating heads 26, and the lower surface of the mounted LSI 24, on which the plurality of bumps 25 are formed, is brought close to the printed circuit board 21 from the upper side. Then, the position of the LSI 24 is adjusted so that the positions of the plurality of bumps 25 fit the plurality of electrodes 22, and then the LSI 24 is bonded to the upper surface of the printed circuit board 21.

Thereafter, in the configuration illustrated in FIG. 2(C), the LSI 24 is heated with the plurality of heating heads 26 so that the heat propagates to the insulation adhesive material 23, and the insulation adhesive material 23 is hardened. In addition, the plurality of heating heads 26 press the LSI 24 to the printed circuit board 21. Thus, the LSI 24 is securely connected to the plurality of electrodes 22.

As described above, in the process of mounting the LSI 24, thermal and mechanical loads are imposed on the LSI 24. At this time, if a portion of the internal structure of the LSI 24 does not have a sufficient strength, a trouble can occur in the portion.

Figure 3:
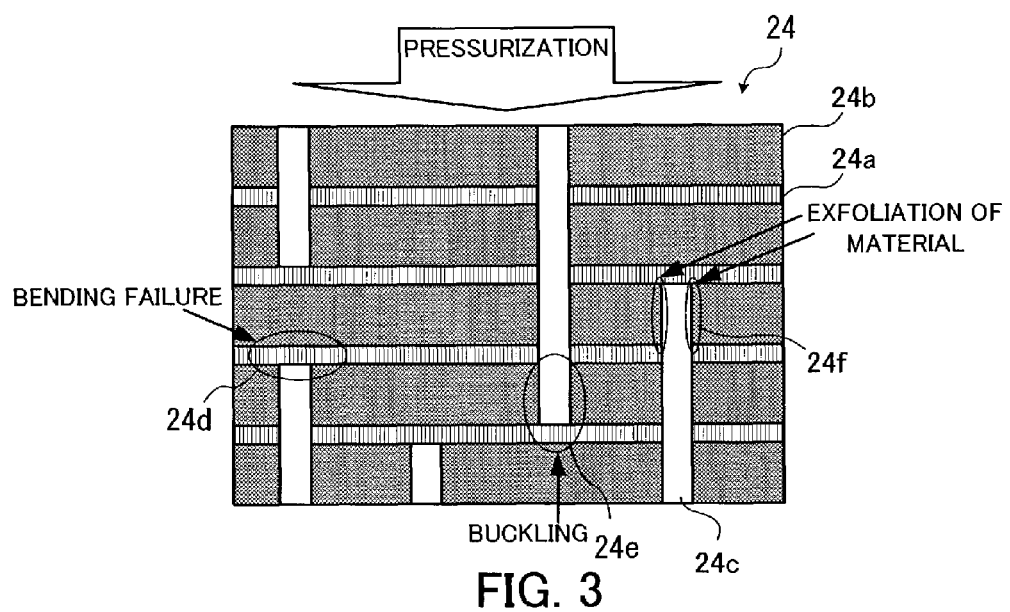
FIG. 3 is a diagram illustrating a cross section of an LSI.

FIG. 3 is a diagram illustrating a cross section of the LSI 24. In FIG. 3, portions of the internal structure of the LSI 24 in which external loads are likely to cause a trouble are indicated. As illustrated in FIG. 3, a plurality of wiring layers 24a and a plurality of insulation layers 24b are alternately formed in the LSI 24. Via holes are provided in the plurality of insulation layers 24b, and interlayer wirings 24c are formed in the via holes.

When a pressure is applied to the above LSI 24 in the vertical direction, a bending failure can occur in the portions 24d of the plurality of wiring layers 24a at which the plurality of wiring layers 24a are connected to the interlayer wirings 24c. In addition, a buckling can occur in the end portions 24e of the interlayer wirings 24c at which the interlayer wirings 24c are connected to the plurality of wiring layers 24a. Further, an exfoliation can occur in the portions 24f of the interlayer wirings 24c at which the interlayer wirings 24c are connected to the plurality of insulation layers 24b.

In order to prevent occurrence of the above problems, it is necessary to design the LSI 24 so as to have sufficient strength to withstand the loads imposed during the mounting process. Therefore, as the first embodiment of the present invention, a structural analysis program, a structural analysis method, and a structural analysis apparatus which make users easily perform a structural analysis of multilayer wiring LSI by using a computer are explained. In addition, as the second embodiment of the present invention, a production process of an LSI which is guaranteed, by a structural analysis, to have sufficient strength against loads imposed during a mounting process is explained.

First Embodiment

The first embodiment is explained below. In the first embodiment, a three-dimensional structure of an LSI is generated based on a two-dimensional structure definition of the LSI, and a structural analysis is performed in the three-dimensional space.

Figure 4:
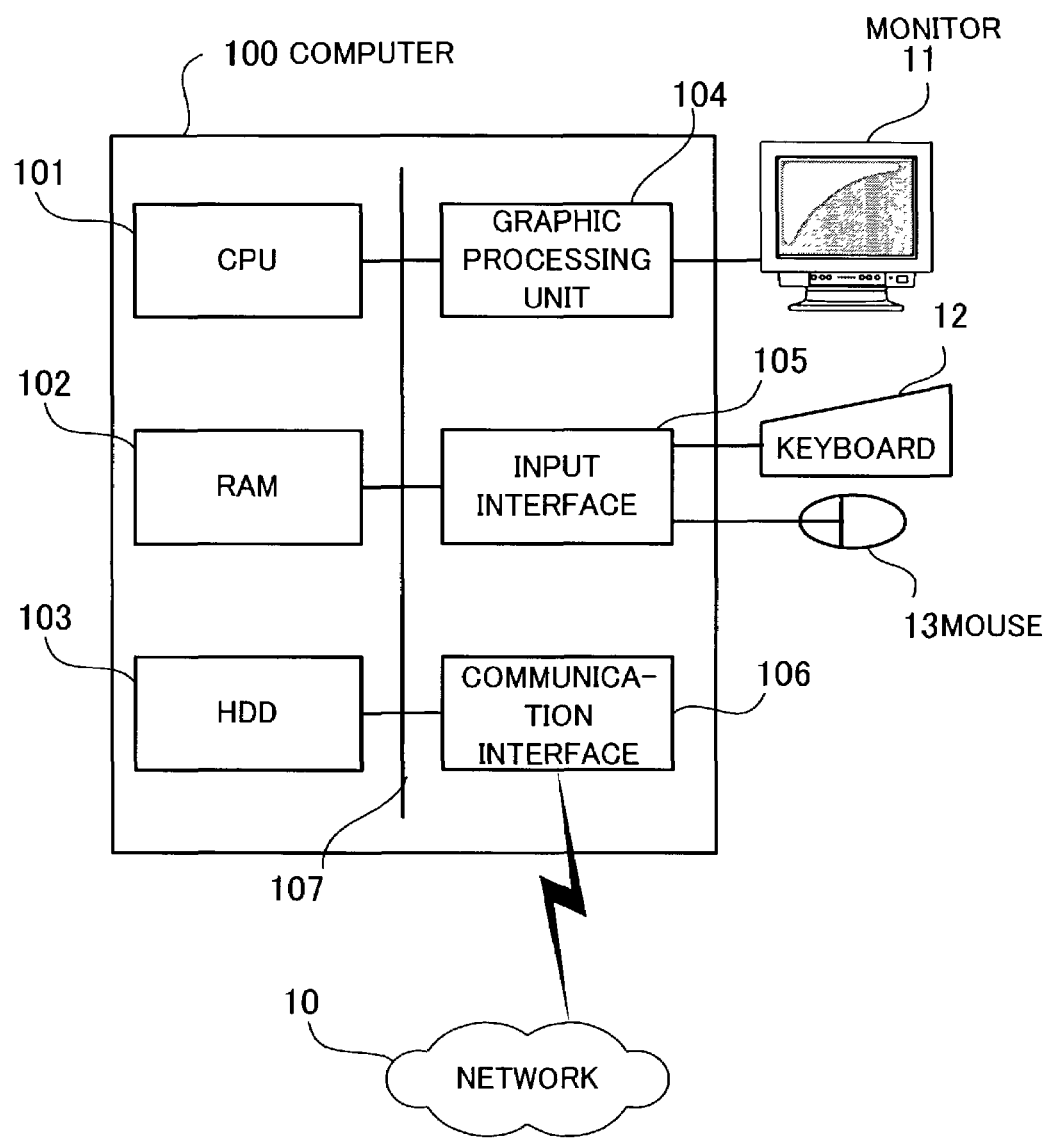
FIG. 4 is a diagram illustrating an example of a hardware construction of a computer which can execute a structural analysis program.

FIG. 4 is a diagram illustrating an example of a hardware construction of a computer which can execute a structural analysis program. The entire system of the computer 100 is controlled by a CPU (central processing unit) 101. A RAM (random access memory) 102, an HDD (hard disk drive) 103, a graphic processing unit 104, an input interface 105, and a communication interface 106 are connected to the CPU 101 through a bus 107.

The RAM 102 temporarily stores at least portions of an operating system (OS) and an application program executed by the CPU 101, as well as various data which are necessary for execution of the programs by the CPU 101. The HDD 103 stores the operating system (OS) and the application program such as a structural analysis program.

A monitor 11 is connected to the graphic processing unit 104, which makes the monitor 11 display an image on a screen of the monitor 11 in accordance with an instruction from the CPU 101. A keyboard 12 and a mouse 13 are connected to the input interface 105, which transmits to the CPU 101 through the bus 107 signals transmitted from the keyboard 12 and the mouse 13.

The communication interface 106 is connected to a network 10, and exchanges data with other computers.

When the computer 100 having the above construction executes a structural analysis program, the computer 100 behaves as a structural analysis apparatus. The processing functions of the structural analysis apparatus are explained below.

The structural analysis apparatus as the first embodiment of the present invention can perform zooming analysis. In the zooming analysis, a portion of elements produced by a rough element division is extracted, and the extracted elements are finely divided into finer elements for highly precise analysis. In the following explanations, a model representing an entire structure of an LSI to be analyzed is referred to as an entire-structure model, and a model representing a structure of an element subject to zooming analysis is referred to as a partial-structure model.

Figure 5:
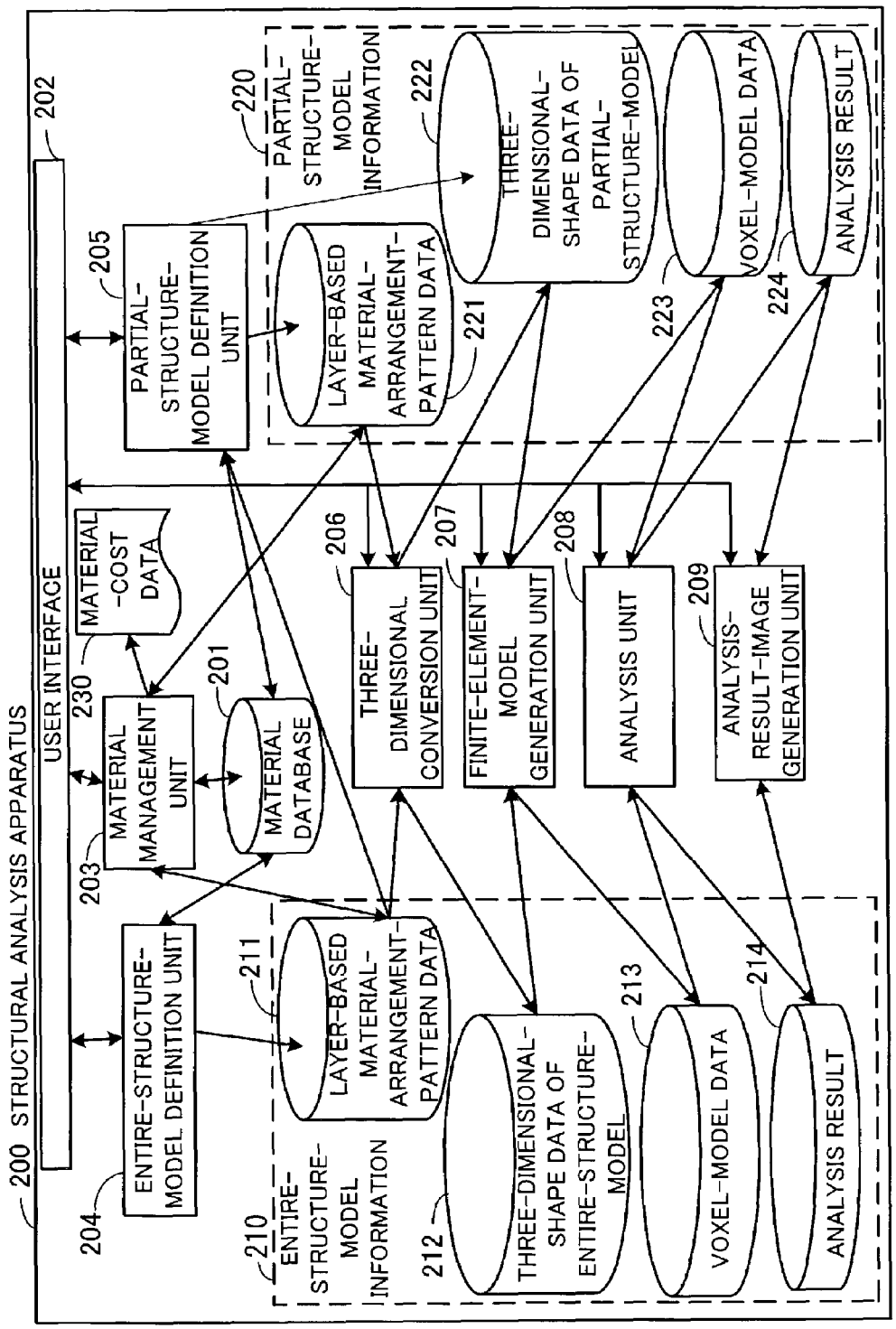
FIG. 5 is a function block diagram illustrating a construction of the structural analysis apparatus from the viewpoint of the functions of the structural analysis apparatus.

FIG. 5 is a function block diagram illustrating a construction of the structural analysis apparatus from the viewpoint of the functions of the structural analysis apparatus. The structural analysis apparatus 200 comprises a material database (DB) 201, a user interface 202, a material management unit 203, an entire-structure-model definition unit 204, a partial-structure-model definition unit 205, a three-dimensional conversion unit 206, a finite-element-model generation unit 207, an analysis unit 208, and an analysis-result-image generation unit 209.

In addition, information produced by structural analysis processing includes entire-structure-model information 210, partial-structure-model information 220, and material-cost data 230. The entire-structure-model information 210 and the partial-structure-model information 220 are stored in a memory such as the RAM 102 during the analysis processing, and the entire-structure-model information 210, the partial-structure-model information 220, and the material-cost data 230 can be continuously held even after completion of the analysis by storing the entire-structure-model information 210, the partial-structure-model information 220, and the material-cost data 230 in the HDD 103 or the like.

Information on various materials used in the LSI, including values of physical properties, unit prices, and the like of the materials, are registered in the material database 201, where the physical properties includes, for example, the Young's modulus and the Poisson's ratio.

The user interface 202 transfers manipulation inputs from input devices such as the keyboard 12 and the mouse 13 to the respective constituents of the structural analysis apparatus 200, and the user interface 202 makes a display device such as the monitor 11 display an image generated by the respective constituents.

The material management unit 203 manages the data in the material database 201 in accordance with the manipulation inputs by a user. In addition, the material management unit 203 refers to layer-based material-arrangement-pattern data 211 and 221, and calculates the amounts of the respective materials used in the LSI which is to be analyzed. The material management unit 203 further calculates a material cost of the LSI based on the amounts of the respective materials used in the LSI and the unit prices registered in the material database 201. The calculated material cost is displayed on the screen through the user interface 202. The material management unit 203 stores in the HDD 103 the calculated material cost, which is associated with the entire-structure-model information 210.

The entire-structure-model definition unit 204 receives through the user interface 202 a manipulation input by a user, and defines a two-dimensional structure of an entire-structure model in accordance with the manipulation input. Specifically, the manipulation input received by the entire-structure-model definition unit 204 includes an arrangement and a thickness of each layer constituting the LSI and sizes of cells constituting each layer. Then, the entire-structure-model definition unit 204 generates two-dimensional structure data for each layer, and divides each layer into a plurality of cells. In addition, the entire-structure-model definition unit 204 receives a material designation input from the user, and classifies the cells into groups according to materials, where the material designation input designates a material of each cell. Further, the entire-structure-model definition unit 204 generates the layer-based material-arrangement-pattern data 211 based on the correspondences between the respective groups and the materials.

The layer-based material-arrangement-pattern data 211 in the entire-structure-model information 210 is produced by defining materials constituting each layer of the entire-structure model on a two-dimensional plane corresponding to the layer. In the layer-based material-arrangement-pattern data 211, the cells are classified into the groups, and a correspondence between each group and a material in the material database 201 is defined. In addition, the entire-structure-model information 210 includes data on the thickness of each layer.

The partial-structure-model definition unit 205 receives through the user interface 202 a first manipulation input from the user, and defines a two-dimensional structure of a partial-structure model in accordance with the manipulation input. Specifically, the first manipulation input received by the partial-structure-model definition unit 205 designates a zooming region. Then, the partial-structure-model definition unit 205 acquires information on cells included in the zooming region, from the layer-based material-arrangement-pattern data 211 in the entire-structure-model information 210, and defines the cells included in the zooming region as a partial-structure model. In addition, the partial-structure-model definition unit 205 receives through the user interface 202 a second manipulation input from the user, where the second manipulation input relates to an arrangement and a thickness of each layer constituting the zooming region and sizes of cells constituting each layer. Then, the partial-structure-model definition unit 205 generates a two-dimensional structure data for each layer, and divides each layer into a plurality of cells. Next, the partial-structure-model definition unit 205 receives a material designation input from the user, and classifies the cells into groups according to materials, where the material designation input designates a material of each cell. Further, the partial-structure-model definition unit 205 generates the layer-based material-arrangement-pattern data 221 based on the correspondences between the respective groups and the materials.

The layer-based material-arrangement-pattern data 221 in the partial-structure-model information 220 is produced by defining materials constituting each layer of the partial-structure model on a two-dimensional plane corresponding to the layer. In the layer-based material-arrangement-pattern data 221, the cells are classified into the groups, and a correspondence between each group and a material in the material database 201 is defined. In addition, the partial-structure-model information 220 includes data on the thickness of each layer.

The three-dimensional conversion unit 206 refers to the layer-based material-arrangement-pattern data 211 in the entire-structure-model information 210, and generates three-dimensional-shape data 212 of an entire-structure-model. That is, the three-dimensional conversion unit 206 makes layer-based material arrangement patterns three-dimensional by adding the designated thickness of each layer to the layer-based material arrangement patterns, which are generated as the layer-based material-arrangement-pattern data 211. In addition, the three-dimensional conversion unit 206 stacks the three-dimensional layer-based material arrangement patterns, so that the three-dimensional-shape data 212 of the entire-structure-model is obtained. The three-dimensional-shape data 212 of the entire-structure-model represents the LSI to be analyzed, with a three-dimensional shape of each material.

Further, the three-dimensional conversion unit 206 refers to the layer-based material-arrangement-pattern data 221 in the partial-structure-model information 220, and generates the three-dimensional-shape data 222 of the partial-structure model. The three-dimensional-shape data 222 of the partial-structure model represents the cells in the zooming region to be analyzed, with a three-dimensional shape of each material.

The finite-element-model generation unit 207 generates voxel-model data 213 based on the three-dimensional-shape data 212 of the entire-structure-model. At this time, the finite-element-model generation unit 207 determines the length of each voxel in each of three axis directions to be a value obtained by dividing a minimum value of the lengths, in the direction, of the cells constituting the three-dimensional-shape data 212 of the entire-structure-model, by an arbitrary value, which is designated by a manipulation input from the user.

In addition, the finite-element-model generation unit 207 generates voxel-model data 223 based on the three-dimensional-shape data 222 of the partial-structure model. At this time, the finite-element-model generation unit 207 determines the length of each voxel in each of three axis directions to be a value obtained by dividing a minimum value of the lengths, in the direction, of the cells constituting the three-dimensional-shape data 222 of the entire-structure-model, by an arbitrary value, which is designated by a manipulation input from the user.

The analysis unit 208 receives input of an analysis condition by the user, and performs a structural analysis of the entire-structure model based on the voxel-model data 213. In addition, the analysis unit 208 generates an analysis result 214 of the entire-structure model, which includes data of displacements, temperatures, stress, and the like at nodes (vertexes of the hexahedral microelements) of the respective voxels included in the voxel-model data 213.

In addition, the analysis unit 208 generates an analysis condition of the partial-structure model based on the analysis condition of the entire-structure model and the analysis result 214 of the entire-structure model. In addition, the analysis unit 208 performs a structural analysis of the partial-structure model based on the voxel-model data 223. Then, the analysis unit 208 generates an analysis result 224 of the partial-structure model, which includes data of displacements, temperatures, stress, and the like at nodes (vertexes of the hexahedral microelements) of the respective voxels included in the voxel-model data 223.

The analysis-result-image generation unit 209 performs a perspective projection or the like on the entire-structure model, and generates an image of the entire-structure model. Next, the analysis-result-image generation unit 209 refers to the analysis result 214, and determines the colors of the image of the entire-structure model according to loads imposed on the entire-structure model. In addition, the analysis-result-image generation unit 209 refers to the analysis result 224, and modifies the colors in the zooming region of the entire-structure model according to loads imposed on the partial-structure model. An image of the entire-structure model having the determined colors is displayed under control of the analysis-result-image generation unit 209 through the user interface 202.

As explained above, the structural analysis apparatus 200 having the above construction can perform a structural analysis of an LSI.

The structural analysis processing is explained below.

Figure 6:
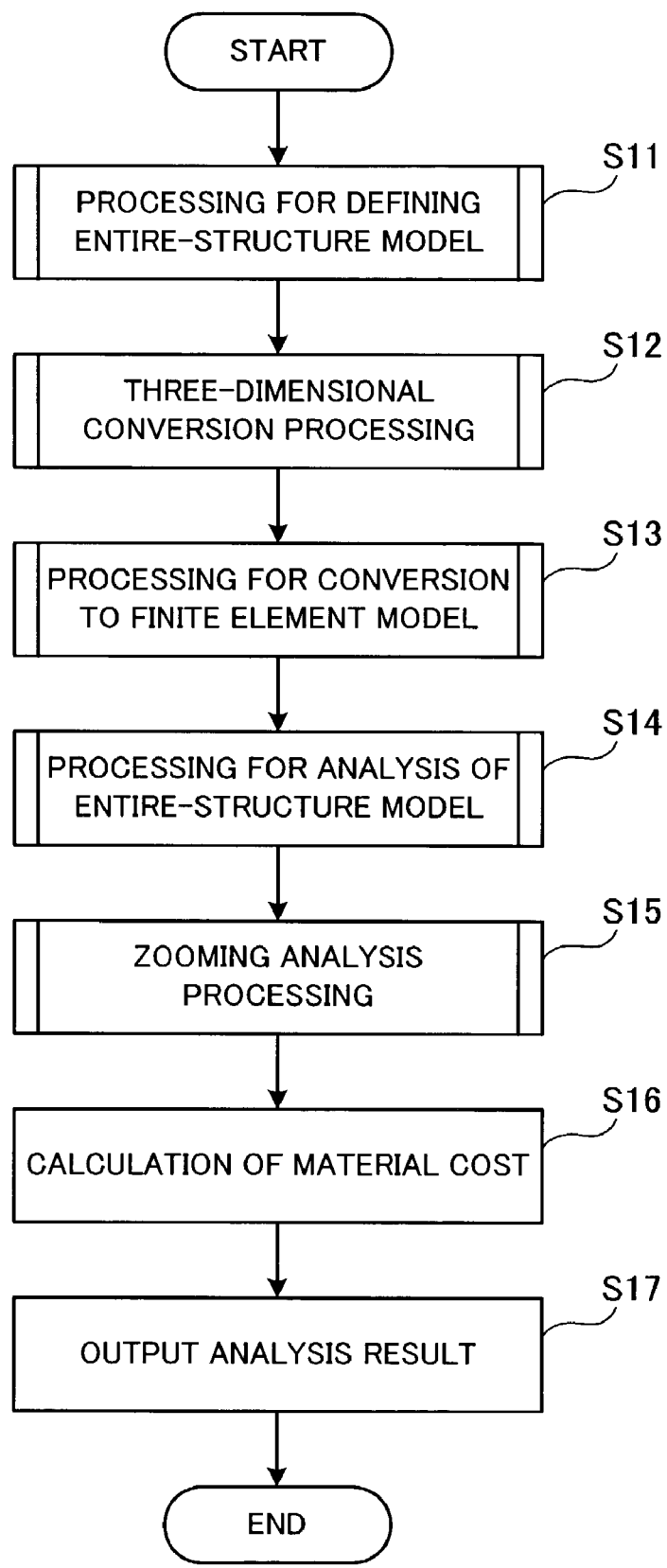
FIG. 6 is a flowchart illustrating an entire sequence of structural analysis processing.

FIG. 6 is a flowchart illustrating an entire sequence of structural analysis processing. The sequence is explained below step by step.

[Step S11] The material management unit 203 registers material information in the material database 201, and the entire-structure-model definition unit 204 defines an entire-structure model by using the material information in the material database 201. In the entire-structure model at this stage, only a two-dimensional circuit pattern is defined for each layer.

[Step S12] The three-dimensional conversion unit 206 converts the two-dimensional layer-based data defined in the layer-based material-arrangement-pattern data 211 in the entire-structure-model information 210, into three-dimensional data, and generates the three-dimensional-shape data 212 of the entire-structure-model.

[Step S13] The finite-element-model generation unit 207 generates the voxel-model data 213 for analysis of the entire-structure model based on the three-dimensional-shape data 212 of the entire-structure-model.

[Step S14] The analysis unit 208 performs a structural analysis of the entire-structure model based on the voxel-model data 213 in the entire-structure-model information 210, so that the analysis result 214 is generated.

[Step S15] The partial-structure-model definition unit 205 generates the layer-based material-arrangement-pattern data 221 of a partial-structure model comprised of cells included in the zooming region. In addition, zooming analysis processing of the partial-structure model is performed by the three-dimensional conversion unit 206, the finite-element-model generation unit 207, and the analysis unit 208, so that the three-dimensional-shape data 222 of the partial-structure model, the voxel-model data 223, and the analysis result 224 are generated.

[Step S16] The material management unit 203 calculates the material cost, so that the material-cost data 230 is generated. The material cost can be calculated as follows.

Material Cost=$S\{$Unit Price of Material$\}\times\{$Used Amount (Weight or Volume) of Material$\}$.

In the above equation, S indicates a sum of products each of which is calculated as a product of a unit price of a material and the used amount of the material.

[Step S17] An image indicating the structural analysis result is displayed on the screen under control of the analysis-result-image generation unit 209 through the user interface 202, and the material-cost data 230 generated by the material management unit 203 is displayed under control of the material management unit 203 through the user interface 202.

Next, the sequences of various processing operations are explained in detail below.

Figure 7:
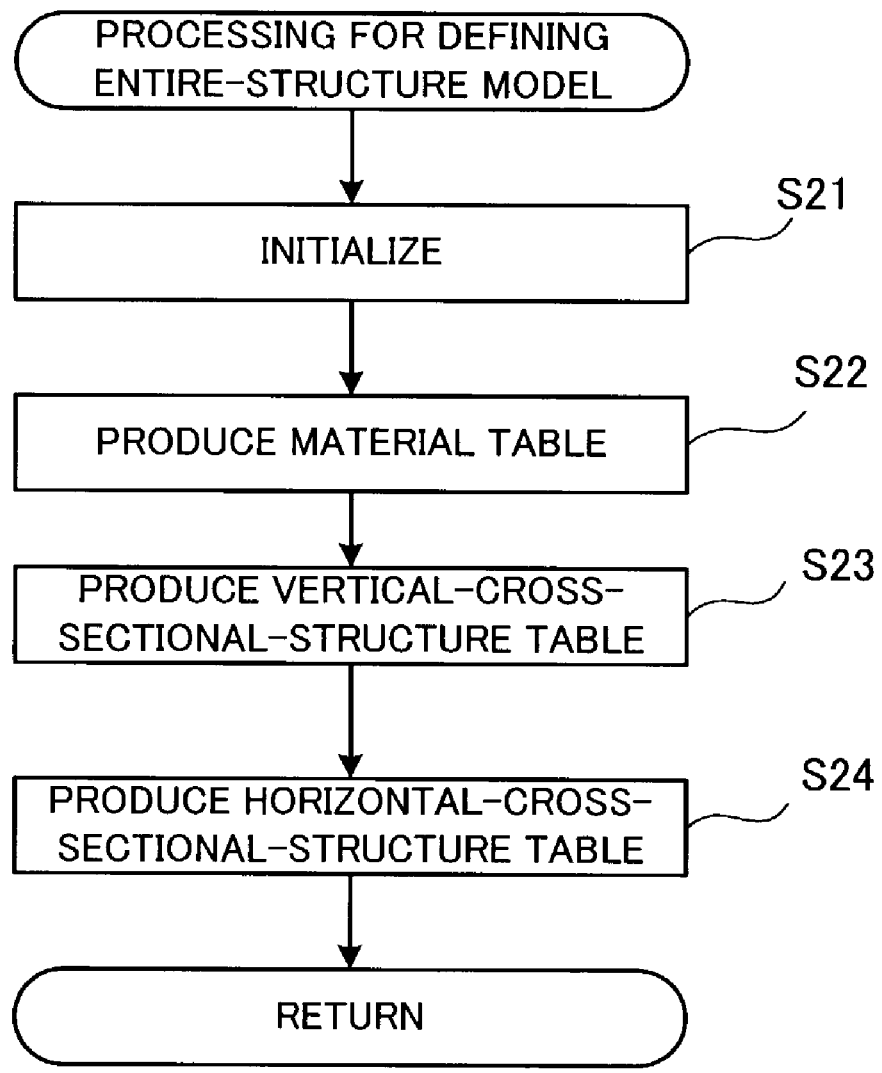
FIG. 7 is a flowchart illustrating details of processing for defining an entire-structure model.

FIG. 7 is a flowchart illustrating details of processing for defining an entire-structure model, which are explained below step by step.

[Step S21] The user interface 202 initializes the material-cost data 230, the entire-structure-model information 210, and the partial-structure-model information 220 in response to a manipulation input from the user.

Specifically, the user interface 202 outputs an initialization request to the material management unit 203, the entire-structure-model definition unit 204, and the partial-structure-model definition unit 205. In response to the initialization request, the material management unit 203 sets a predetermined initial value in an area in which the material-cost data 230 is stored, the entire-structure-model definition unit 204 sets a predetermined initial value of the entire-structure-model information 210, and the partial-structure-model definition unit 205 sets a predetermined initial value of the partial-structure-model information 220.

[Step S22] The material management unit 203 produces a material table in response to a manipulation input from the user. In the material table, materials used in the structure of the entire-structure model are registered in the material table.

[Step S23] The entire-structure-model definition unit 204 produces a vertical-cross-sectional-structure table in response to a manipulation input from the user. In the vertical-cross-section structure table, the thickness of each layer of the LSI to be analyzed and the cell sizes in the X, Y, and Z axis directions are defined. The cell size in each direction can be set to the greatest common divisor of the minimum widths of the respective materials in the direction.

[Step S24] The entire-structure-model definition unit 204 produces a horizontal-cross-sectional-structure table in response to a manipulation input from the user. In the horizontal-cross-sectional-structure table, a cross-sectional structure of each layer of the LSI to be analyzed is defined. The cross-sectional structure is divided into a plurality of cells, and a material of each cell is set. Thereafter, the operation goes to step S12 in FIG. 6.

The material table, the vertical-cross-sectional-structure table, and the horizontal-cross-sectional-structure table constitute the layer-based material-arrangement-pattern data 211.

When the user inputs appropriate data in predetermined areas in a model-structure-definition input screen displayed by the user interface 202, the layer-based material-arrangement-pattern data 211 can be produced.

Figure 8:
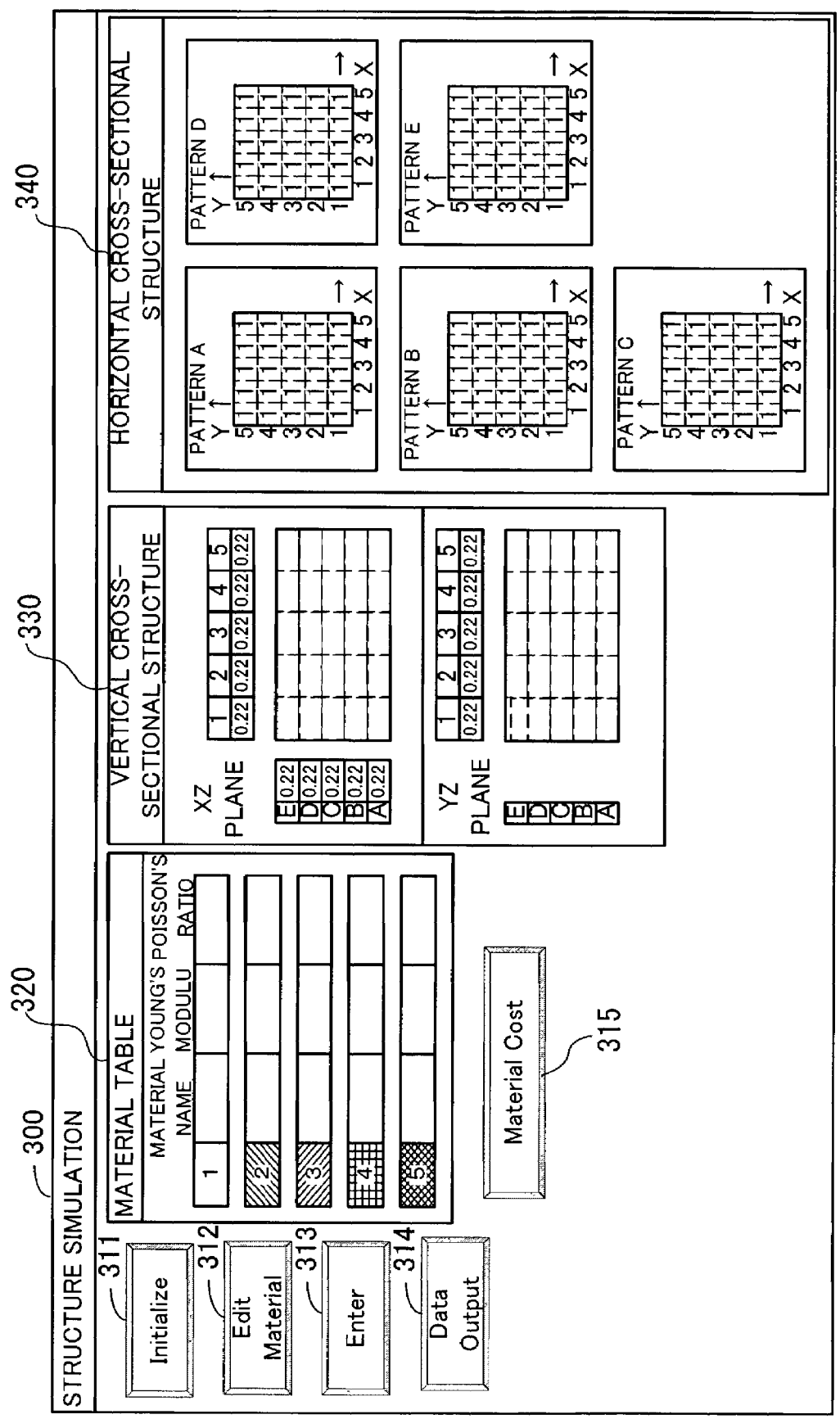
FIG. 8 is a diagram illustrating a model-structure-definition input screen.

FIG. 8 is a diagram illustrating a model-structure-definition input screen. The model-structure-definition input screen 300 includes an Initialize button 311, an Edit Material button 312, an Enter button 313, a Data Output button 314, a Material Cost button 315, a material table 320, a vertical-cross-sectional-structure table 330, and a horizontal-cross-sectional-structure table 340.

The Initialize button 311 is provided for initializing each table. When the Initialize button 311 is pressed, the user interface 202 sets the contents of the material table 320, the vertical-cross-sectional-structure table 330, and the horizontal-cross-sectional-structure table 340 to initial values which are predetermined for them.

The Edit Material button 312 is provided for editing the contents of the material database 201. When the Edit Material button 312 is pressed, a material editing screen is displayed under control of the material management unit 203. The user can register a new material in the material database 201 or change a physical property of a material registered in the material database 201 by providing a predetermined manipulation input to the material editing screen.

The Enter button 313 is provided for fixing the contents of the model-structure-definition input screen 300 and producing the layer-based material-arrangement-pattern data 211. When the Enter button 313 is pressed, the information set in the material table 320, the vertical-cross-sectional-structure table 330, and the horizontal-cross-sectional-structure table 340 is fixed.

The Data Output button 314 is provided for outputting the contents of the model-structure-definition input screen 300 as the layer-based material-arrangement-pattern data 211 in order to generate three-dimensional shape data. When the Data Output button 314 is pressed, information which is set in the material table 320, the vertical-cross-sectional-structure table 330, and the horizontal-cross-sectional-structure table 340 is output as the layer-based material-arrangement-pattern data 211.

The Material Cost button 315 is provided for calculating a material cost. When the Material Cost button 315 is pressed, the material management unit 203 calculates the material cost. At this time, the material management unit 203 generates the material-cost data 230, which is displayed on the screen.

The materials of the respective cells of the structure of the entire-structure model can be defined in the material table 320, the thickness and the cell size of each layer can be defined in the vertical-cross-sectional-structure table 330, and the materials of the respective cells constituting each layer can be defined in the horizontal-cross-sectional-structure table 340.

A procedure of user manipulation input into the model-structure-definition input screen 300 is explained below.

First, when the user presses the Initialize button 311, for example, by manipulating the mouse 13, an initialization-confirmation dialog as a subscreen is displayed.

Figure 9:
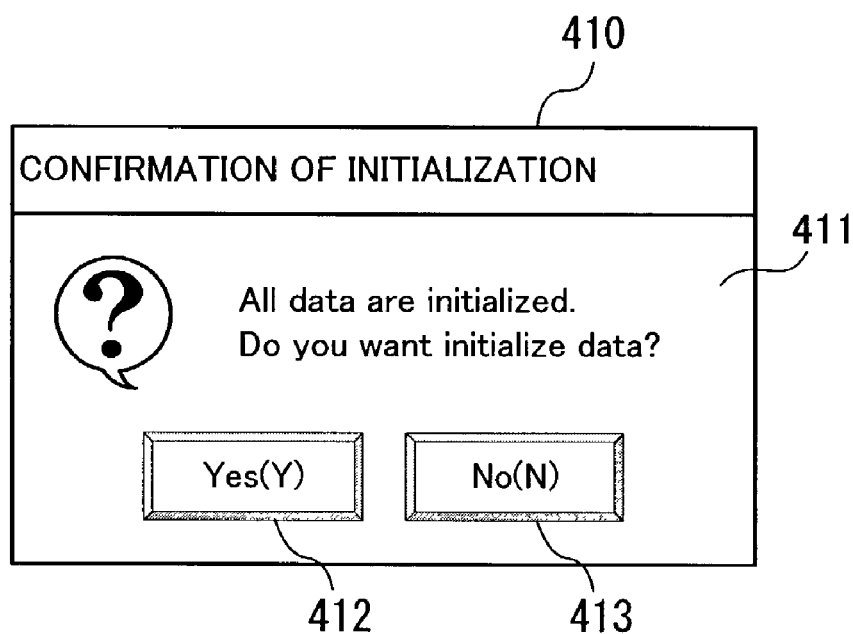
FIG. 9 is a diagram illustrating an initialization-confirmation dialog.

FIG. 9 is a diagram illustrating an initialization-confirmation dialog. The initialization-confirmation dialog 410 includes an initialization-confirmation message 411, a confirmation button 412, and a cancel button 413. In the example of FIG. 9, a character string "All data are initialized. Do you want to initialize data?" is displayed as the initialization-confirmation message 411. On the confirmation button 412, "Yes (Y)" is indicated. When the confirmation button 412 is pressed, existing tables are discarded, and new tables are produced as the material table 320, the vertical-cross-sectional-structure table 330, and the horizontal-cross-sectional-structure table 340, respectively. On the cancel button 413, "No (N)" is indicated. When the cancel button 413 is pressed, the initialization is aborted, and the original model-structure-definition input screen 300 is displayed.

In order to perform a structural analysis of a new LSI, the user presses the confirmation button 412 in the initialization-confirmation dialog 410. Then, the respective data in the model-structure-definition input screen 300 are initialized, and a structure-size-input dialog is displayed on the screen.

Figure 10:
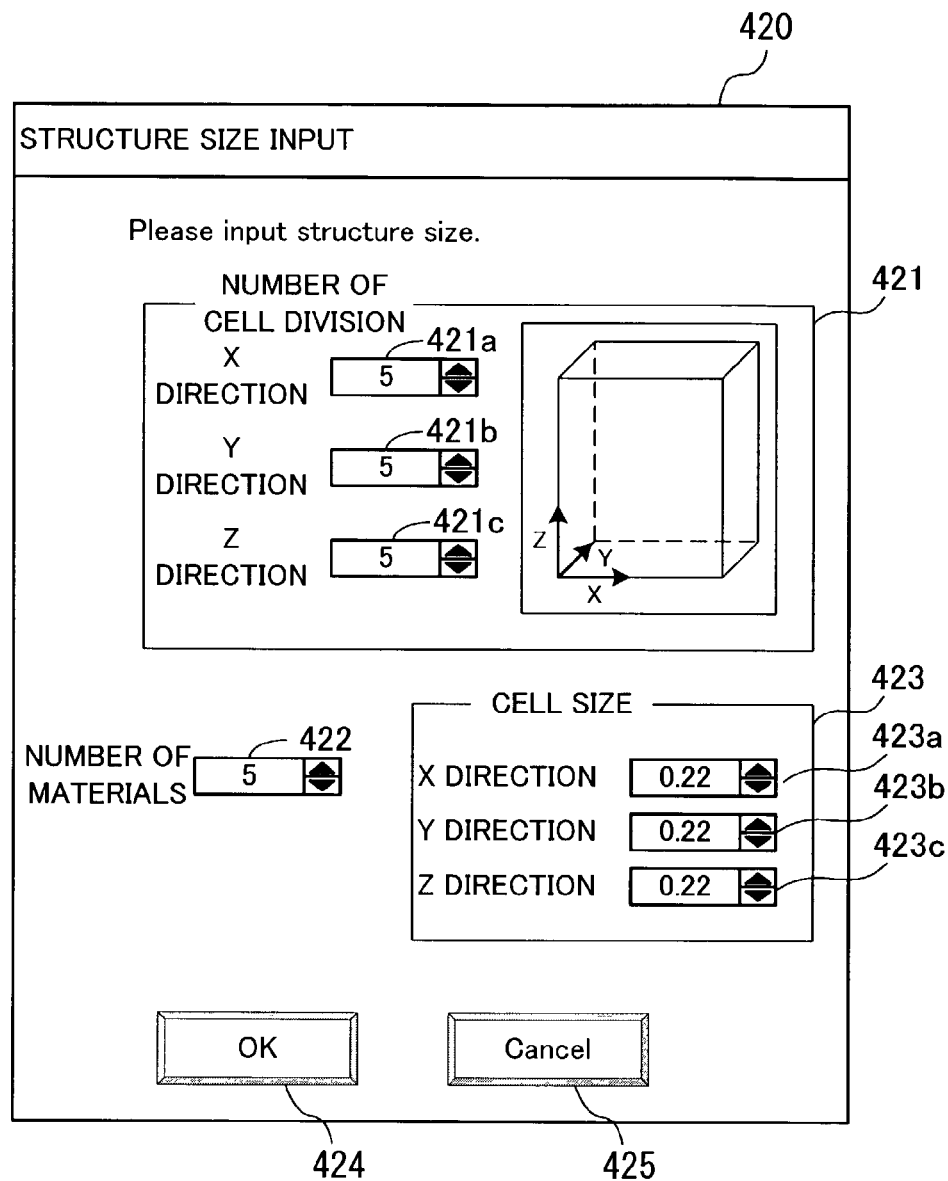
FIG. 10 is a diagram illustrating a structure-size-input dialog.

FIG. 10 is a diagram illustrating a structure-size-input dialog. The structure-size-input dialog 420 includes a number-of-cell-division input area 421, a material-number input area 422, a cell-size input area 423, an OK button 424, and a Cancel button 425.

The number-of-cell-division input area 421 includes textboxes 421a, 421b, and 421c for inputting the numbers of cell division in the X, Y, and Z directions, respectively. The user can set the number of cell division in each of the X, Y, and Z directions by inputting arbitrary values in the textboxes 421a, 421b, and 421c. The number of cell division in the X direction determines the number of columns in each pattern in the horizontal-cross-sectional-structure table 340 and the number of columns in the XZ plane in the vertical-cross-sectional-structure table 330, the number of cell division in the Y direction determines the number of rows in each pattern in the horizontal-cross-sectional-structure table 340 and the number of columns in the YZ plane in the vertical-cross-sectional-structure table 330, and the number of cell division in the Z direction determines the number of rows (the number of layers) in the XZ and YZ planes in the vertical-cross-sectional-structure table 330.

The material-number input area 422 is a textbox for inputting the number of materials constituting a structure to be defined. The user can set the number of materials by inputting an arbitrary value in the material-number input area 422. The number of materials in the material-number input area 422 determines the number of rows (the number of materials) in the material table 320.

The cell-size input area 423 includes textboxes 423a, 423b, and 423c for inputting cell sizes in the X, Y, and Z directions, respectively. Initially, default values are set in the textboxes 423a, 423b, and 423c. The user can set the cell sizes in the X, Y, and Z directions by inputting arbitrary values in the textboxes 423a, 423b, and 423c, respectively. The cell sizes in the cell-size input area 423 are also set in the vertical-cross-sectional-structure table 330.

The OK button 424 is provided for fixing the values set in the structure-size-input dialog 420. When the OK button 424 is pressed, the values set in the structure-size-input dialog 420 are fixed, and the contents of the structure-size-input dialog 420 are reflected in the respective tables in the model-structure-definition input screen 300.

The Cancel button 425 is provided for cancelling the values set in the structure-size-input dialog 420. When the Cancel button 425 is pressed, the contents of the structure-size-input dialog 420 are not reflected in the model-structure-definition input screen 300, and the structure-size-input dialog 420 is closed.

When the user inputs appropriate values in the structure-size-input dialog 420 illustrated in FIG. 10, and presses the OK button 424, the structure indicated in the model-structure-definition input screen 300 is reconstructed according to the number of cell division, the cell sizes, and the number of materials set in the structure-size-input dialog 420. At this stage, since the materials of the respective cells have not been set yet, the material number "1" as a provisional numerical value is set in all of the cells.

Although the numbers of cell division and the cell sizes in the X and Y directions are common to all of the layers in the first embodiment, the numbers of cell division and the cell sizes in the X and Y directions may be set individually for each layer.

When the input of the structure and the size is completed, the user inputs definitions in the material table 320 in the model-structure-definition input screen 300.

FIG. 11 is a diagram illustrating an example of the material table. The material table 320 includes material definition sections 321 to 325, where the number of the material definition sections corresponds to the number of materials set in the material-number input area 422 in the structure-size-input dialog 420. That is, the number of the material definition sections 321 to 325 is five.

The material definition section 321 includes a material-number indication field 321a, a material-name indication field 321b, and a plurality of characteristic indication fields 321c and 321d. The material-number indication field 321a indicates a material number assigned to the material definition section 321. The material-number indication field 321a also indicates a display manner of each cell to which the material is assigned. The material-name indication field 321b indicates a name of a material which is defined in the material definition section 321. The characteristic indication fields 321c and 321d respectively indicate values of physical properties which are preset. In the example of FIG. 11, the physical properties are the Young's modulus and the Poisson's ratio.

Just in the case of the material definition section 321, the other material definition sections 322 to 335 also include a material-number indication field, a material-name indication field, and a plurality of characteristic indication fields.

In the example of FIG. 11, the material numbers of the material definition sections 321 to 325 are "1", "2", "3", "4", and "5", respectively, and the material names of the material definition sections 321 to 325 are "MT1", "MT2", "MT3", "MT4", and "MT5", respectively.

Although the display manners for the different materials are indicated as different hatching manners, in practice, the cells of different materials are displayed in different colors. Alternatively, the cells of different materials may be displayed with different lightness, or different patterns.

When the user wishes to input various information in the material table 320, the user presses the material editing button 312. Then, an editing-of-material dialog is displayed.

Figure 12:
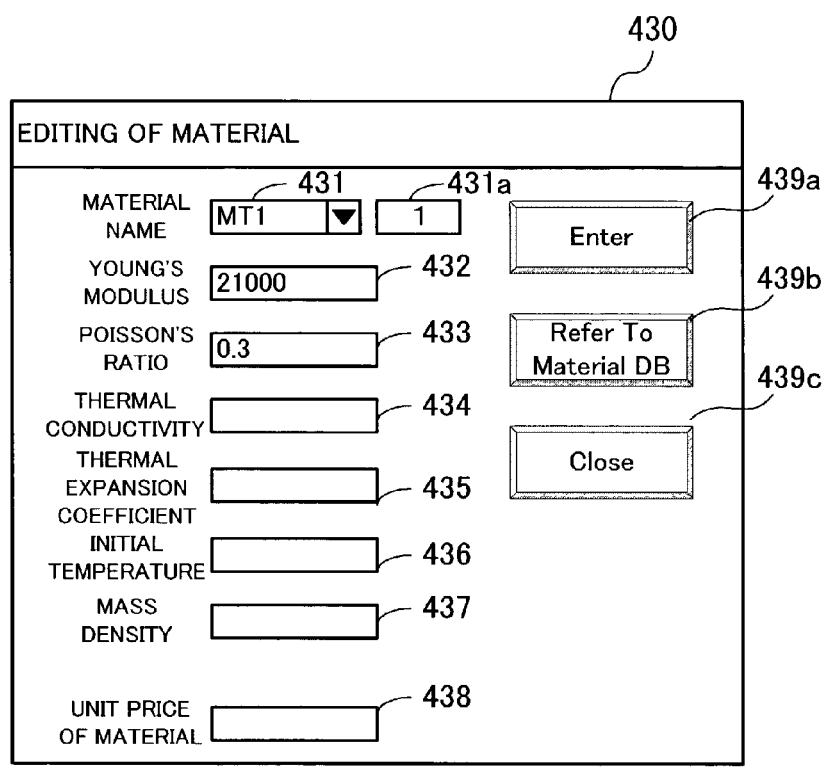
FIG. 12 is a diagram illustrating an example of an editing-of-material dialog.

FIG. 12 is a diagram illustrating an example of the editing-of-material dialog. The editing-of-material dialog 430 includes a material-name input area 431, a displayed-object designation area 431a, a Young's modulus input area 432, a Poisson's ratio input area 433, a thermal-conductivity input area 434, a thermal-expansion-coefficient input area 435, an initial-temperature input area 436, a mass-density input area 437, a material-unit-price input area 438, an Enter button 439a, a Refer To Material DB button 439b, and a Close button 439c.

The material-name input area 431 is a textbox provided for designating a material the physical properties of which are to be set. That is, the name of the material which is indicated in one of the material-name indication fields in the material table 320 is input in the material-name input area 431.

The displayed-object designation area 431a is a definition area provided for designating a display manner of the material the physical properties of which are to be set. That is, the material designated in the material-name input area 431 is displayed in the display manner set in the displayed-object designation area 431a. The user can set a display manner which can be easily discriminated from other display manners, in the displayed-object designation area 431a, where the display manner is, for example, a characteristic color or pattern.

The Young's modulus input area 432, the Poisson's ratio input area 433, the thermal-conductivity input area 434, the thermal-expansion-coefficient input area 435, the initial-temperature input area 436, the mass-density input area 437, and the material-unit-price input area 438 are textboxes provided for setting a Young's modulus, a Poisson's ratio, a thermal conductivity, a thermal expansion coefficient, an initial temperature, a mass density, and a unit price of the material designated in the material-name input area 431, respectively.

The Enter button 439a is a button provided for reflecting the contents of the editing-of-material dialog 430 in the material table 320. When the Enter button 439a is pressed, the values input in the characteristic input areas such as the Young's modulus input area 432 are set in one of the material definition sections 321 to 325 corresponding to the name of the material input in the material-name input area 431 in the editing-of-material dialog 430.

The Refer To Material DB button 439b is a button provided for acquiring material information from the material database 201. When the Refer To Material DB button 439b is pressed, a material-DB selection dialog is displayed, so that the user can refer to information on the materials registered in the material database 201.

The Close button 439c is a button provided for closing the editing-of-material dialog 430. When the Close button 439c is pressed, the editing-of-material dialog 430 is closed, and the operation goes back to the model-structure-definition input screen 300.

In the editing-of-material dialog 430, the user can directly input numerical values, or input physical property values by pressing the Refer To Material DB button 439b and referring to the material database 201. For example, when the user presses the Refer To Material DB button 439b, the material-DB selection dialog is displayed.

Figure 13:
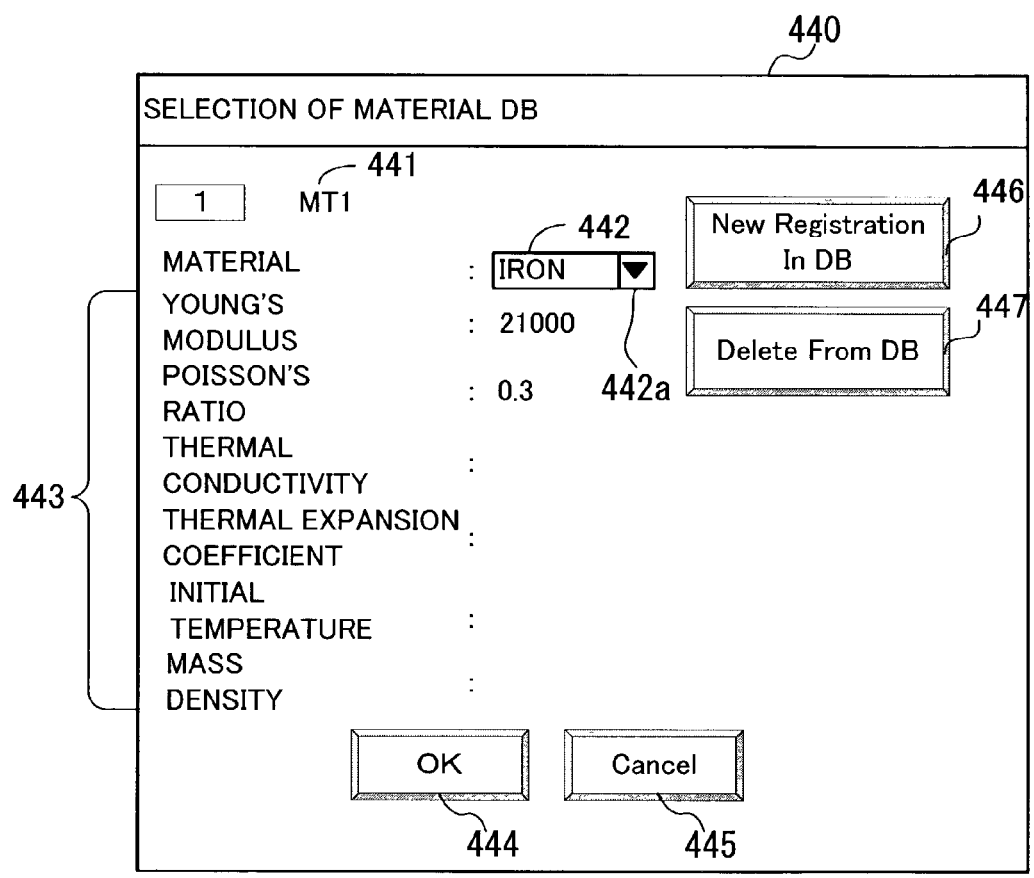
FIG. 13 is a diagram illustrating an example of a material-DB-selection dialog.

FIG. 13 is a diagram illustrating an example of the material-DB-selection dialog. The material-DB-selection dialog 440 includes a target-material-name indication area 441, a material selection area 442, a physical-property-value indication area 443, an OK button 444, a Cancel button 445, a New Registration button 446, and a Delete button 447.

In the target-material-name indication area 441, a name of a material corresponding to one of the material definition sections 321 to 325 the contents of which are to be set is indicated.

The material selection area 442 is an input area for selecting a material registered in the material database 201. The material selection area 442 includes an at-a-glance-indication button 442a. When the at-a-glance-indication button 442a is pressed, a list of materials registered in the material database 201 is indicated. When the user selects an arbitrary one of the materials in the list, information on the selected material is read out from the material database 201, and the name of the selected material is indicated in the material selection area 442. In the example of FIG. 13, material information on iron is read out.

In the physical-property-value indication area 443, physical properties values included in the material information read out from the material database 201 are indicated. In the example of FIG. 13, the Young's modulus of 21000 and the Poisson's ratio of 0.3 are indicated.

The OK button 444 is a button provided for setting in the material table 320 the material information indicated in the material-DB-selection dialog 440. When the OK button 444 is pressed, the material information read out from the material database 201 is set in the one of the material definition sections 321 to 325 corresponding to the name of the material indicated in the target-material-name indication area 441.

The Cancel button 445 is a button provided for closing the material-DB-selection dialog 440 without setting in the material table 320 the material information indicated in the material-DB-selection dialog 440. When the Cancel button 445 is pressed, the material-DB-selection dialog 440 is closed without setting of the material information, and the operation goes back to the model-structure-definition input screen 300.

The New Registration button 446, on which "New Registration In DB" is indicated, is a button provided for registering in the material database 201 material information indicated in the material-DB-selection dialog 440 as information on a new material. When the New Registration button 446 is pressed, a new material name is added to the material information read out into the material-DB-selection dialog 440, and the material information with the new material name is stored in the material database 201.

The Delete button 447, on which "Delete From DB" is indicated, is a button provided for deleting from the material database 201 material information indicated in the material-DB-selection dialog 440. When the Delete button 447 is pressed, the material information read out into the material-DB-selection dialog 440 is specified, and deleted from the material database 201.

In the material-DB-selection dialog 440 illustrated in FIG. 13, the user can acquire material information from the material database 201, and set the material information in the material table 320. When regions in which a structure of an object to be analyzed does not exist (e.g., hollows) are included in the model, a material representing space is set in a material definition section. At this time, the physical property values of the material corresponding to space are set to arbitrary values (e.g., all zero). When the space is filled with air, the physical property values of the air (e.g., the thermal conductivity value of the air) may be set.

When the setting of material information in the material definition sections 321 to 325 is completed, the user defines a vertical cross-sectional structure by using the vertical-cross-sectional-structure table 330.

Figure 14:
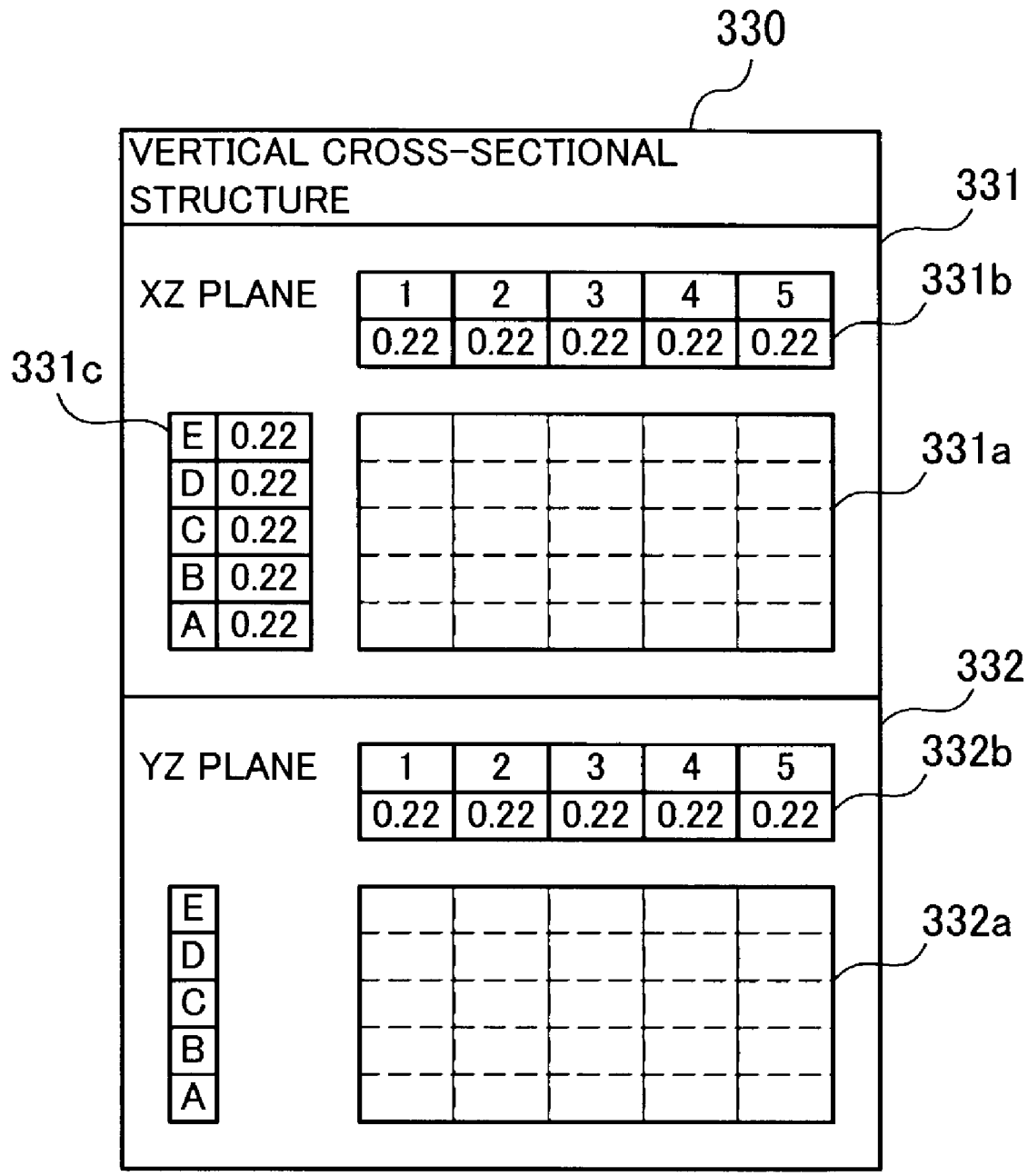
FIG. 14 is a diagram illustrating an example of a vertical-cross-sectional-structure table.

FIG. 14 is a diagram illustrating an example of the vertical-cross-sectional-structure table. The vertical-cross-sectional-structure table 330 includes an XZ-plane-cross-sectional-structure indication area 331 and a YZ-plane-cross-sectional-structure indication area 332.

The XZ-plane cross-sectional-structure indication area 331 includes an XZ-plane cross-sectional structure table 331a, an X-direction-cell-size input area 331b, and a Z-direction-cell-size input area 331c.

The XZ-plane cross-sectional structure table 331a indicates a cross-sectional structure of the entire-structure model in a plane which is parallel to the XZ plane and located at a predetermined position. The cross-sectional structure is indicated in a form divided into a plurality of fields corresponding to a plurality of cells, and a material number of each cell is indicated in the corresponding field. In addition, each field is displayed in a display manner which is defined for the material of the cell.

The X-direction-cell-size input area 331b includes a plurality of textboxes provided for inputting the cell sizes in the X direction. The number of the plurality of textboxes in the X-direction-cell-size input area 331b corresponds to the number of cell division in the X-direction. The default cell sizes defined in advance in the structure-size-input dialog 420 are set in the respective textboxes in the X-direction-cell-size input area 331b. The user can change the cell sizes in the X direction by changing the values in the respective textboxes in the X-direction-cell-size input area 331b.

The Z-direction-cell-size input area 331c includes a plurality of pairs of subareas, where the number of the pairs corresponds to the number of cell division in the Z direction, the first subarea in each pair is provided for selecting a material arrangement pattern, and the second subarea in each pair is a textbox for inputting a cell size.

In each first subarea, a material arrangement pattern to be set in the layer is designated with a pattern name in the horizontal-cross-sectional-structure table. It is possible to designate an identical pattern in more than one layer.

In the textbox in each second subarea, the default cell size defined in advance in the structure-size-input dialog 420 is set. The user can change the cell sizes in the Z direction by changing the values in the respective textboxes in the Z-direction-cell-size input area 331c. The user sets each cell size in the Z direction to the thickness of the corresponding layer of the LSI.

The YZ-plane-cross-sectional-structure indication area 332 includes a YZ-plane cross-sectional structure table 332a and a Y-direction-cell-size input area 332b.

The YZ-plane cross-sectional structure table 332a indicates a cross-sectional structure of the entire-structure model in a plane which is parallel to the YZ plane and located in a predetermined position. The cross-sectional structure is indicated in a form divided into a plurality of fields corresponding to a plurality of cells, and a material number of each cell is indicated in the corresponding field. In addition, each field is displayed in a display manner which is defined for the material of the cell.

The Y-direction-cell-size input area 332b includes a plurality of textboxes provided for inputting the cell sizes in the Y direction. The number of the plurality of textboxes in the Y-direction-cell-size input area 332b corresponds to the number of cell division in the Y-direction. The default cell sizes defined in advance in the structure-size-input dialog 420 are set in the respective textboxes in the Y-direction-cell-size input area 332b. The user can change the cell sizes in the Y direction by changing the values in the respective textboxes in the Y-direction-cell-size input area 332b.

After the user defines the cell sizes by inputting appropriate values in the vertical-cross-sectional-structure table 330, the user defines a horizontal cross-sectional structure by using the horizontal-cross-sectional-structure table 340.

Figure 15:
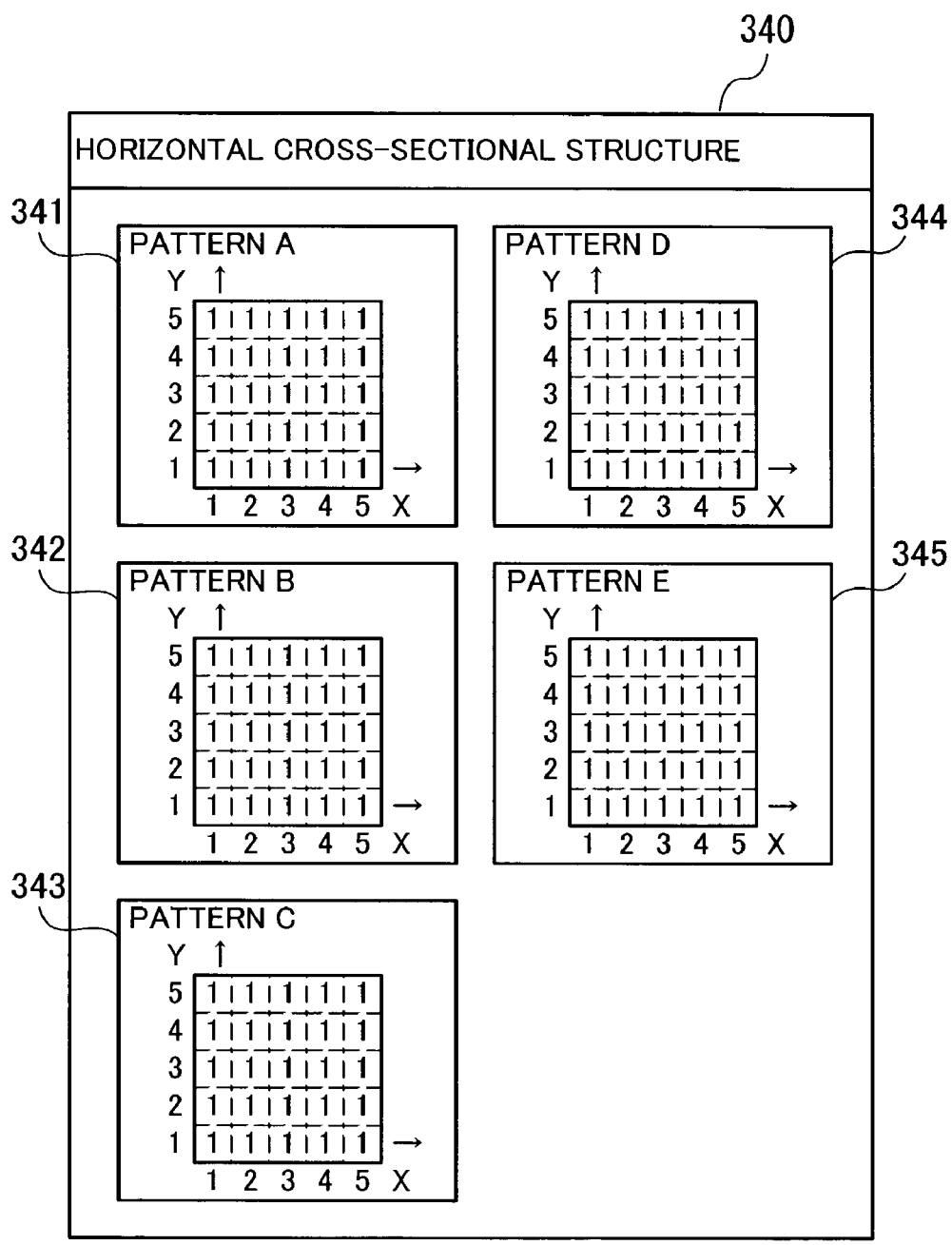
FIG. 15 is a diagram illustrating an example of a horizontal-cross-sectional-structure table.

FIG. 15 is a diagram illustrating an example of the horizontal-cross-sectional-structure table. The horizontal-cross-sectional-structure table 340 includes an XY-plane cross-sectional-structure tables 341 to 345 corresponding to the respective layers. In each of the XY-plane cross-sectional-structure tables 341 to 345 displayed in the horizontal-cross-sectional-structure table 340, a plurality of fields corresponding to a plurality of cells are displayed in a matrix arrangement. In the example of FIG. 15, the XY-plane cross-sectional-structure tables 341 to 345, which correspond to the bottom to top layers, are respectively named "Pattern A", "Pattern B", "Pattern C", "Pattern D", and "Pattern E", and an identical initial value "1" is set in all of the fields in the XY-plane cross-sectional-structure tables 341 to 345.

The user can arrange materials in each layer by inputting a material number in each field of the XY-plane cross-sectional-structure tables 341 to 345.

Alternatively, the material arrangement pattern in an arbitrary layer can be defined by overwriting a portion of the material arrangement pattern of an arbitrary layer with a new material arrangement pattern. For example, it is possible to reduce man-hours needed for design work by assigning a material which is frequently used, to a wide area, and then replacing the frequently used material in a portion of the wide area with another material.

Figure 16:
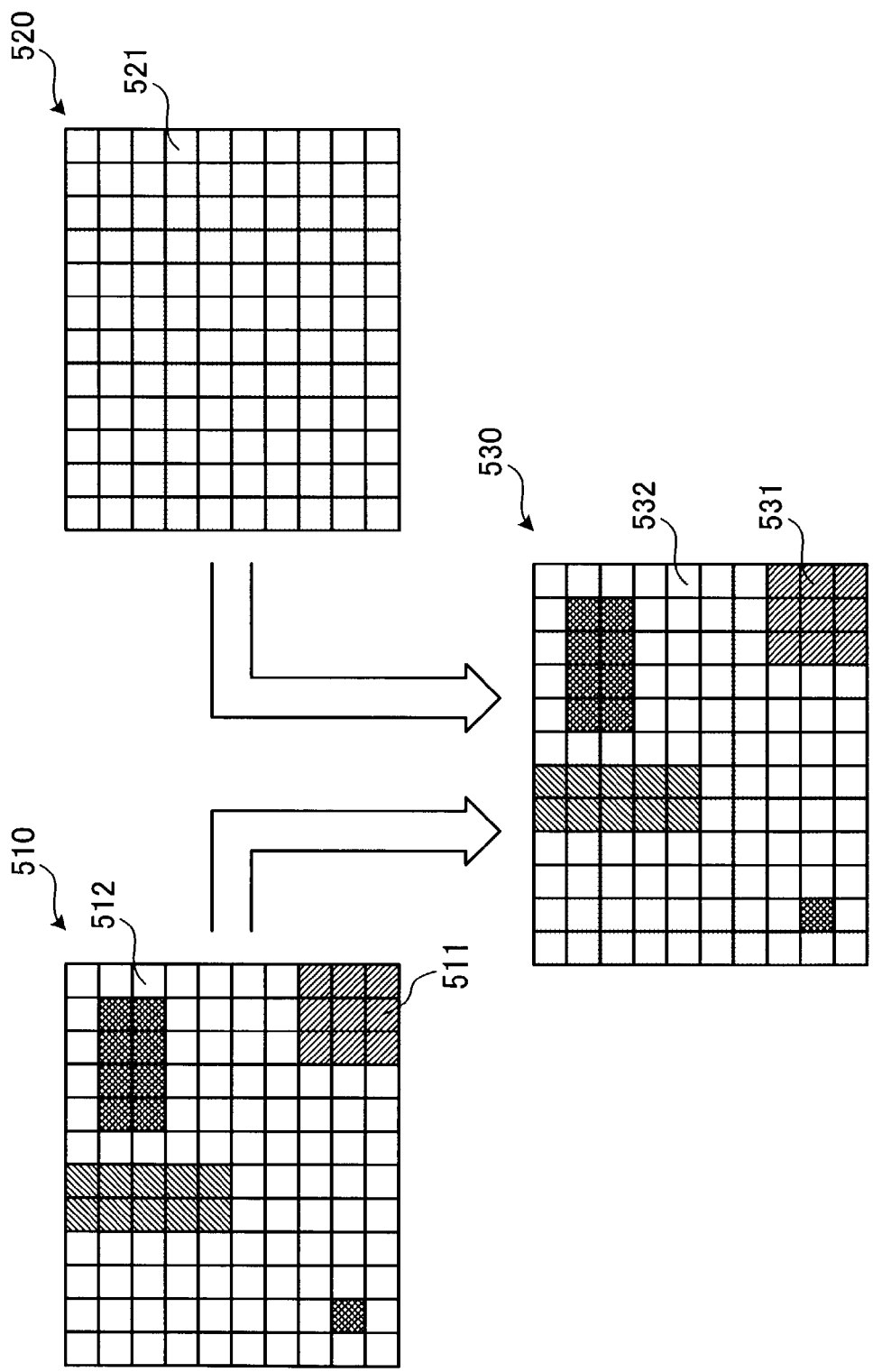
FIG. 16 is a diagram illustrating an example of superimposition of material arrangement patterns.

FIG. 16 is a diagram illustrating an example of superimposition of material arrangement patterns. As illustrated in FIG. 16, a microstructure such as internal wiring is defined in advance as a first material arrangement subpattern 510 in an arbitrary one of the XY-plane cross-sectional-structure tables 341 to 345. In the first material arrangement subpattern 510, materials are defined in only the hatched or crosshatched regions 511, and no material is defined in the other regions 512. On the other hand, a second material arrangement subpattern 520 is also defined in advance, a material which is frequently used is defined in the entire second material arrangement subpattern 521. Then, a material arrangement pattern 530 is defined by superimposing the first material arrangement subpattern 510 on the second material arrangement subpattern 520. Thus, the materials defined in only the hatched or crosshatched regions 512 are assigned to regions 531 of the material arrangement pattern 530 corresponding to the hatched or crosshatched regions 511 of the first material arrangement subpattern 510, and the frequently used material is assigned to the other regions of the material arrangement pattern 530.

For example, the first material arrangement subpattern 510 can be defined by specifying arbitrary regions of one of the XY-plane cross-sectional-structure tables 341 to 345. In this case, the specified regions of the one of the XY-plane cross-sectional-structure tables 341 to 345 are recognized as the regions 511 of the first material arrangement subpattern 510, and the unspecified regions of the one of the XY-plane cross-sectional-structure tables 341 to 345 are recognized as the regions 512 in the first material arrangement subpattern 510.

The structure of the entire-structure model can be defined by the manipulation inputs as explained above. When the input for defining the structure is completed, the user can fix the definition of the structure by pressing the Enter button 313 in the model-structure-definition input screen 300. When the definition of the structure is fixed, the contents of the vertical-cross-sectional-structure table 330, the horizontal-cross-sectional-structure table 340, and the like can be updated with the fixed definition of the structure. For example, when the cells the materials of which are changed in the horizontal-cross-sectional-structure table 340 are also indicated in the vertical-cross-sectional-structure table 330, the display manners of the cells in the vertical-cross-sectional-structure table 330 are changed in response to the pressing of the Enter button 313, and the changed contents are held as the layer-based material-arrangement-pattern data 211.

In addition, when the user presses the Data Output button 314 in the model-structure-definition input screen 300, processing for conversion to a three-dimensional model is performed based on the layer-based material-arrangement-pattern data 211, and thus the three-dimensional-shape data 212 of the entire-structure-model is generated.

Figure 17:
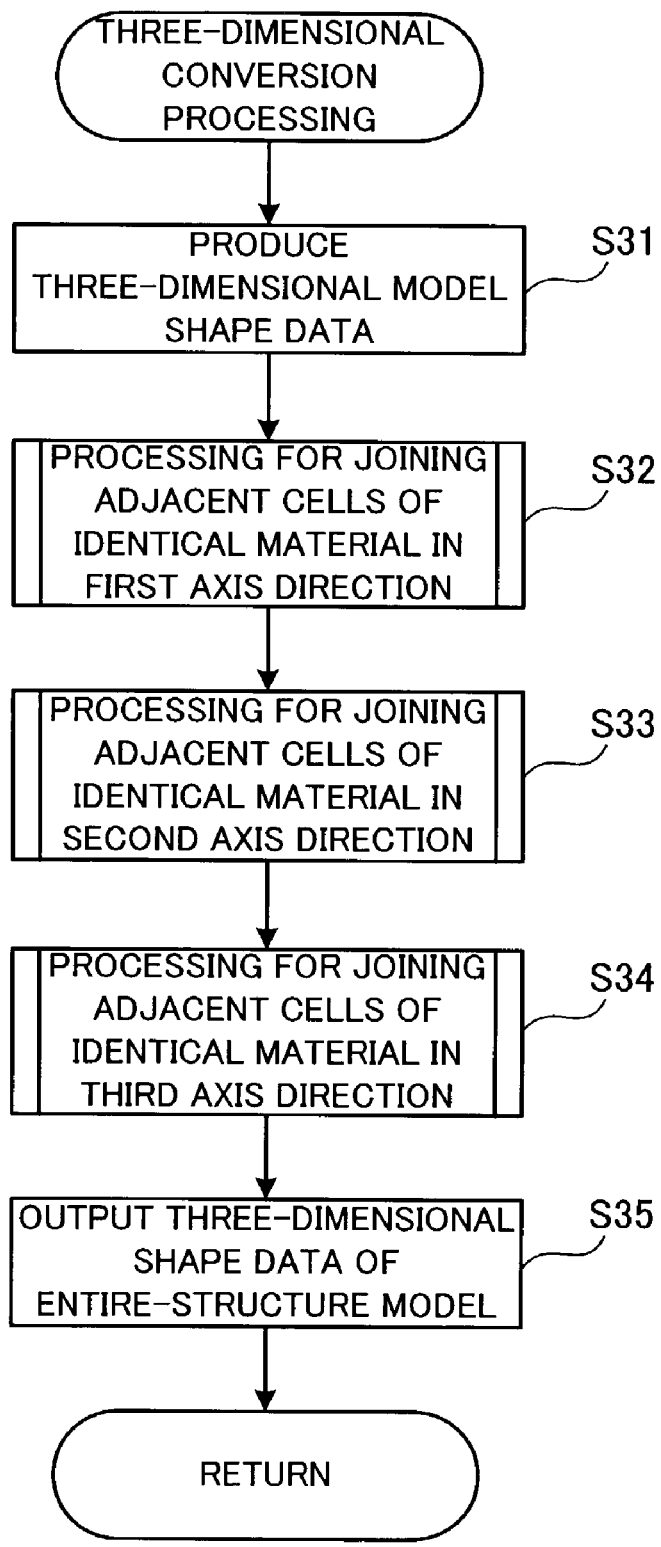
FIG. 17 is a flowchart illustrating a sequence of three-dimensional conversion processing.

FIG. 17 is a flowchart illustrating a sequence of the three-dimensional conversion processing. The sequence is explained below step by step.

[Step S31] The three-dimensional conversion unit 206 generates a three-dimensional model-shape data which is divided into uniform cells, based on the layer-based material-arrangement-pattern data 211. Hereinafter, such three-dimensional model-shape data is referred to as three-dimensional-model-shape intermediate data. That is, the three-dimensional conversion unit 206 makes each cell three-dimensional by adding the thickness designated for the corresponding layer to the cell in the layer-based material-arrangement-pattern data 211. Then, the three-dimensional conversion unit 206 generates the three-dimensional-model-shape intermediate data by stacking sets of the three-dimensional cells constituting the respective layers.

[Step S32] The three-dimensional conversion unit 206 determines first, second, and third axes in the directions in which the greatest, the second greatest, and the smallest numbers of cells are arrayed, respectively. Then, the three-dimensional conversion unit 206 joins successive cells of an identical material arrayed in the direction of the first axis.

[Step S33] The three-dimensional conversion unit 206 joins adjacent cells of an identical material arrayed in the direction of the second axis. At this time, the three-dimensional conversion unit 206 joins the adjacent cells only when faces of the adjacent cells at which the adjacent cells abut coincide. Thus, a cell produced by the joining also has a rectangular parallelepiped shape.

[Step S34] The three-dimensional conversion unit 206 joins adjacent cells of an identical material arrayed in the direction of the third axis. At this time, the three-dimensional conversion unit 206 joins the adjacent cells only when faces of the adjacent cells at which the adjacent cells abut coincide. Thus, a cell produced by the joining also has a rectangular parallelepiped shape.

[Step S35] The three-dimensional conversion unit 206 outputs the layer-based material-arrangement-pattern data 211, and the operation goes to step S13 in FIG. 6.

Figure 18:
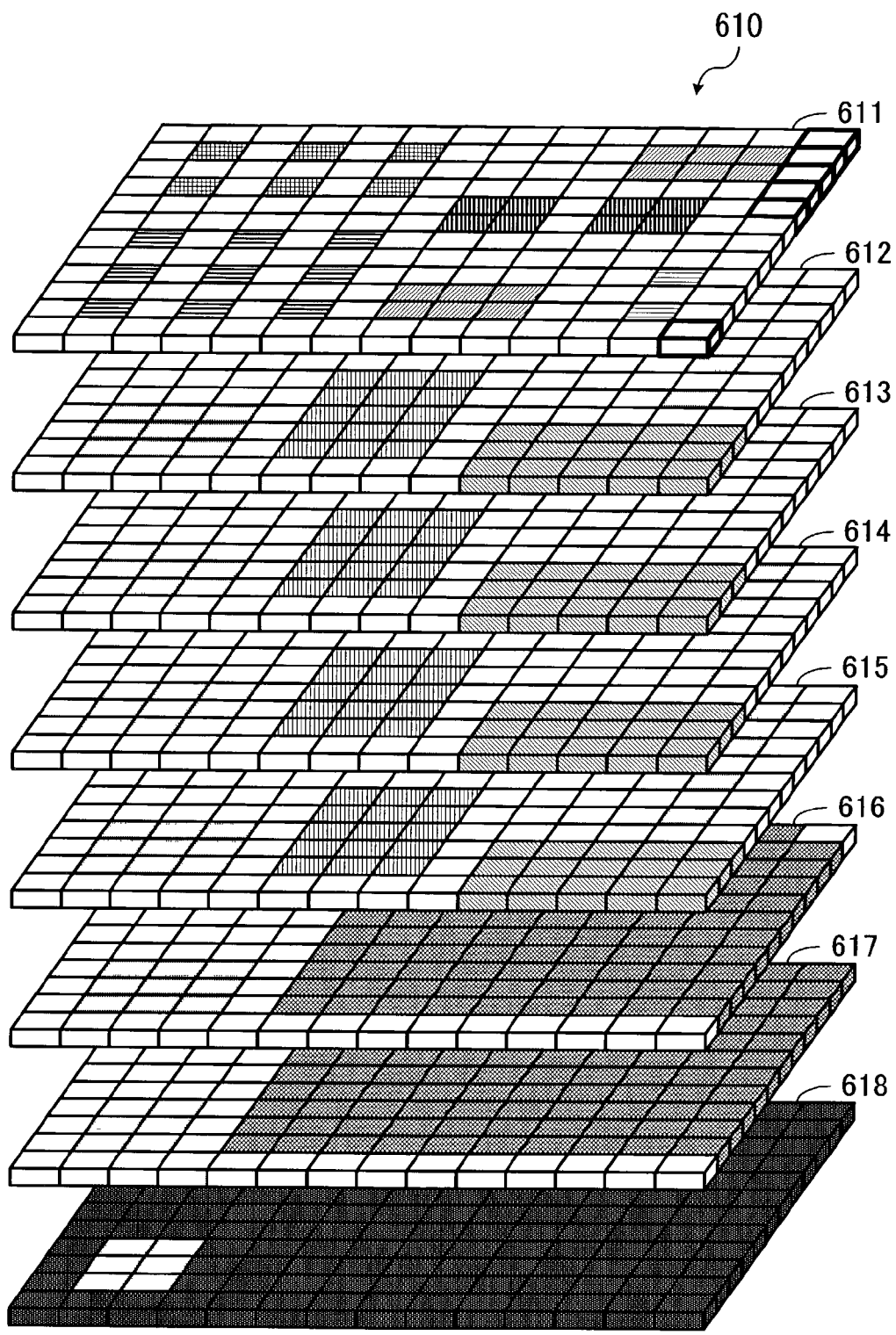
FIG. 18 is a diagram illustrating three-dimensional-model-shape intermediate data.

FIG. 18 is a diagram illustrating three-dimensional-model-shape intermediate data. As illustrated in FIG. 18, in the three-dimensional-model-shape intermediate data 610 which is divided into a plurality of cells, each of the layers 611 to 618 is constituted by a plurality of cells. The data of the geometrical shape of a cell is defined by coordinates of eight vertexes in a three-dimensional space. In addition, the display manners of cell faces are determined according to the material numbers assigned to the respective cells. That is, the color, pattern, or the like of the respective faces of each cell is identical to that defined for the cell in the layer-based material-arrangement-pattern data 211. Thus, the three-dimensional-model-shape intermediate data 610 is constituted by data of geometrical shapes of the plurality of cells.

The three-dimensional model-shape data is produced by performing the cell joining processing on the three-dimensional-model-shape intermediate data 610.

It is assumed that the three-dimensional conversion unit 206 defines the greatest, the second greatest, and the smallest numbers of cells in the X, Y, and Z directions as a, b, and c, respectively, and the axes corresponding to the numbers a, b, and c as the first, second, and third axes, respectively. In addition, the position of each three-dimensional cell is defined as (i,j,k), where $1 \leq i \leq a$, $1 \leq j \leq b$, $1 \leq k \leq c$, i is an integer indicating the ordinal position in the direction of the first axis, j is an integer indicating the ordinal position in the direction of the second axis, and k is an integer indicating the ordinal position in the direction of the third axis.

Figure 19:
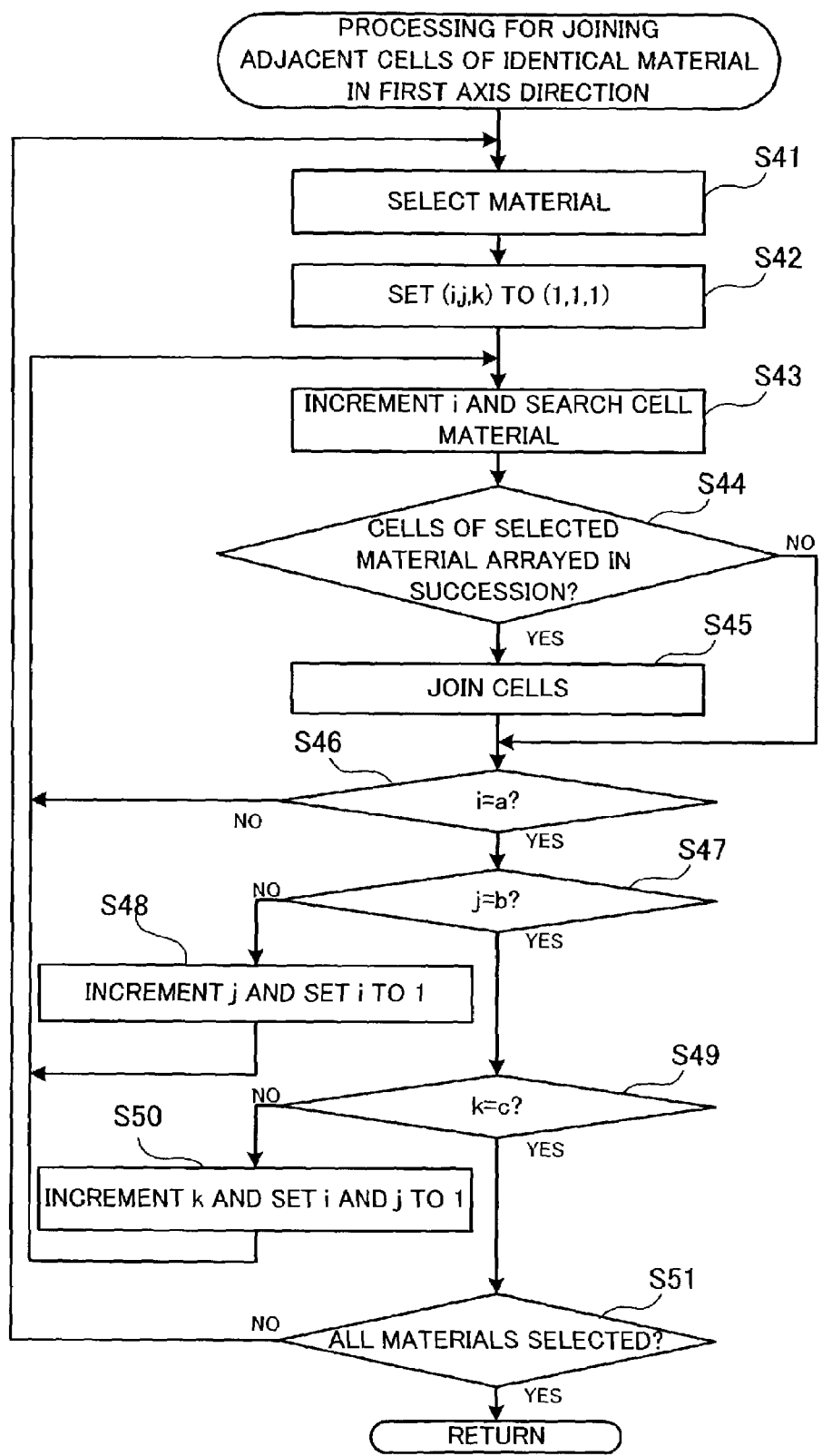
FIG. 19 is a flowchart illustrating processing for joining of adjacent cells of an identical material arrayed in the direction of a first axis.
Figure 20:
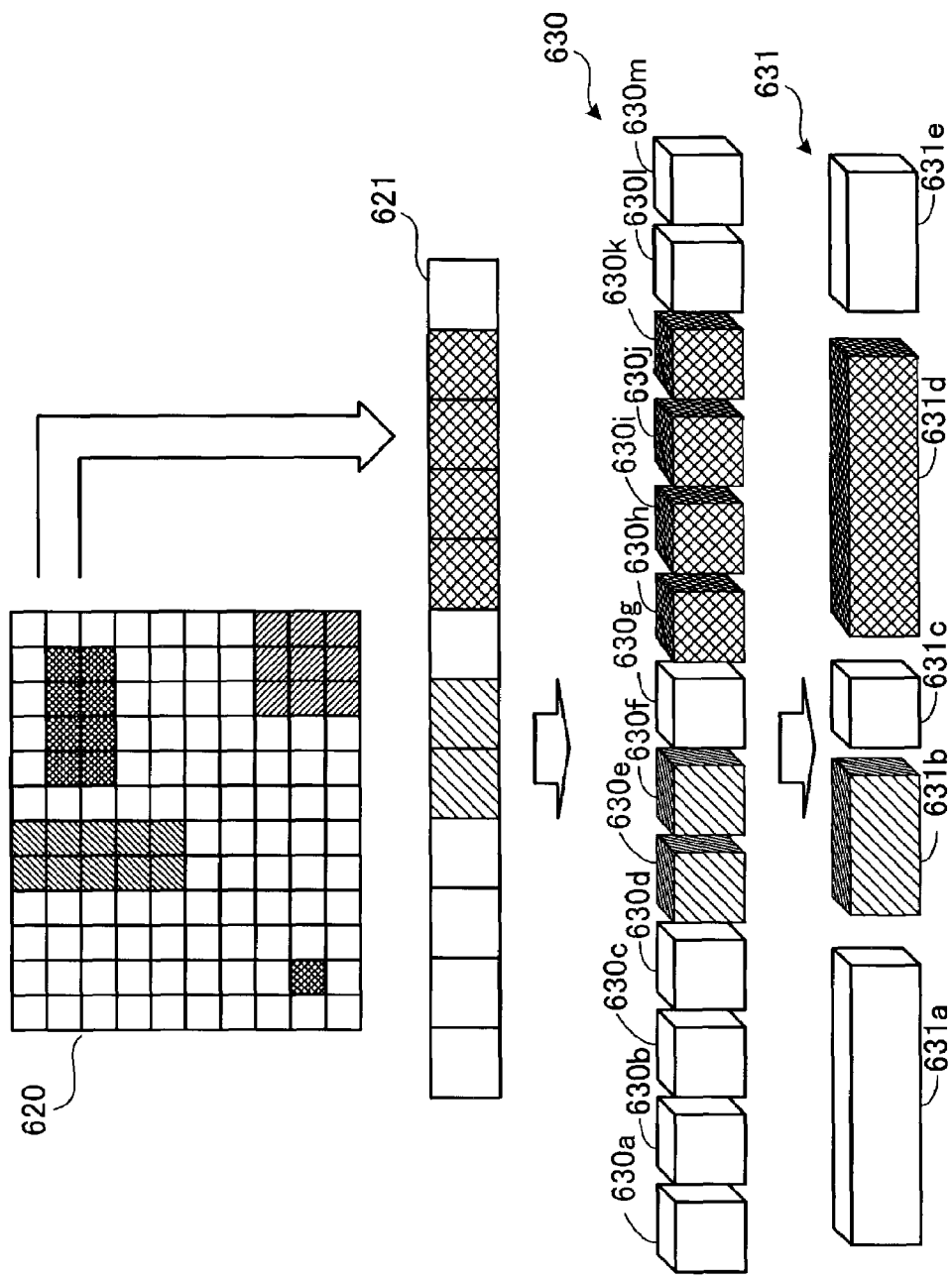
FIG. 20 is a diagram illustrating an example of joining of cells in the direction of the first axis.
Figure 21:
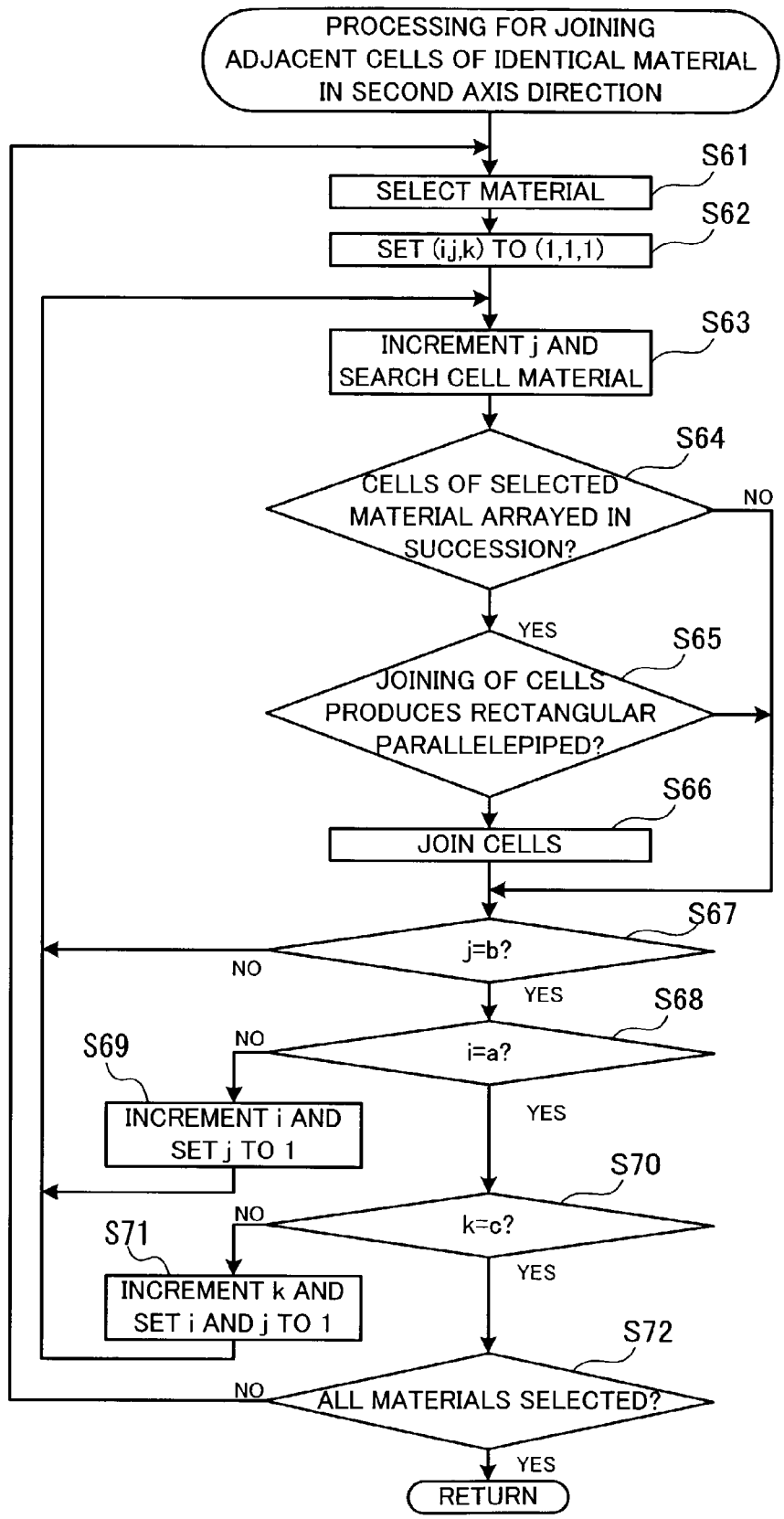
FIG. 21 is a flowchart illustrating processing for joining of adjacent cells of an identical material arrayed in the direction of a second axis.

Based on the above premise, the cell joining processing illustrated in FIGS. 19 to 21 is performed.

FIG. 19 is a flowchart illustrating processing for joining of adjacent cells of an identical material arrayed in the direction of a first axis. The processing is explained below step by step.

[Step S41] The three-dimensional conversion unit 206 selects a material, and outputs values of physical properties (such as the Young's modulus and the Poisson's ratio) of the material.

[Step S42] The three-dimensional conversion unit 206 sets (i,j,k) to (1,1,1).

[Step S43] The three-dimensional conversion unit 206 searches for the material selected in step S41 in the direction of the first axis (in which the number a of cells are arrayed). That is, the three-dimensional conversion unit 206 progressively increases the value of i from 1, and checks the material of a cell corresponding to each value of i.

[Step S44] The three-dimensional conversion unit 206 determines whether or not successive cells of the material selected in step S41 exist. When yes is determined, the operation goes to step S45. When no is determined, the operation goes to step S46.

[Step S45] The three-dimensional conversion unit 206 joins the successive cells of the selected material. Specifically, when the three-dimensional conversion unit 206 detects successive cells of the selected material, the three-dimensional conversion unit 206 integrates the successive cells into a rectangular parallelepiped, and outputs coordinates of eight vertexes of the rectangular parallelepiped, instead of data of the detected cells. At this time, the position of the cell produced by the joining is represented by the position of one of the joined cells corresponding to the smallest value of i.

[Step S46] The three-dimensional conversion unit 206 determines whether or not i=a. When yes is determined, the operation goes to step S47. When no is determined, the operation goes to step S43.

[Step S47] The three-dimensional conversion unit 206 determines whether or not j=b. When yes is determined, the operation goes to step S49. When no is determined, the operation goes to step S48.

[Step S48] The three-dimensional conversion unit 206 increments j by one, and sets i to 1. Then, the operation goes to step S43.

[Step S49] The three-dimensional conversion unit 206 determines whether or not k=c. When yes is determined, the operation goes to step S51. When no is determined, the operation goes to step S50.

[Step S50] The three-dimensional conversion unit 206 increments k by one, and sets i and j to 1. Then, the operation goes to step S43.

[Step S51] The three-dimensional conversion unit 206 determines whether or not the processing in steps S41 to S50 for all of the materials included in the three-dimensional-model-shape intermediate data 610 is completed. When yes is determined, the operation goes to step S33 in FIG. 17. When no is determined, the operation goes to step S41.

FIG. 20 is a diagram illustrating an example of joining of cells in the direction of the first axis. In the material arrangement pattern 620 illustrated in FIG. 20, the number of cells arrayed in the lateral direction is greater than the number of cells arrayed in the longitudinal direction. Therefore, the processing for detection of successive cells of an identical material is performed in the lateral direction. For example, a cell series 621, which extends in the lateral direction in the material arrangement pattern 620 can be represented by a three-dimensional model series 630, which is a set of rectangular parallelepiped cells 630*a* to 630*m*. The set of cells 630*a* to 630*m* are converted into a three-dimensional model series 631 by joining successive cells of an identical material in the set of cells 630*a* to 630*m*. That is, the cells 630*a* to 630*d* are joined together to form a cell 631*a* since an identical material is assigned to the cells 630*a* to 630*d*, and the cells 630*e* and 630*f* are joined together to form a cell 631*b* since an identical material is assigned to the cells 630*e* and 630*f*. The cell 630*g* per se becomes a cell 631*c* since the cell 630*g* is not followed by a cell made of the same material as the cell 630*g*. The cells 630*h* to 630*k* are joined together to form a cell 631*d* since an identical material is assigned to the cells 630*h* to 630*k*, and the cells 630*l* and 630*m* are joined together to form a cell 631*e* since an identical material is assigned to the cells 630*l* and 630*m*. Thus, the successive cells of an identical material arrayed in the direction of the first axis are joined.

FIG. 21 is a flowchart illustrating processing for joining of adjacent cells of an identical material arrayed in the direction of a second axis. The processing is explained below step by step.

[Step S61] The three-dimensional conversion unit 206 selects a material, and outputs values of physical properties (such as Young's modulus and Poisson's ratio) of the material.

[Step S62] The three-dimensional conversion unit 206 sets (i,j,k) to (1,1,1).

[Step S63] The three-dimensional conversion unit 206 searches for the material selected in step S61 in the direction of the second axis (in which the number b of cells are arrayed). That is, the three-dimensional conversion unit 206 progressively increases the value of j from 1, and checks the material of a cell corresponding to each value of j.

[Step S64] The three-dimensional conversion unit 206 determines whether or not successive cells of the material selected in step S61 exist. When yes is determined, the operation goes to step S65. When no is determined, the operation goes to step S67.

[Step S65] The three-dimensional conversion unit 206 determines whether or not a cell produced by the joining has a rectangular parallelepiped shape. In order that the cell produced by the joining has a rectangular parallelepiped shape, faces (perpendicular to the second axis) of adjacent ones of the successive cells at which the adjacent ones of the successive cells abut must coincide. When yes is determined, the operation goes to step S66. When no is determined, the operation goes to step S67.

[Step S66] The three-dimensional conversion unit 206 joins the successive cells of the selected material. Specifically, when the three-dimensional conversion unit 206 detects successive cells of the selected material, the three-dimensional conversion unit 206 integrates the successive cells into a rectangular parallelepiped, and outputs coordinates of eight vertexes of the rectangular parallelepiped, instead of data of the detected cells. At this time, the position of the cell produced by the joining is represented by the position of one of the joined cells corresponding to the smallest value of j.

[Step S67] The three-dimensional conversion unit 206 determines whether or not j=b. When yes is determined, the operation goes to step S68. When no is determined, the operation goes to step S63.

[Step S68] The three-dimensional conversion unit 206 determines whether or not i=a. When yes is determined, the operation goes to step S70. When no is determined, the operation goes to step S69.

[Step S69] The three-dimensional conversion unit 206 increments i by one, and sets j to 1. Then, the operation goes to step S63.

[Step S70] The three-dimensional conversion unit 206 determines whether or not k=c. When yes is determined, the operation goes to step S72. When no is determined, the operation goes to step S71.

[Step S71] The three-dimensional conversion unit 206 increments k by one, and sets i and j to 1. Then, the operation goes to step S63.

[Step S72] The three-dimensional conversion unit 206 determines whether or not the processing in steps S61 to S71 for all of the materials included in the three-dimensional-model-shape intermediate data 610 is completed. When yes is determined, the operation goes to step S34 in FIG. 17. When no is determined, the operation goes to step S61.

Figure 22:
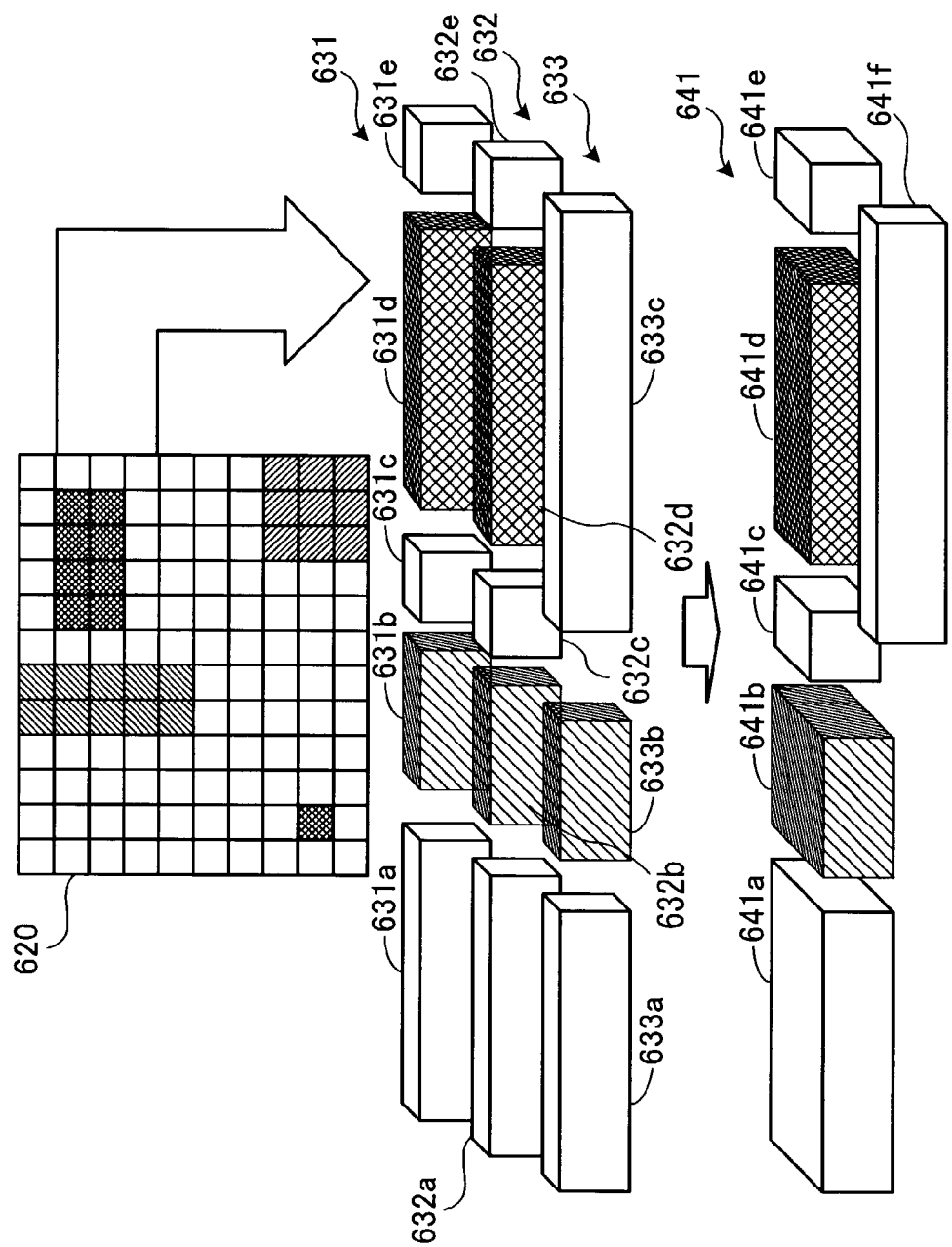
FIG. 22 is a diagram illustrating an example of joining of cells in the direction of the second axis.

FIG. 22 is a diagram illustrating an example of joining of cells in the direction of the second axis. For the purpose of explanation, attention is focused on three cell series which are included in a material arrangement pattern 620 of a layer and extend in the lateral direction.

When joining of the cells in each of the three cell series in the direction of the first axis is performed, three-dimensional model series 631 to 633 are generated corresponding to the three cell series, respectively. The three-dimensional model series 631 is constituted by five cells 631a to 631e, the three-dimensional model series 632 is constituted by five cells 632a to 632e, and the three-dimensional model series 633 is constituted by three cells 633a to 633c.

Then, cells of an identical material arrayed in the direction of the second axis (the longitudinal direction in the material arrangement pattern 620) are joined. At this time, the joining is performed only when a cell produced by the joining has a rectangular parallelepiped shape. Thus, a three-dimensional model group 641 is produced from the three-dimensional model series 631 to 633. Specifically, the cells 631a, 632a, and 633a are joined together to form a cell 641a since an identical material is assigned to the cells 631a, 632a, and 633a, the cells 631b, 632b, and 633b are joined together to form a cell 641b since an identical material is assigned to the cells 631b, 632b, and 633b, the cells 631c and 632c are joined together to form a cell 641c since an identical material is assigned to the cells 631c and 632c, the cells 631d and 632d are joined together to form a cell 641d since an identical material is assigned to the cells 631d and 632d, and the cells 631e and 632e are joined together to form a cell 641e since an identical material is assigned to the cells 631e and 632e.

Although the cell 633c is adjacent to the cells 632c and 632e to which the same material as the cell 633c is assigned, a cell produced by joining the cell 633c to the cells 632c and 632e is not a rectangular parallelepiped. Therefore, the cell 633c is not joined to the cells 632c and 632e, and the cell 633c per se becomes a cell 641f.

As explained above, the adjacent cells of an identical material arrayed in the direction of the second axis are joined.

Figure 23:
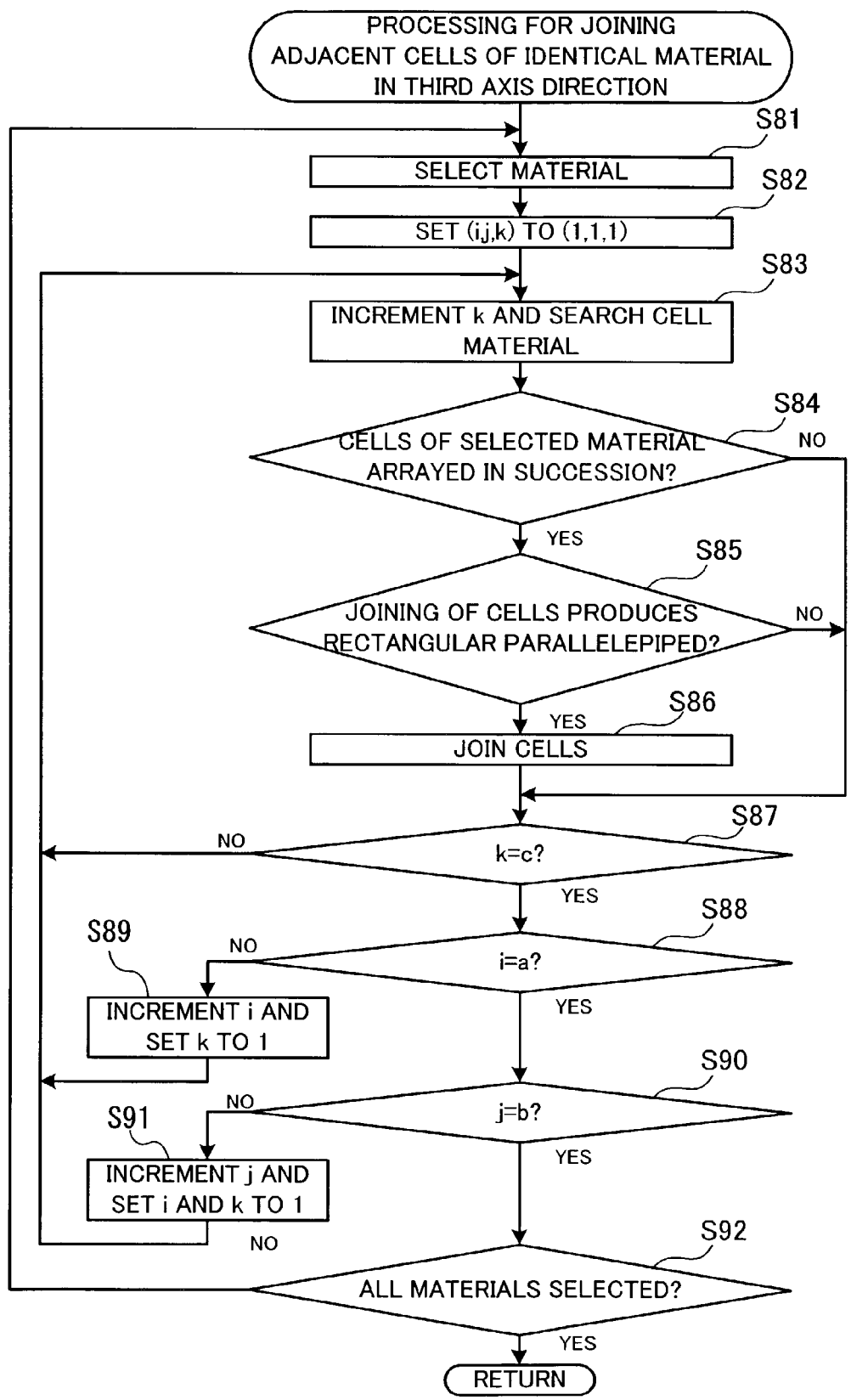
FIG. 23 is a flowchart illustrating processing for joining of adjacent cells of an identical material arrayed in the direction of a third axis.

FIG. 23 is a flowchart illustrating processing for joining of adjacent cells of an identical material arrayed in the direction of a third axis. The processing is explained below step by step.

[Step S81] The three-dimensional conversion unit 206 selects a material, and outputs values of physical properties (such as the Young's modulus and the Poisson's ratio) of the material.

[Step S82] The three-dimensional conversion unit 206 sets (i,j,k) to (1,1,1).

[Step S83] The three-dimensional conversion unit 206 searches for the material selected in step S81 in the direction of the third axis (in which the number c of cells are arrayed). That is, the three-dimensional conversion unit 206 progressively increases the value of k from 1, and checks the material of a cell corresponding to each value of k.

[Step S84] The three-dimensional conversion unit 206 determines whether or not successive cells of the material selected in step S81 exist. When yes is determined, the operation goes to step S85. When no is determined, the operation goes to step S87.

[Step S85] The three-dimensional conversion unit 206 determines whether or not a cell produced by the joining has a rectangular parallelepiped shape. In order that the cell produced by the joining has a rectangular parallelepiped shape, faces (perpendicular to the third axis) of adjacent ones of the successive cells at which the adjacent ones of the successive cells abut must coincide. When yes is determined, the operation goes to step S86. When no is determined, the operation goes to step S87.

[Step S86] The three-dimensional conversion unit 206 joins the successive cells of the selected material. Specifically, when the three-dimensional conversion unit 206 detects successive cells of the selected material, the three-dimensional conversion unit 206 integrates the successive cells into a rectangular parallelepiped, and outputs coordinates of eight vertexes of the rectangular parallelepiped, instead of data of the detected cells. At this time, the position of the cell produced by the joining is represented by the position of one of the joined cells corresponding to the smallest value of k.

[Step S87] The three-dimensional conversion unit 206 determines whether or not k=c. When yes is determined, the operation goes to step S88. When no is determined, the operation goes to step S83.

[Step S88] The three-dimensional conversion unit 206 determines whether or not i=a. When yes is determined, the operation goes to step S90. When no is determined, the operation goes to step S89.

[Step S89] The three-dimensional conversion unit 206 increments i by one, and sets k to 1. Then, the operation goes to step S83.

[Step S90] The three-dimensional conversion unit 206 determines whether or not j=b. When yes is determined, the operation goes to step S92. When no is determined, the operation goes to step S91.

[Step S91] The three-dimensional conversion unit 206 increments j by one, and sets i and k to 1. Then, the operation goes to step S83.

[Step S92] The three-dimensional conversion unit 206 determines whether or not the processing in steps S81 to S91 for all of the materials included in the three-dimensional-model-shape intermediate data 610 is completed. When yes is determined, the operation goes to step S35 in FIG. 17. When no is determined, the operation goes to step S81.

Figure 24:
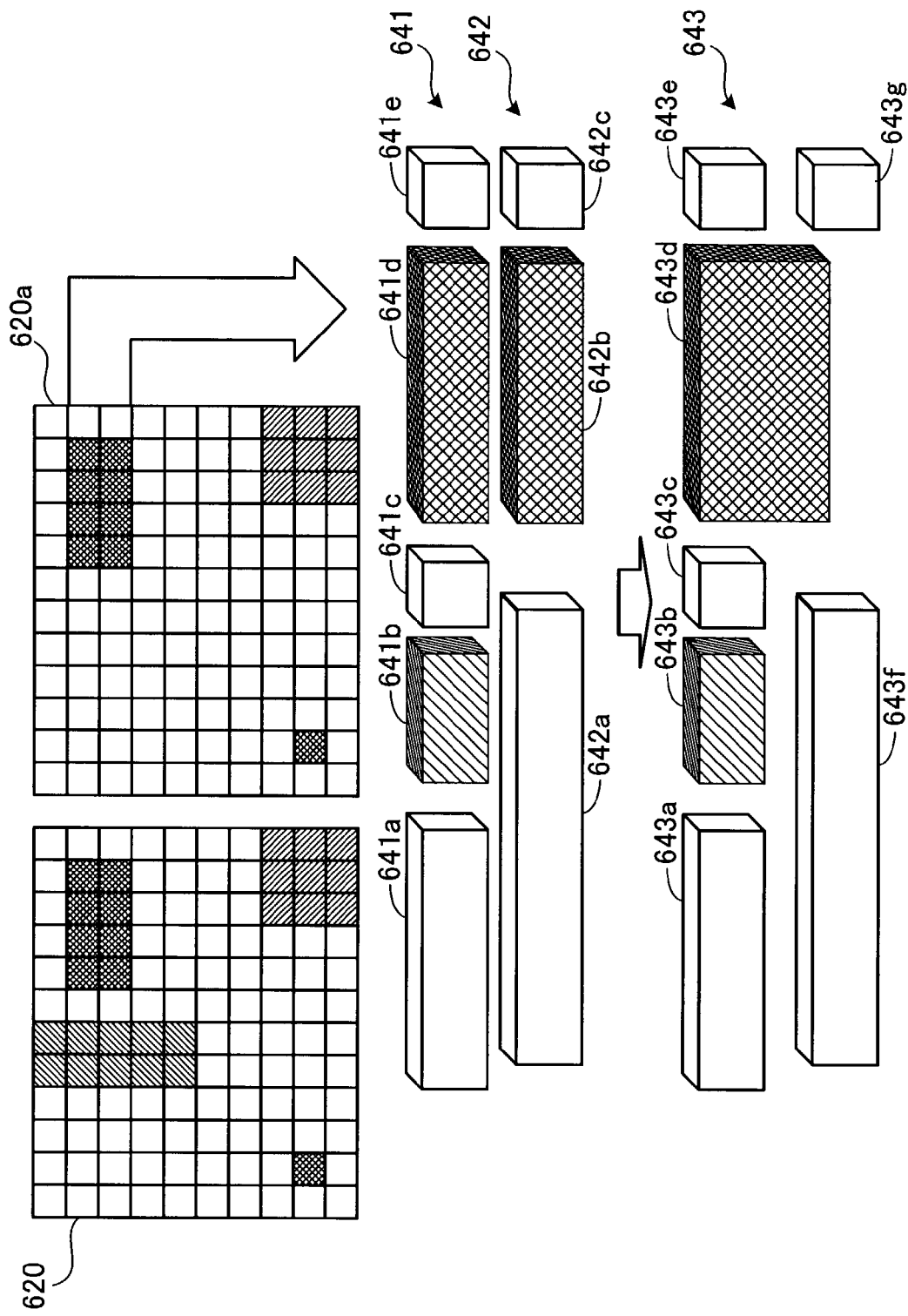
FIG. 24 is a diagram illustrating an example of joining of cells in the direction of the third axis.

FIG. 24 is a diagram illustrating an example of joining of cells in the direction of the third axis. For the purpose of explanation, attention is focused on cell series extending in the lateral direction in material arrangement patterns 620 and 620a of adjacent layers stacked in the vertical direction. When joining processing is performed on the cell series in the lateral and longitudinal directions, cell groups 641 and 642 are produced. The cell group 641 includes cells 641a to 641e, and the cell group 642 includes cells 642a to 642c.

Although differences in the depth dimensions of the respective cells are not indicated in FIG. 24, in practice, the differences in the depth dimensions of the respective cells are generated by the joining processing in the direction of the second axis. In the example of FIG. 24, it is assumed that the sells 641d and 642b have same depth dimensions, and the cells 641e and 642c have different depth dimensions.

The joining of cells of an identical material arrayed in the direction of the third axis (the direction of stacking) in the cell groups 641 and 642 is performed. At this time, the cells are joined only when a cell produced by the joining has a rectangular parallelepiped shape. Thus, a three-dimensional model group 643 is generated from the three-dimensional model groups 641 and 642. Specifically, since the cells 641a, 641b, 641c, 641e, 642a, and 642c cannot be jointed to another cell, the cells 641a, 641b, 641c, 641e, 642a, and 642c become the cells 643a, 643b, 643c, 643e, 643f, and 643g, respectively, without being joined with another cell. However, since the cells 641d and 642b of an identical material are arrayed adjacent to each other, the cells 641d and 642b are joined to form a cell 643d.

As explained above, the adjacent cells of an identical material arrayed in the direction of the third axis are joined, and the cell group generated by the joining in the direction of the third axis constitutes the three-dimensional-shape data 212 of the entire-structure-model.

As understood from the above explanation, the total number of cells can be reduced. Therefore, the amount of data of the three-dimensional-shape data 212 of the entire-structure-model can be reduced.

Although, in the above example, the cell joining processing is performed in the directions of the three axes, the cells may be joined in only one or two axis directions.

In addition, although, in the above example, the axes along which the greatest, the second greatest, and the smallest numbers of cells are arrayed are determined to be the first, second, and third axes, respectively, the third axis may be fixed to the direction of stacking of layers (Z axis).

Next, processing for conversion to a finite element model is explained in detail.

Figure 25:
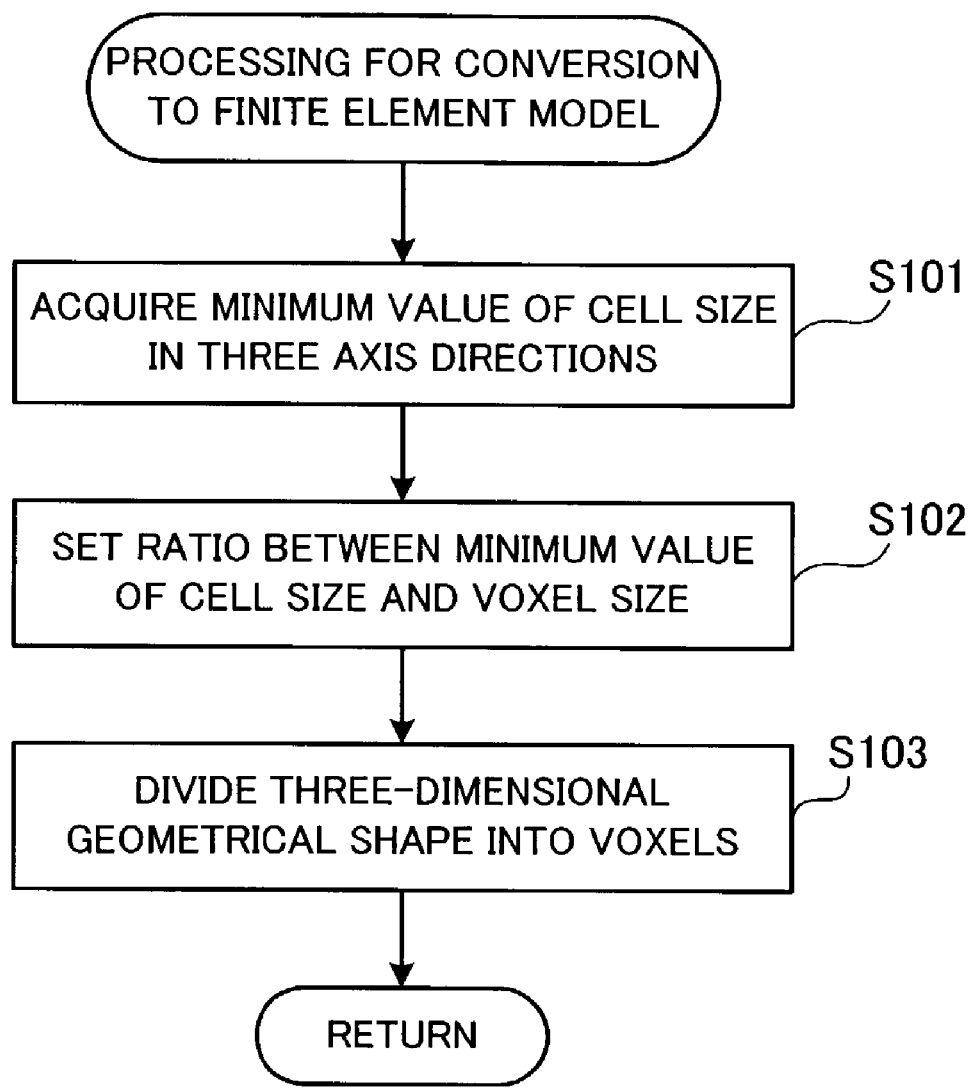
FIG. 25 is a flowchart illustrating processing for conversion to a finite element model.

FIG. 25 is a flowchart illustrating processing for conversion to a finite element model. The processing is explained below step by step.

[Step S101] The finite-element-model generation unit 207 acquires minimum values of the cell sizes in the three axis directions based on the three-dimensional-shape data 212 of the entire-structure-model after the joining processing, where the minimum value in the direction of the column of cells (X axis direction) is denoted by minX, the minimum value in the direction of the row of cells (Y axis direction) is denoted by minY, and the minimum value in the thickness direction (Z axis direction) is denoted by minZ.

[Step S102] The finite-element-model generation unit 207 sets a ratio between the minimum value of the cell size and a voxel size in each axis direction, based on a manipulation input from the user. Specifically, the finite-element-model generation unit 207 receives input of division numbers in the X, Y, and Z axis directions. At this time, the division number in the X axis direction is denoted by p, the division number in the Y axis direction is denoted by q, and the division number in the Z axis direction is denoted by r, where p, q, and r are each an integer greater than one.

In the above case, the voxel size in the X axis direction is expressed as minX/p with the minimum value minX of the cell size and the division number p in the X axis direction, the voxel size in the Y axis direction is expressed as minY/q with the minimum value minY of the cell size and the division number q in the Y axis direction, and the voxel size in the Z axis direction is expressed as minZ/r with the minimum value minZ of the cell size and the division number r in the Z axis direction.

[Step S103] The finite-element-model generation unit 207 divides a three-dimensional geometrical shape included in the three-dimensional-shape data of the entire-structure-model, into voxels. That is, the voxel-model data 213 is generated based on the voxels the sizes of which are defined in step S102. At this time, the material at the center position of the voxel in the three-dimensional-shape data of the entire-structure-model is set as the material of each voxel. Thereafter, the operation goes to step S14 in FIG. 6.

Figure 26:
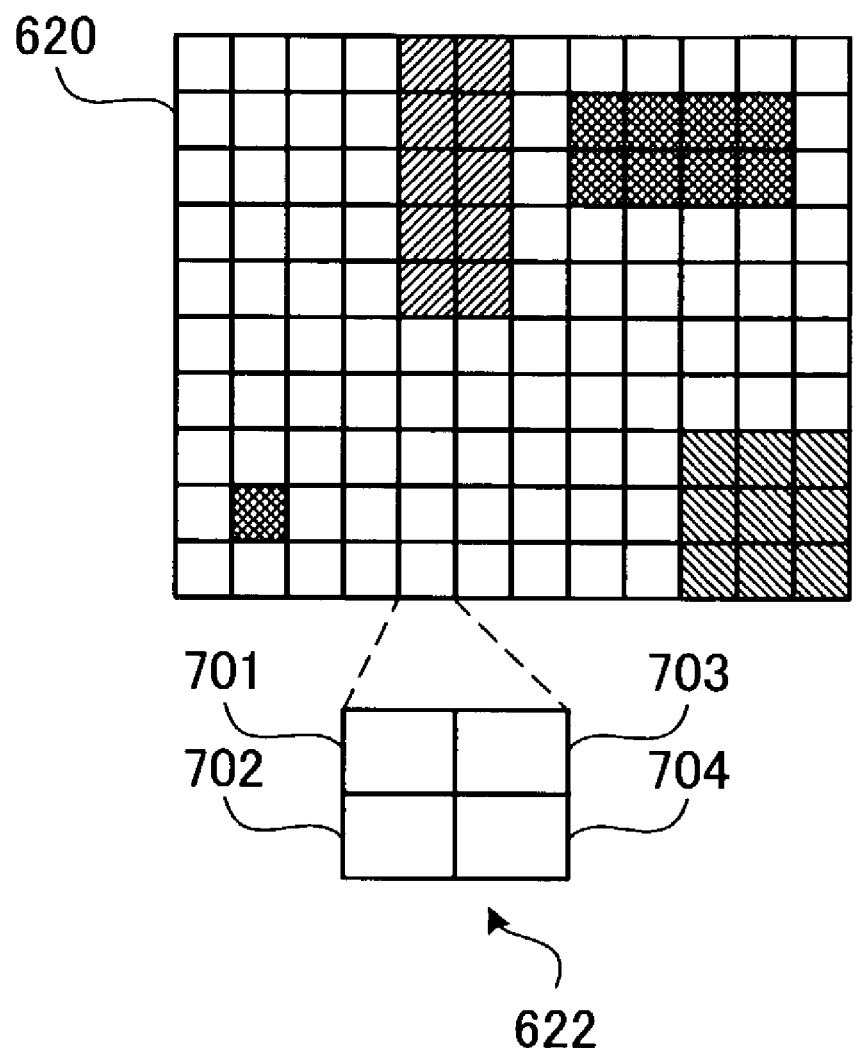
FIG. 26 is a diagram illustrating an example of division into voxels in the direction of a horizontal cross section.

FIG. 26 is a diagram illustrating an example of division into voxels in the direction of a horizontal cross section. In the example of FIG. 26, the division numbers p and q in the X and Y axis directions are set to 2. In this case, a cell 622 of the minimum size in the material arrangement pattern 620 of a layer is divided in two in each of the X and Y axis directions, i.e., into four voxel models 701 to 704.

Figure 27:
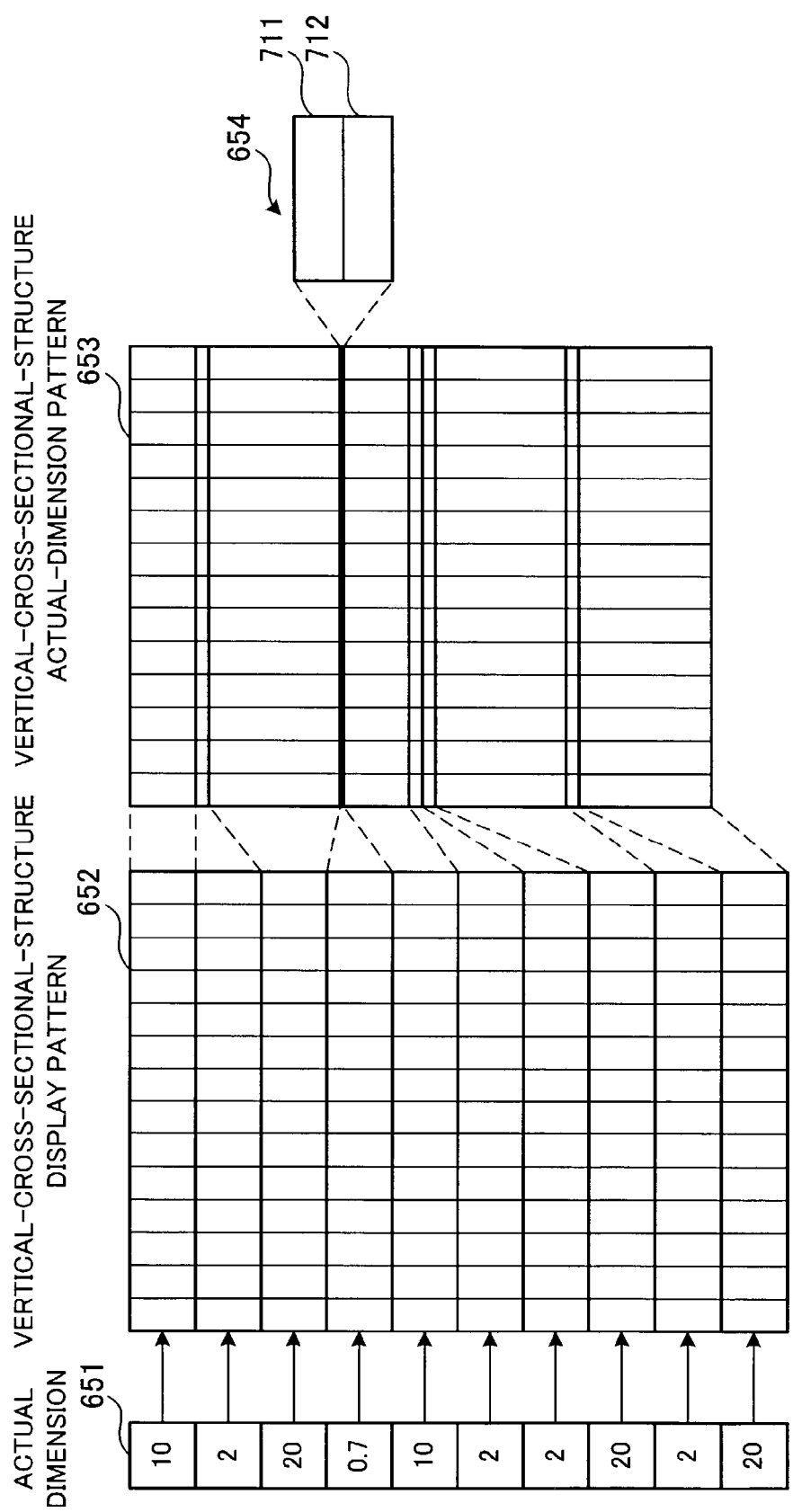
FIG. 27 is a diagram illustrating an example of division into voxels in the thickness direction.

FIG. 27 is a diagram illustrating an example of division into voxels in the thickness direction. In the first embodiment, an actual dimension 651 (for example, in micrometers) of the thickness of each layer is defined. In a vertical-cross-sectional-structure display pattern 652 displayed in the model-structure-definition input screen 300, the thickness of each layer is displayed with an identical width in the vertical direction, regardless of the actual thickness of the layer. However, in practice, in a vertical-cross-sectional-structure actual-dimension pattern 653, there are considerable differences in thickness between thin layers and thick layers. In the example of FIG. 27, the thickness of the thinnest layer is 0.7 micrometers, and the thickness of the thickest layer is 20 micrometers.

In the example of FIG. 27, the division number r in the Z axis direction is two. As illustrated in FIG. 27, each cell 654 in the thinnest layer is divided in two in the Z axis direction so as to form voxels 711 and 712.

Since the cell sizes are not uniform in each of the X, Y and Z axis directions, a multiple of a voxel size may not be equal to a cell size. For example, when the size of a voxel in the Z axis direction is 0.35 micrometers, i.e., a half of 0.7 micrometers, as illustrated in FIG. 27, a layer having a thickness of 2.0 micrometers cannot be exactly divided into equal parts by 0.35 micrometers since 2.0 is not a multiple of 0.35.

Therefore, for example, the user sets the division numbers p, q, and r in the respective axis directions so that the size of each cell coincides with a multiple of the voxel size with an error not greater than 5% of the size of the cell. In the example of FIG. 27, six times the 0.35 micrometer voxel size is 2.1 micrometers. Therefore, the difference from 2.0 micrometers is 5%, i.e., within the tolerance. Since all of the other layers in the example have a thickness of a multiple of 2.0 micrometers, the errors are less than 5%.

Next, processing for analysis of an entire-structure model is explained in detail.

Figure 28:
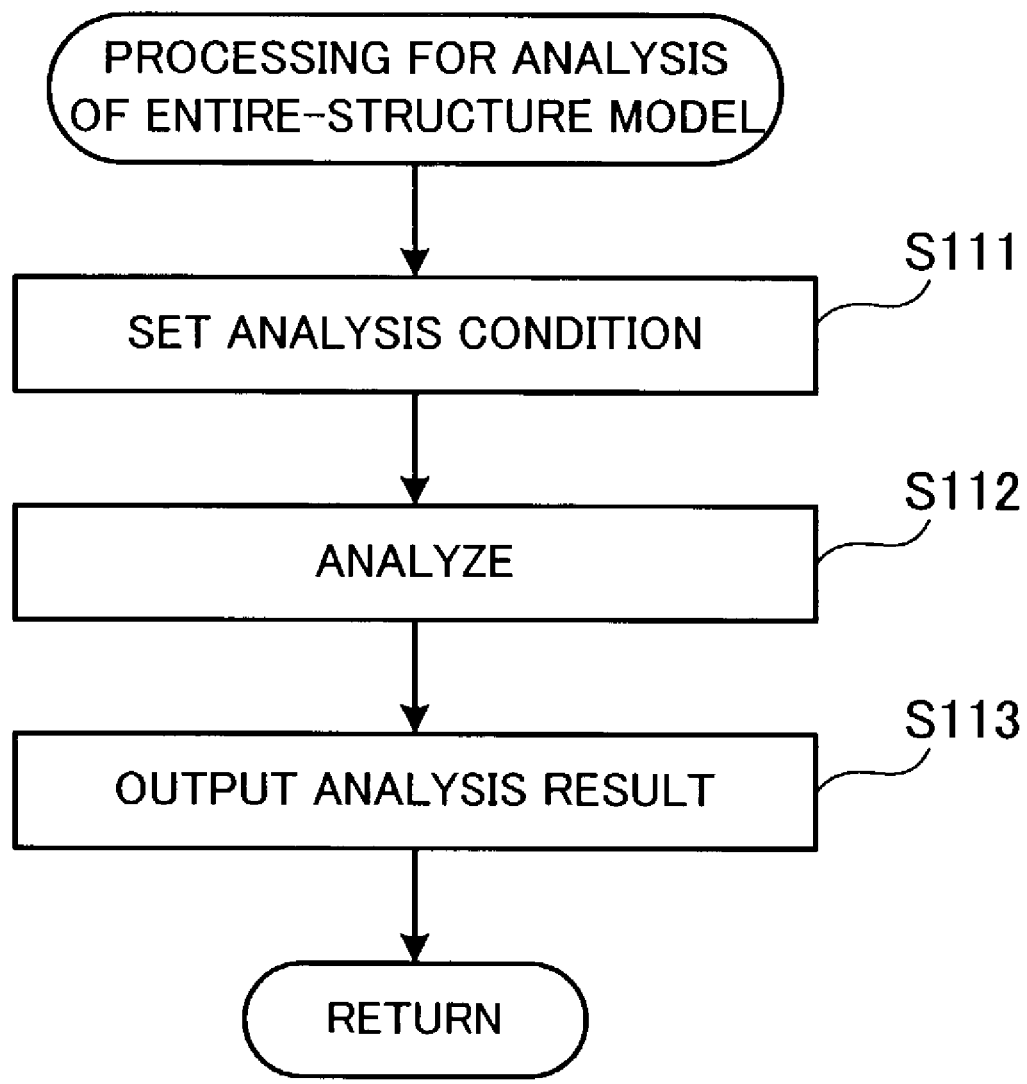
FIG. 28 is a flowchart illustrating a sequence of processing for analysis of an entire-structure model.

FIG. 28 is a flowchart illustrating a sequence of processing for analysis of an entire-structure model. The sequence is explained below step by step.

[Step Sill] The analysis unit 208 sets an analysis condition in response to a manipulation input from the user.

[Step S112] The analysis unit 208 performs a structural analysis of a structure defined by the voxel-model data 213 based on the above analysis condition.

[Step S113] The analysis unit 208 generates and outputs an analysis result 214, which includes, for example, a state of deformation of the LSI caused by mechanical loads, thermal expansion, and the like. Thereafter, the operation goes to step S15.

The structural analysis processing can be realized by using the software for structural analysis systems, "VOXELCON V4", which is available from Quint Corporation, Fujitsu Nagano System Engineering Ltd., Fujitsu Ltd., and others.

Next, the zooming analysis processing is explained in detail.

Figure 29:
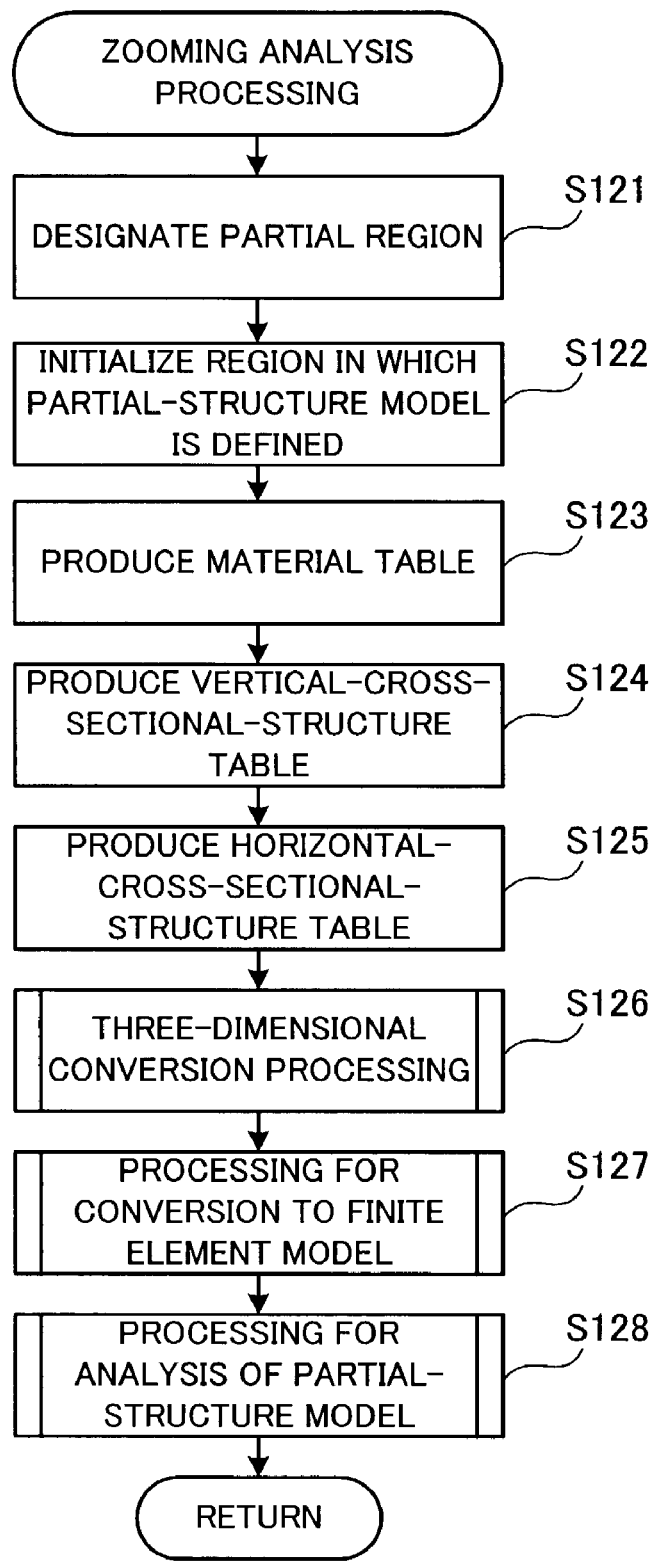
FIG. 29 is a flowchart illustrating a sequence of zooming analysis processing.

FIG. 29 is a flowchart illustrating a sequence of zooming analysis processing. The sequence is explained below step by step.

[Step S121] The partial-structure-model definition unit 205 receives designation of a partial region by a manipulation input from the user.

[Step S122] The user interface 202 initializes a region in which the partial-structure-model information 220 is defined.

[Step S123] The partial-structure-model definition unit 205 produces a material table in response to a manipulation input from the user. Specifically, the partial-structure-model definition unit 205 produces the material table. Next, the partial-structure-model definition unit 205 acquires materials set in the partial region designated in step S121, from the layer-based material-arrangement-pattern data 211 in the entire-structure-model information 210, and sets the acquired materials in the material table as initial values. In addition, when the user makes a manipulation input for material change, the partial-structure-model definition unit 205 makes a change to the materials set in the material table. The manner of manipulation for material setting is similar to that in the case of definition of the structure of the entire-structure model.

[Step S124] The partial-structure-model definition unit 205 produces a vertical-cross-sectional-structure table in response to a manipulation input from the user. The manner of production of the vertical-cross-sectional-structure table is similar to that in the case of definition of the structure of the entire-structure model.

[Step S125] The partial-structure-model definition unit 205 produces a horizontal-cross-sectional-structure table in response to a manipulation input from the user. The manner of production of the horizontal-cross-sectional-structure table is similar to that in the case of definition of the structure of the entire-structure model.

Through the processing in steps S121 to S125, the layer-based material-arrangement-pattern data 221 in the partial-structure-model information 220 is generated.

[Step S126] The three-dimensional conversion unit 206 generates the three-dimensional-shape data 222 of the partial-structure model by performing processing for conversion to a three-dimensional model based on the layer-based material-arrangement-pattern data 221. Details of the processing for conversion to a three-dimensional model is similar to the three-dimensional conversion processing indicated in FIG. 17.

[Step S127] The finite-element-model generation unit 207 performs processing for conversion to a finite element model based on the three-dimensional-shape data 222 of the partial-structure model so that the voxel-model data 223 is generated. Details of the processing for conversion to a three-dimensional model is similar to the processing indicated in FIG. 25.

[Step S128] The analysis unit 208 performs analysis processing of a partial model, and generates an analysis result 224. Thereafter, the operation goes to step S16 in FIG. 6.

Thus, the zooming analysis processing can be performed.

A method for designating a partial region from the entire-structure model is explained below.

Figure 30:
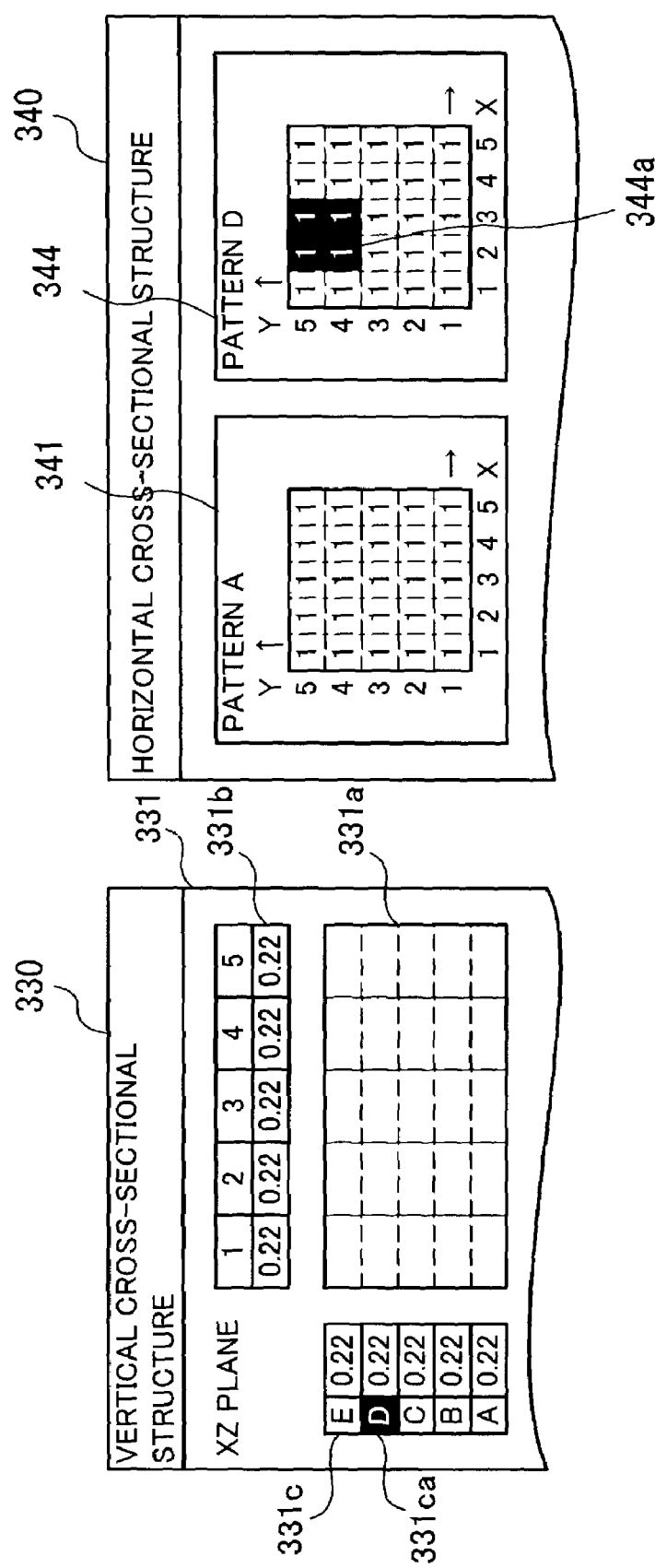
FIG. 30 is a diagram illustrating an input method for designating a partial region.

FIG. 30 is a diagram illustrating an input method for designating a partial region. In FIG. 30, the vertical-cross-sectional-structure table 330 and the horizontal-cross-sectional-structure table 340 in the model-structure-definition input screen 300 are indicated. The user can designate a region in which a detailed analysis is required, on a two-dimensional image by using the model-structure-definition input screen 300.

In the example of FIG. 30, the user selects a layer 331ca corresponding to a partial region in the Z-direction-cell-size input area 331c in the vertical-cross-sectional-structure table 330. Then, the selected layer 331ca is highlighted. Next, the user selects a single cell or a plurality of adjacent cells 344a in the XY-plane cross-sectional-structure table 344 corresponding to the selected layer in the horizontal-cross-sectional-structure table 340. The selected cell or cells are highlighted, and determined to be the partial region.

When the partial region is determined, the layer-based material-arrangement-pattern data 221 for a partial-structure model is generated, and thereafter the three-dimensional-shape data 222 of the partial-structure model is generated. In addition, the voxel-model data 223 is generated.

Figure 31:
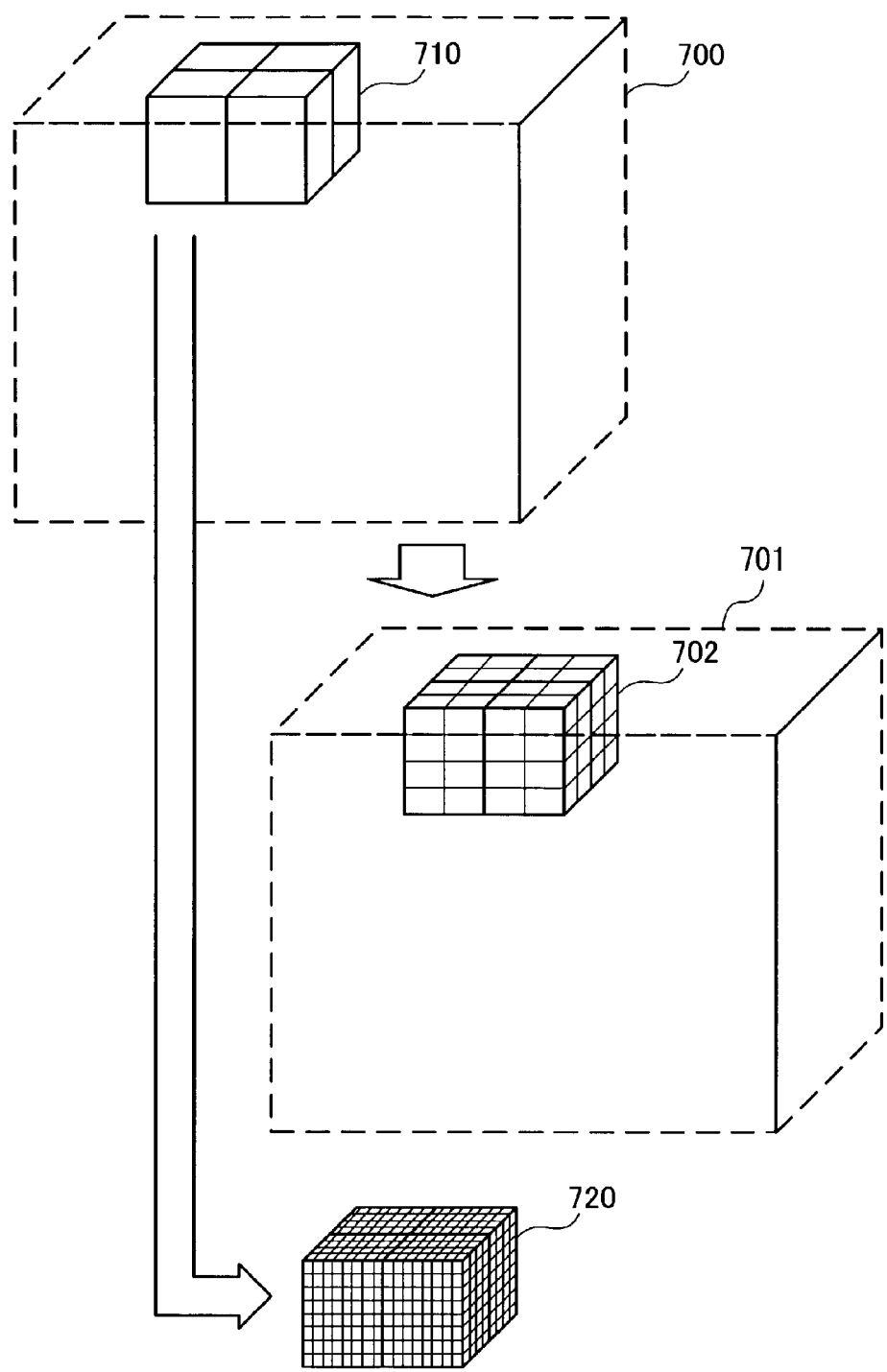
FIG. 31 is a diagram indicating a difference in voxel data between a partial region in an entire-structure model and a partial-structure model.

FIG. 31 is a diagram indicating a difference in voxel data between a partial region in an entire-structure model and a partial-structure model. As illustrated in FIG. 31, a partial region 710, which is a portion of the entire-structure model 700, is also divided into a plurality of voxels constituting a voxel model 702, which is a portion of a voxel model 701 in the entire-structure-model information 210. However, the size of each of the plurality of voxels in the voxel model 702 is common to the entire voxel model 701. Therefore, it is not possible to sufficiently reduce the voxel size.

On the other hand, since a voxel model 720 in the partial-structure model is used for analysis of only the partial region, it is possible to reduce the size of each voxel constituting the voxel model 720, compared to the voxel model 702 in the analysis of the entire-structure model 700.

Processing for analysis of a partial-structure model is performed by using the voxel model 720 constituted by microvoxels as above.

Figure 32:
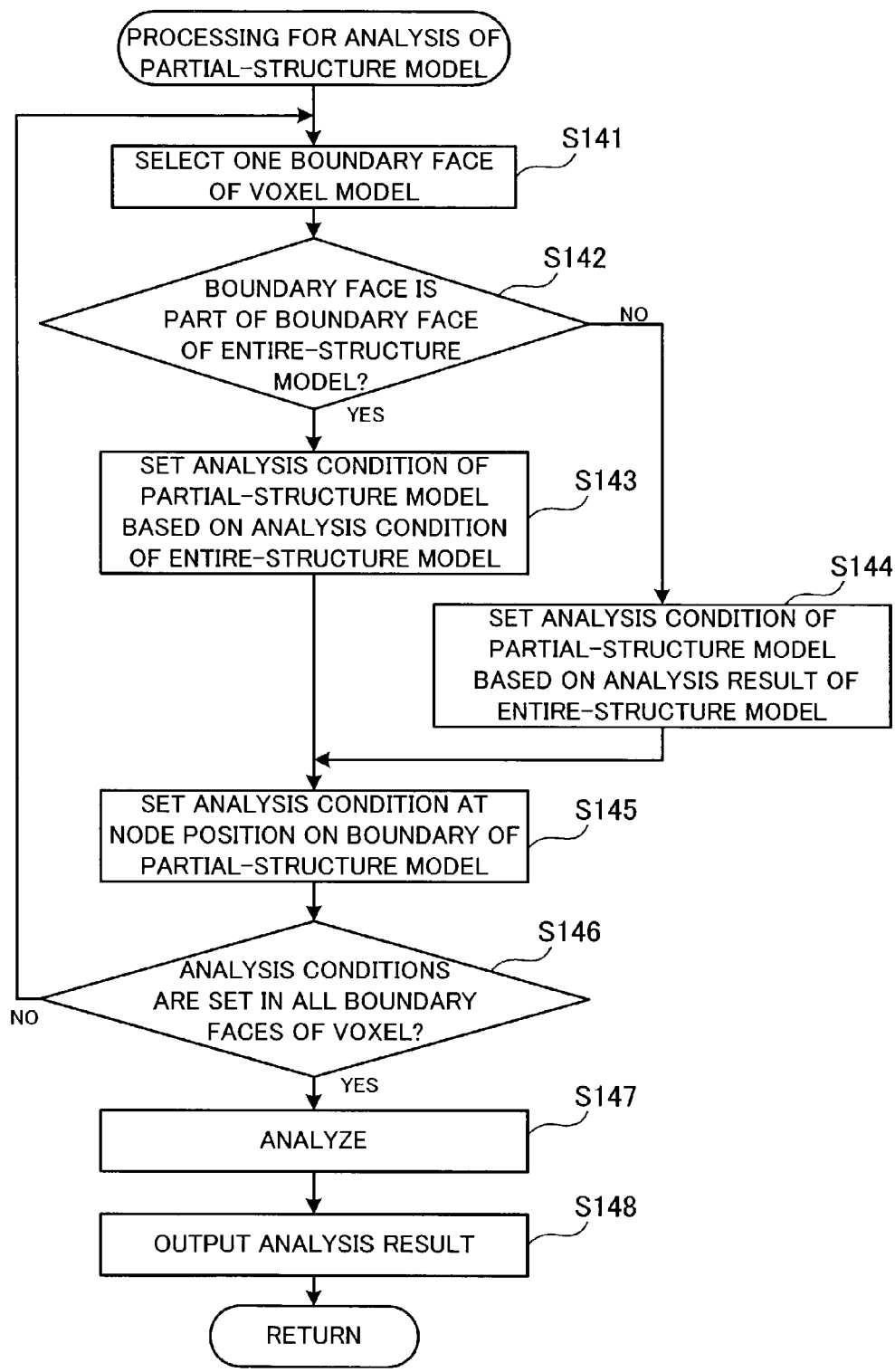
FIG. 32 a flowchart illustrating a sequence of processing for analysis of a partial-structure model.

FIG. 32 a flowchart illustrating a sequence of processing for analysis of a partial-structure model. The sequence is explained below step by step.

[Step S141] The analysis unit 208 selects one of boundary faces of the voxel model 720 (which separates the inside and the outside of the voxel model 720).

[Step S142] The analysis unit 208 determines whether or not the selected boundary face is a portion of a boundary face of the entire-structure model 700. When yes is determined, the operation goes to step S143. When no is determined, the operation goes to step S144.

[Step S143] The analysis unit 208 adopts an analysis condition which is set in the voxel model 701 in the analysis of the entire-structure model 700, as an analysis condition of the partial-structure model using the voxel model 720. That is, when an analysis condition is set at the time of analysis of the entire-structure model, the analysis condition is also applied to the voxel model 720 used in analysis of the partial-structure model, as it is. If an analysis condition is not set at the time of analysis of the entire-structure model, no analysis condition is set in the voxel model 720 used in the analysis of the partial-structure model. Thereafter, the operation goes to step S145.

[Step S144] The analysis unit 208 sets an analysis condition of the partial-structure model based on an analysis result of the entire-structure model, in the boundary face, which is produced by cutout of the partial-structure model and is not a portion of a boundary face of the entire-structure model 700.

[Step S145] The analysis unit 208 sets the analysis condition at positions of nodes on the boundary face of the partial-structure model.

[Step S146] The analysis unit 208 determines whether or not an analysis condition has been set in all of the boundary faces of the voxel model. When yes is determined, the operation goes to step S147. When no is determined, the operation goes to step S141.

[Step S147] The analysis unit 208 performs a structural analysis of the voxel model 720 corresponding to the partial-structure model based on the analysis condition set as above.

[Step S148] The analysis unit 208 outputs an analysis result 224. Thereafter, the operation goes to step S16 in FIG. 6.

In the first embodiment, the analysis result of the entire-structure model is applied to the analysis of the partial-structure model. The analysis result of the entire-structure model is obtained as values for the positions of nodes of each voxel in the voxel model 702. The positions of the nodes are the positions of vertexes of the voxel. Similarly, the analysis condition in the entire-structure model is also set at the positions of the nodes of each voxel. However, as illustrated in FIG. 31, the voxel sizes and the positions of nodes are different between the entire-structure model and the partial-structure model. Therefore, it is necessary to obtain the analysis condition at the positions of the nodes of the voxel model 720 corresponding to the partial-structure model by calculation based on the analysis result of the entire-structure model.

A method for setting an analysis condition in a partial-structure model is explained in detail below.

Figure 33:
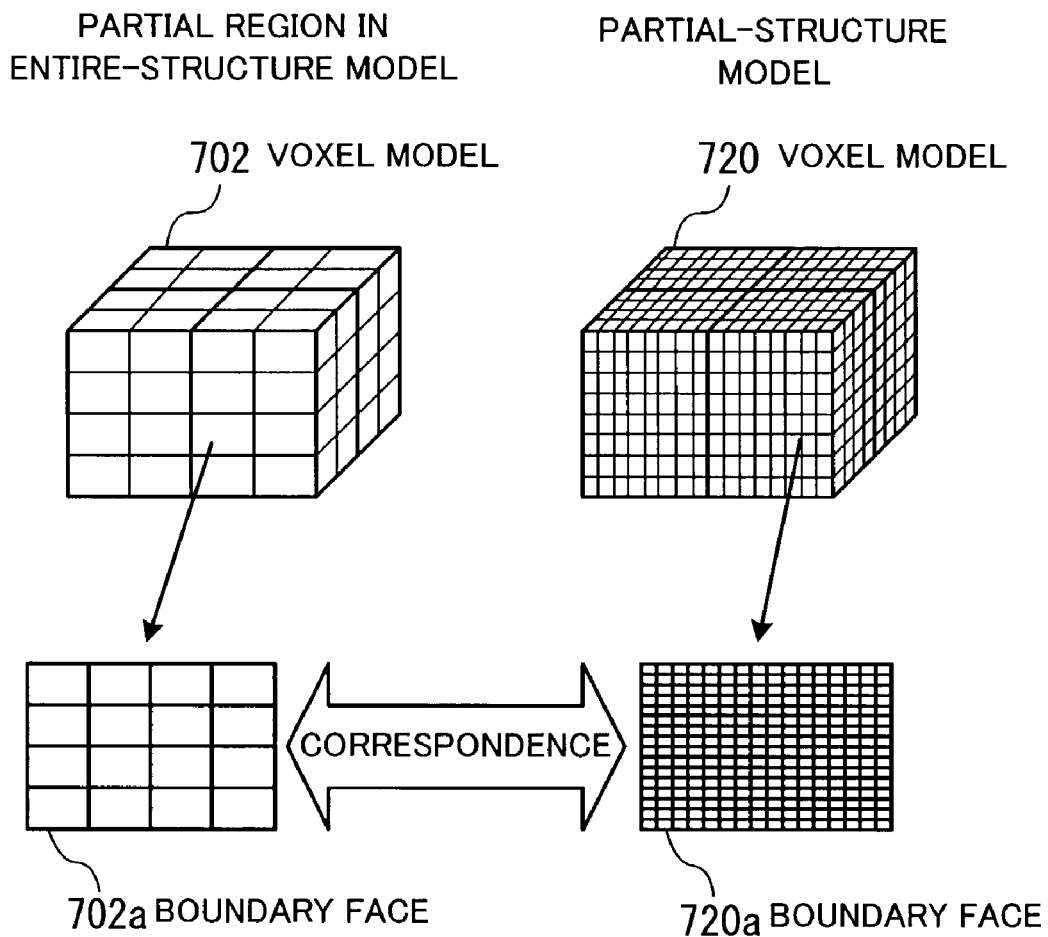
FIG. 33 is a diagram indicating boundary faces in a partial region of an entire-structure model and a partial-structure model.

FIG. 33 is a diagram indicating boundary faces in a partial region of an entire-structure model and a partial-structure model. As illustrated in FIG. 33, the outline shapes of the boundary face 702a of the voxel model 702 of the partial region in the entire-structure model and the boundary face 720a of the voxel model 720 of the partial-structure model are identical. Therefore, it is possible to correlate (map) the boundary face 702a of the partial region with the boundary face 720a of the partial-structure model. Thus, the analysis condition at the positions of the nodes on the boundary face 720a of the partial-structure model can be calculated from the corresponding values on the boundary face 702a of the entire-structure model by two-dimensional interpolation.

Figure 34:
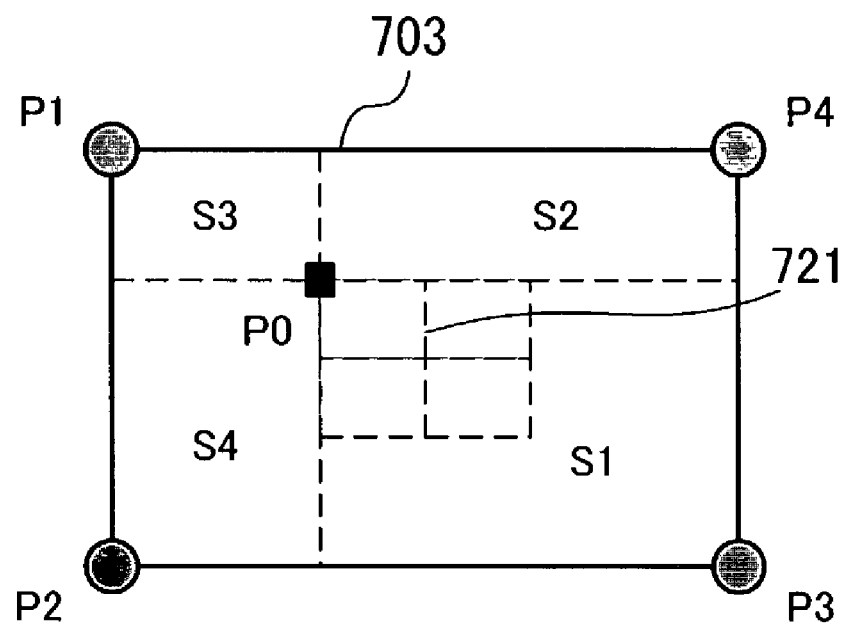
FIG. 34 is an explanatory diagram illustrating a method for calculating an analysis condition at the positions of nodes in a partial-structure model by interpolation.

FIG. 34 is an explanatory diagram illustrating a method for calculating an analysis condition at the positions of nodes in a partial-structure model by interpolation. In FIG. 34, a face of a voxel 721 in a partial-structure model is superimposed on a face of a voxel 703 in an entire-structure model. The vertexes of the rectangular face of the voxel 703 in the entire-structure model are the nodes P1 to P4, and the node P0 of the voxel 721 in the partial-structure model is located inside the sides of the face of the voxel 703.

In this case, the analysis unit 208 searches the face of the voxel 703 in the entire-structure model, which includes the node P0 of the partial-structure model for which a value (to be designated as an analysis condition) is required. As a result, the face of the voxel 703 surrounded by the nodes P1 to P4 is detected.

The analysis unit 208 divides the face of the voxel 703 in four with two straight lines which are respectively parallel to the sides of the face and pass through the node P0. In the following explanations, the area of the face of the voxel 703 is indicated by S, and the areas of the four-part divided regions are indicated by S1, S2, S3, and S4. Specifically, S1 indicates the area of the region (of the face of the voxel 703) which includes the node in the face of the voxel 703 diagonal to the node P1, S2 indicates the area of the region (of the face of the voxel 703) which includes the node in the face of the voxel 703 diagonal to the node P2, S3 indicates the area of the region (of the face of the voxel 703) which includes the node in the face of the voxel 703 diagonal to the node P3, and S4 indicates the area of the region (of the face of the voxel 703) which includes the node in the face of the voxel 703 diagonal to the node P4.

The value Va at the node P0 can be obtained by interpolation based on values Vi (i=1, 2, 3, and 4), at the nodes Pi (i=1, 2, 3, and 4), of an analysis result of the entire-structure model or already known values as an analysis condition, as follows.

$$Va = \Sigma Vi \cdot Si / S \qquad (1)$$

Although, in the example of FIG. 34, the values at the positions of the nodes in the voxel model 720 of the partial-structure model are calculated by two-dimensional interpolation in a boundary face, alternatively the values at the positions of the nodes may be calculated by three-dimensional interpolation.

In this case, the analysis unit 208 first searches the voxel model 701 of the entire-structure model for a voxel including the nodes of the voxel model 720 generated from the partial-structure model, and extracts the voxel. The analysis unit 208 calculates a required value at a node by three-dimensional interpolation based on values at eight nodes of the extracted voxel. According to the three-dimensional interpolation, the detected voxel is divided in eight with planes which are respectively parallel to the XY plane, the YZ plane, and the ZX plane and pass through the node of which the value is required. Then, weights are set at the eight nodes, and the values at the eight nodes of the detected voxel are multiplied by the weights of the nodes, respectively. The weight set at each of the eight nodes of the detected voxel is determined to correspond to a volume of a region of the detected voxel which includes a diagonal node of the detected voxel. Subsequently, the multiplied values are summed, and the summed result is divided by the volume of the detected voxel. Thus, the value at the position of the node is calculated by the three-dimensional interpolation.

As explained above, according to the first embodiment, simulation can be performed without learning of the difficult operational procedure of the three-dimensional CAD system or preprocessor when a two-dimensional structure of each layer is defined. Therefore, it is possible to make the simulation prevalent (popular). Further, the first embodiment can easily realize simulation of fine shapes (such as LSI multi-layer wiring), which was conventionally difficult.

Comparison of Work Load

A result of comparison of work load between the first embodiment and the conventional technique (in which a model of an object to be analyzed is produced by three-dimensional CAD for performing a structural analysis) is indicated below.

In the following explanation, a semiconductor having an eight-layer structure is took as an example of an object to be analyzed. In this example, the number of cells is about 3,000, and the number of the two-dimensional patterns (a sum of the numbers of materials in the respective layers) is 30.

Shape Definition

According to the conventional method (for each cell), a cell is produced in accordance with the following procedure.
(1) designation of a cell
(2) designation of an origin position
(3) designation of a bottom face
(4) designation of a thickness At this time, the number of operations of clicking a mouse button was 20 clicks per cell in total, the number of operations of inputting a numerical value was six numerical inputs per cell in total, and the number of numerical inputs per layer was 600 numerical inputs per layer.

According to the first embodiment, a cell is produced in accordance with the following procedure.
(1) setting of a display manner (e.g., a color) of a block in a record
(2) input of a thickness of a layer At this time, the number of operations of clicking a mouse button was two clicks per cell in total, there was no numerical input for each cell, and the number of numerical inputs per layer was one numerical input per layer.

Discretization

According to the conventional method, cells are discretized in accordance with the following procedure.
(1) designation of a cell
(2) edge division
(3) adjustment of division position
(4) discretization of inside of a cell At this time, the number of operations of clicking a mouse button was 1,800 clicks per cell or greater in total, and the number of operations of inputting a numerical value was 900 or greater in total.

According to the first embodiment, cells are discretized in accordance with the following procedure.
(1) designation of a mesh size (numerical value)

At this time, there was no operation of clicking a mouse button, and the number of operations of inputting a numerical value was only one.

áMaterial Setting

According to the conventional method, a material is set for each cell in accordance with the following procedure.
(1) designation of a cell
(2) designation of a material At this time, the number of operations of clicking a mouse button was five in total.

Since the material is defined in the shape definition in the first embodiment, there is no specific stage for setting a material for each cell.

When the above input operations are summed up, the number of clicks in the first embodiment is 6,000, although the number of clicks in the conventional method is 61,800 or greater. In addition, the number of numerical inputs in the first embodiment is 31, although the number of numerical inputs in the conventional method is 900 or greater.

As described above, according to the present invention, the work load can be greatly reduced. That is, physical simulation of a multilayer structure can be performed without learning of a difficult operational procedure of software such as the three-dimensional CAD.

In addition, in the first embodiment, the user can define the structure of an object to be analyzed, by inputting data in a screen displaying a table structure as illustrated in FIG. 8. Therefore, the contents of the manipulation inputs are very simple, redoing work necessitated by erroneous input can be reduced, and working efficiency can be increased.

Further, in the first embodiment, a partial region subject to zooming analysis can be designated in planar tables as illustrated in FIG. 30. Therefore, it is possible to easily designate an appropriate region as the partial region while confirming an internal structure of a multilayer structure. That is, it is difficult to appropriately designate a partial region in a three-dimensional model due to difficulty in confirmation of an internal structure in the three-dimensional model. However, in the case of a multilayer structure, it is very easy to designate a partial region by layer-based material arrangement patterns. Thus, the work load imposed on the user can be further reduced.

Furthermore, in the case of simulation of a fine shape such as LSI multilayer wiring, it is possible to perform zooming analysis of only a portion which is really required to be finely analyzed, since the partial region can be appropriately designated. Therefore, processing efficiency in the analysis can be increased.

Moreover, in the first embodiment, the display manner on the screen is changed for each material. Therefore, the material arrangement pattern can be easily recognized.

Although the above explanations are provided for the case where the present invention is applied to structural analysis simulation of an LSI, the present invention can also be applied to structural analysis simulation of other objects which have a layered structure. For example, high-rise buildings have a layered structure. Therefore, the present invention enables easy structural analysis simulation of high-rise buildings.

In addition, although, in the above example, the analysis condition is set in the voxel-model data 213, it is possible to set an analysis condition in the layer-based material-arrangement-pattern data 211. In this case, the analysis condition set in the layer-based material-arrangement-pattern data 211 is sequentially inherited by the three-dimensional-shape data 212 of the entire-structure-model, the voxel-model data 213, and the like.

Second Embodiment

Next, the second embodiment is explained. In the second embodiment, an LSI is produced, where the structural strength of the LSI is verified by using the functions of the structural analysis apparatus in the first embodiment.

Figure 35:
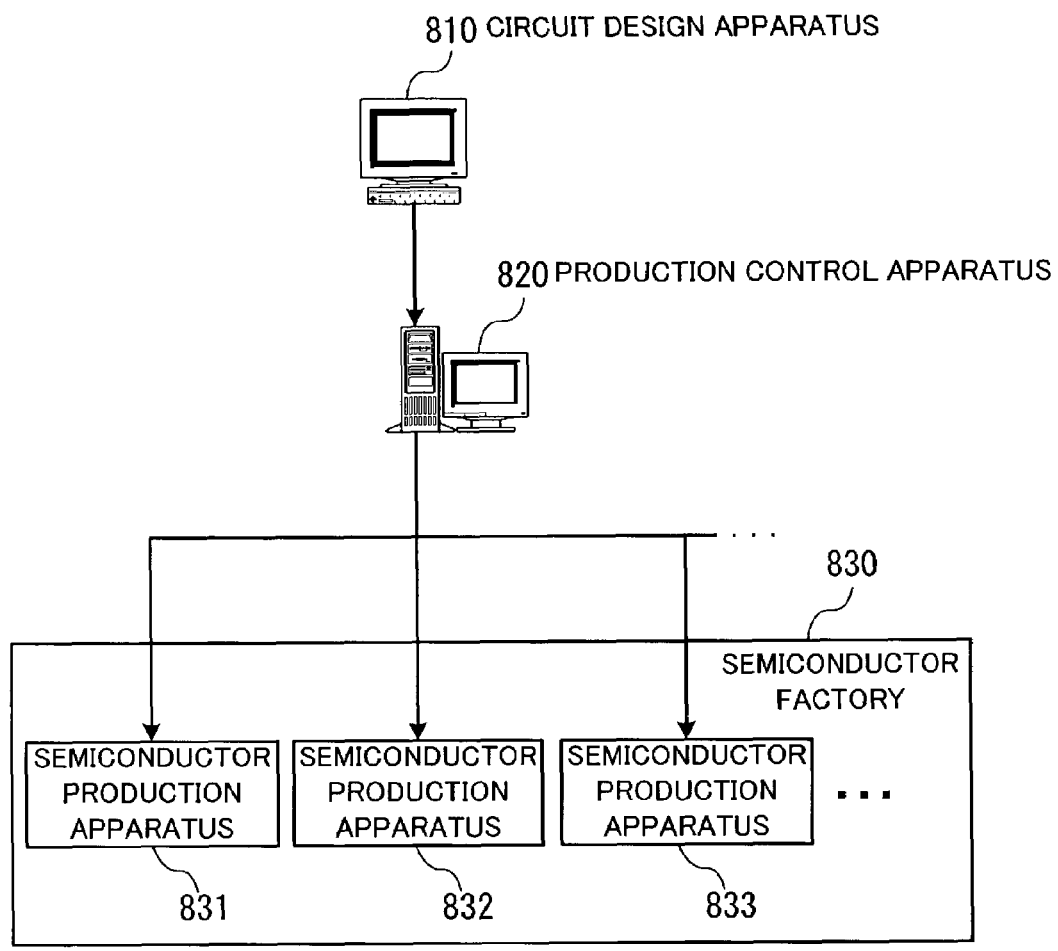
FIG. 35 is a diagram illustrating an example of an LSI manufacturing system.

FIG. 35 is a diagram illustrating an example of an LSI manufacturing system. In the example of FIG. 35, the LSI manufacturing system is constituted by a circuit design apparatus 810, a production control apparatus 820, and a plurality of semiconductor production apparatuses 831, 832, 833, ááá, where the plurality of semiconductor production apparatuses 831, 832, 833, ááá are arranged in a semiconductor factory 830. The circuit design apparatus 810 and the plurality of semiconductor production apparatuses 831, 832, 833, ááá are connected to the production control apparatus 820.

The circuit design apparatus 810 is a computer provided for designing circuits of LSIs. The circuit design apparatus 810 has the functions (including layout design and structural analysis) of the structural analysis apparatus 200 illustrated in FIG. 5, as well as the functions of functional design and logic design of LSIs. Information on structures of LSIs designed by the circuit design apparatus 810 is transferred to the production control apparatus 820.

The production control apparatus 820 transmits information necessary for manufacturing (such as information on materials) to the plurality of semiconductor production apparatuses 831, 832, 833, ááá in accordance with a manufacturing schedule of an LSI, where the manufacturing schedule is set in the production control apparatus 820.

The plurality of semiconductor production apparatuses 831, 832, 833, ááá in the semiconductor factory 830 are apparatuses used in a LSI manufacturing process, such as a mask production apparatus and a semiconductor crystal production apparatus. The plurality of semiconductor production apparatuses 831, 832, 833, ááá determine various conditions in the LSI manufacturing stages, and perform predetermined processing in the LSI manufacturing process, on members to be processed, in accordance with the information transferred from the production control apparatus 820.

Figure 36:
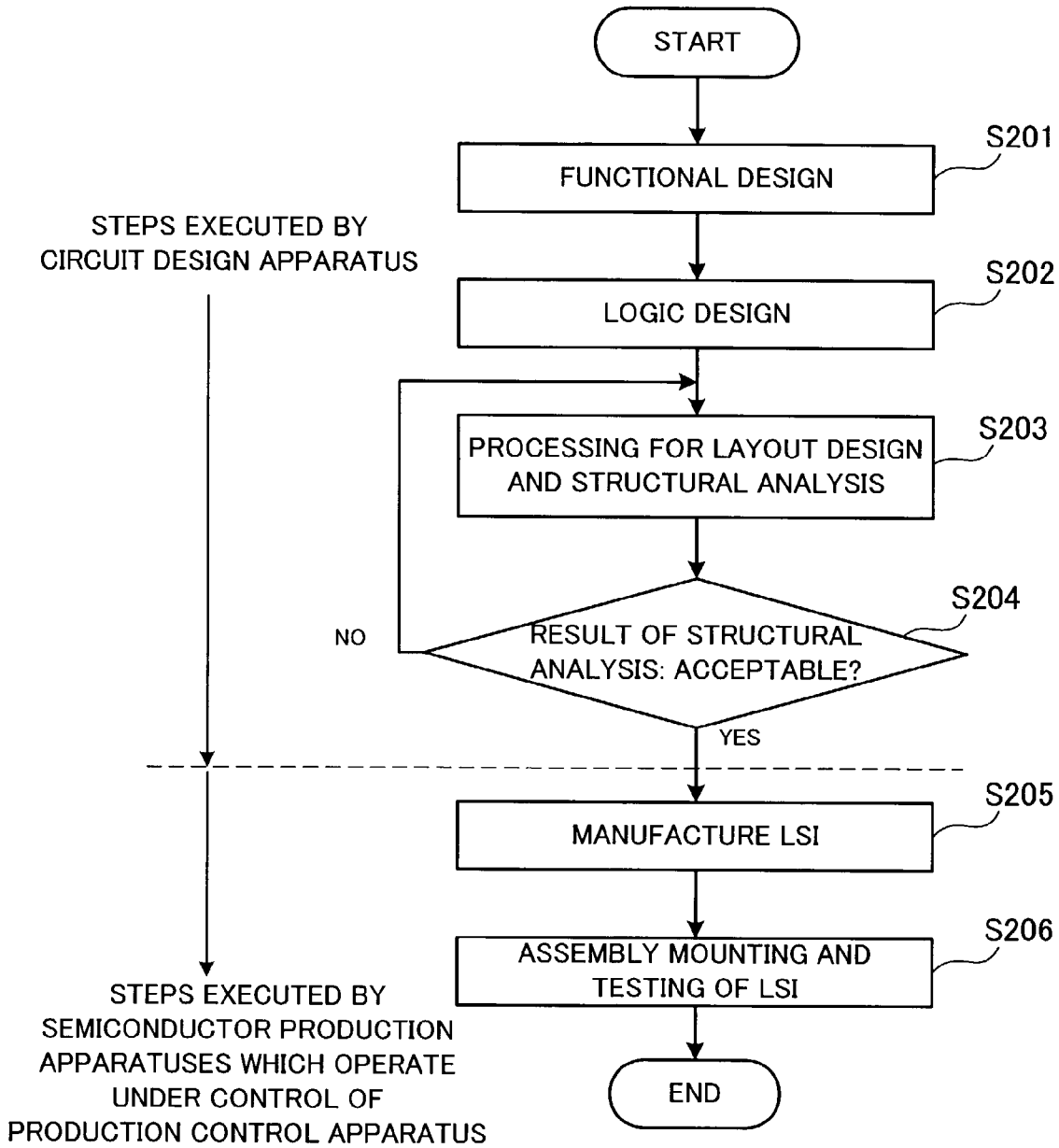
FIG. 36 is a diagram illustrating a sequence of LSI production.

FIG. 36 is a flowchart illustrating a sequence of LSI production. The sequence is explained below step by step. In FIG. 36, the steps S201 to S204 are executed by the circuit design apparatus 810, the steps S205 and S206 are executed by the plurality of semiconductor production apparatuses 831, 832, 833, ááá, which operate under the control of the production control apparatus 820.

[Step S201] The circuit design apparatus 810 performs functional design of an LSI in response to a manipulation input from a user. In the functional design, a function specification of the LSI is produced based on a system specification (which includes external conditions, design requirements, and the like which the user determines at the time of ordering). Thus, details of operations of the LSI are designed. The circuit design apparatus 810 generates functional design data by the functional design processing.

[Step S202] The circuit design apparatus 810 performs logic design based on the functional design data. The logic design is processing for making a concrete form of the LSI at the level of logic gates such as NAND circuits and inverters.

[Step S203] The circuit design apparatus 810 performs processing for layout design and structural analysis. In the layout design, a layout of blocks and elements such as transistors and resistors is determined, and LSI mask patterns are designed by determining paths of wirings between the above elements. In the structural analysis processing, structural analysis of the LSI in accordance with a result of the layout design is performed for verifying whether to withstand loads during the mounting stage.

Details of the layout design and structural analysis processing are identical to the structural analysis processing in the first embodiment. In the first embodiment, the layer-based material arrangement patterns of the LSI are defined for structural analysis. The processing for defining the layer-based material arrangement patterns corresponds to the layout design processing.

[Step S204] The circuit design apparatus 810 determines whether or not the design data (the two-dimensional layer-based material arrangement patterns) subject to the structural analysis are acceptable, based on the result of the structural analysis. For example, a tolerance with respect to occurrence of a damage such as an exfoliation of material or a bending failure is registered in advance in the circuit design apparatus 810. In addition, the circuit design apparatus 810 determines whether or not a force exceeding the tolerance is applied to a region during the mounting stage, based on the result of the structural analysis processing. When there is at least one region to which a force exceeding the tolerance is applied, the circuit design apparatus 810 determines that the design data input into the circuit design apparatus 810 is not acceptable. When there is no region to which a force exceeding the tolerance is applied, the circuit design apparatus 810 determines that the design data input into the circuit design apparatus 810 is acceptable.

When there is at least one region to which a force exceeding the tolerance is applied, it is possible to leave the final decision to the user. In this case, the circuit design apparatus 810 displays information on the region to which the force exceeding the tolerance is applied, on the screen, and the user refers to the contents displayed on the screen and determines whether or not the layout is to be corrected. When the layout is to be corrected, the user provides to the circuit design apparatus 810 a manipulation input which indicates that the result of the structural analysis includes a problem (unacceptable). When the layout is not to be corrected, the user provides to the circuit design apparatus 810 a manipulation input which indicates that the result of the structural analysis does not include a problem (acceptable). The circuit design apparatus 810 makes a final decision whether or not the result of the structural analysis includes a problem, based on a manipulation input from the user.

When the result of the structural analysis includes a problem, the operation goes to step S203, and the layout design and structural analysis processing in step S203 is repeated.

When the result of the structural analysis does not include a problem, the circuit design apparatus 810 transfers information indicating the structure of the LSI (including layer-based information on the wiring layout, layer thickness, materials, and the like) to the production control apparatus 820, and the operation of the circuit design apparatus 810 is completed. Then, the production control apparatus 820 executes the processing in steps S205 and S206.

[Step S205] The production control apparatus 820 sends various information necessary for LSI manufacturing to the semiconductor production apparatuses involved in the LSI manufacturing process, in accordance with the LSI manufacturing schedule. Then, the semiconductor factory 830 manufactures LSIs having the structure designed by the circuit design apparatus 810 in accordance with operators' manipulations of the semiconductor production apparatuses.

[Step S206] In accordance with the LSI manufacturing schedule, the production control apparatus 820 sends various information necessary for assembly mounting and testing of LSIs, to semiconductor production apparatuses involved in the assembly mounting and testing of the LSIs.

Since only the LSIs having a structure which is verified to withstand loads during the mounting stage are manufactured as explained above, it is possible to reduce the number of LSIs which are determined to be defective after the mounting. In addition, since the LSIs are manufactured based on the two-dimensional model which is input in the structural analysis, it is possible to save the operators from inputting information on the wiring layout and the like into the production control apparatus 820 in the manufacturing stage.

Example of Application

The processing functions indicated in the first and second embodiments can be realized by computers. In this case, programs which describe details of processing realizing the functions which the structural analysis apparatus, the circuit design apparatus, and the production control apparatus should have are provided. When the computers execute the programs, the above processing functions are realized on the computers. The programs describing the details of processing can be stored in a computer-readable storage mediums. The computer-readable storage mediums may be a magnetic storage device, an optical disk, an optical magnetic recording medium, a semiconductor memory, or the like. The magnetic storage device may be a hard disk device (HDD), a flexible disk (FD), a magnetic tape, or the like. The optical disk may be a DVD (Digital Versatile Disk), a DVD-RAM (Random Access Memory), a CD-ROM (Compact Disk Read Only Memory), a CD-R (Readable)/RW (ReWritable), or the like. The optical magnetic recording medium may be an MO (Magneto-Optical Disk) or the like.

In order to put the programs into the market, for example, it is possible to sell portable storage mediums such as a DVDs or CD-ROMs in which the programs are recorded. Alternatively, the programs can be stored in a storage device belonging to a server computer, and transferred to other computers through a network.

Each computer which should execute a program stores the program in a storage device belonging to the computer, where the program is originally recorded in a portable storage medium or transferred from a server computer. Then, the computer reads the program from the storage device, and executes processing in accordance with the program. Alternatively, the computer may directly read the program from the portable storage medium for executing processing in accordance with the program. Further, the computer may sequentially execute processing in accordance with each portion of the program when the computer receives the portion of the program from the server computer.

As explained above, according to the present invention, a three-dimensional model is generated by adding a thicknesses to the layer-based material arrangement patterns in the two-dimensional model generated in response to a manipulation input, and analysis is performed by a finite element method based on the three-dimensional model. Therefore, when the user makes a manipulation input designating a structure of the two-dimensional model, analysis in accordance with the finite element method can be performed. As a result, the user is not required to produce a model having a three-dimensional structure for structural analysis in accordance with the finite element method. Thus, physical properties of multilayer structures can be easily analyzed.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A computer-readable medium storing a program for analyzing a physical property of a multilayer structure, the program causing a computer to execute a process comprising:

(a) producing a two-dimensional model of the structure in which each layer of the structure is defined separately as a material arrangement pattern and a parameter specifying thickness of that layer;

(b) producing a three-dimensional model of the structure by adding the specified thickness to each layer and stacking the layers with the respective material arrangement patterns;

(c) producing a finite element model by dividing the three-dimensional model into a plurality of voxels;

(d) performing a structural analysis on the produced finite element model; and (e) after the structural analysis is performed, performing a zooming analysis on a partial region of the three-dimensional model by dividing the partial region into microvoxels smaller than the voxels of the finite element model, wherein the partial region is determined by a user input that designates in the two-dimensional model a specific region of the material arrangement pattern of a specific layer; and displaying an image indicating a zooming analysis result on a computer display.

2. The computer-readable medium according to claim 1, wherein in the step (a), a planar cross-sectional view of each layer of the structure is displayed in a tabular form in which a cross section of the layer is divided into a plurality of cells, and the two-dimensional model of the structure is produced in response to manipulation inputs which assign materials to the plurality of cells.

3. The computer-readable medium according to claim 1, wherein in the step (b), a plurality of cells each having a rectangular parallelepiped shape are produced from the two-dimensional model, and successive cells having an identical shape are joined into a single cell.

4. The computer-readable medium according to claim 1, wherein in the step (c), a voxel size in a division direction is determined to be an integer fraction of a minimum cell size in the division direction, and the three-dimensional model in which the successive cells having an identical shape are joined is divided into a plurality of voxels.

5. The computer-readable medium according to claim 1, wherein in the zooming analysis, an analysis condition in the microvoxels is determined based on an analysis condition and an analysis result in the partial region.

6. The computer-readable medium according to claim 1, wherein the zooming analysis comprises:

in response to a user input, producing a two-dimensional model of the partial region by using the material arrangement pattern each layer;

producing a three-dimensional model of the partial region from the two-dimensional model of the partial region by stacking the layers thereof;

producing a finite element model of the partial region by dividing the three-dimensional model of the partial region into a plurality of microvoxels smaller than the voxels of the finite element model; and (d) performing a structural analysis on the finite element model of the partial region.

7. A structural analysis process for analyzing a physical property of a multilayer structure, comprising:

(a) producing a two-dimensional model of the structure in response to a user input which designates a material arrangement pattern and a thickness of each layer of the structure;

(b) producing a three-dimensional model by adding the designated thickness of each layer to the material arrangement pattern of the layer so as to make the material arrangement pattern three-dimensional and stacking the three-dimensionalized material arrangement pattern of each layer;

(c) producing a finite element model by dividing the three-dimensional model into a plurality of voxels; and (d) performing a structural analysis based on the produced finite element model wherein after the performing, a partial region which is a portion of the three-dimensional model is divided into microvoxels which are smaller than the voxels, and zooming analysis is performed; and displaying an image indicating the structural analysis result on a computer display;

wherein in the zooming analysis, the partial region as the portion of the three-dimensional model is determined in response to user inputs for designation of a layer and a region in the material arrangement pattern of the designated layer which is not three-dimensionalized.

8. The structural analysis process according to claim 7, wherein in the step (a), a planar cross-sectional view of each layer of the structure is displayed in a tabular form in which a cross section of the layer is divided into a plurality of cells, and the two-dimensional model of the structure is produced in response to manipulation inputs which assign materials to the plurality of cells.

9. The structural analysis process according to claim 7, wherein in the step (b), a plurality of cells each having a rectangular parallelepiped shape are produced from the two-dimensional model, and successive cells having an identical shape are joined into a single cell.

10. The structural analysis process according to claim 7, wherein in the step (c), a voxel size in a division direction is determined to be an integer fraction of a minimum cell size in the division direction, and the three-dimensional model in which the successive cells having an identical shape are joined is divided into a plurality of voxels.

11. The structural analysis process according to claim 10, further comprising zooming analysis including:

(e) setting a structure of the partial region as an initial value in a material arrangement pattern on a plane corresponding to each layer of the partial region, and producing a two-dimensional model of the partial region in response to a user input, where the two-dimensional model of the partial region indicates microstructures in the partial region;

(f) producing a three-dimensional model of the partial region based on the two-dimensional model of the partial region produced in the step (e);

(g) producing a finite element model of the partial region by dividing the three-dimensional model of the partial region into a plurality of voxels; and (h) structural analysis is performed based on the finite element model of the partial region.

12. The structural analysis process according to claim 7, wherein in the zooming analysis, an analysis condition in the microvoxels is determined based on an analysis condition and an analysis result in the partial region.

13. A structural analysis apparatus for analyzing a physical property of a multilayer structure, comprising:

a two-dimensional-model production unit which produces a two-dimensional model of the structure in which each layer of the structure is defined separately as a material arrangement pattern and a parameter specifying thickness of that layer;

a three-dimensional-model production unit which produces a three-dimensional model of the structure by adding the specified thickness to each layer and stacking the layers with the respective material arrangement patterns;

a finite-element-model production unit which produces a finite element model by dividing the three-dimensional model into a plurality of voxels; and a structural analysis unit which performs a structural analysis based on the produced finite element model and after the structural analysis is performed, performing a zooming analysis on a partial region of the three-dimensional model by dividing the partial region into microvoxels smaller than the voxels of the finite element model, wherein the partial region is determined by a user input that designates in the two-dimensional model a specific region of the material arrangement pattern of a specific layer; and a graphic processing unit displaying results of the structural analysis on a monitor screen.

14. A production process of a semiconductor integrated circuit having multilayer wiring, comprising:

(a) producing a two-dimensional model of the semiconductor integrated circuit in response to a user input which designates layer-based material arrangement patterns of the semiconductor integrated circuit and a thickness of each layer;

(b) producing a three-dimensional model by adding the designated thickness of each layer to the layer-based material arrangement patterns so as to make the material arrangement pattern three-dimensional and stacking the three-dimensionalized layer-based material arrangement patterns;

(c) producing a finite element model by dividing the three-dimensional model into a plurality of voxels;

(d) performing a structural analysis based on the produced finite element model, wherein after the performing, a partial region which is a portion of the three-dimensional model is divided into microvoxels which are smaller than the voxels, and zooming analysis is performed wherein in the zooming analysis, the partial region as the portion of the three-dimensional model is determined in response to user inputs for designation of a layer and a region in the material arrangement pattern of the designated layer which is not three-dimensionalized;

(e) determining, based on a result of the structural analysis, whether or not the layer-based material arrangement patterns of the semiconductor integrated circuit are acceptable;

(f) producing the semiconductor integrated circuit in accordance with the layer-based material arrangement patterns of the semiconductor integrated circuit when it is determined in step (e) that the layer-based material arrangement patterns of the semiconductor integrated circuit are acceptable; and (g) repeating steps (a) through (d) when it is determined in step (e) that the layer-based material arrangement patterns of the semiconductor integrated circuit are not acceptable.

* * * * *